United States Patent
Wang

(10) Patent No.: US 8,629,487 B2
(45) Date of Patent: *Jan. 14, 2014

(54) SEMICONDUCTOR DEVICE AND METHOD OF MANUFACTURING SAME

(71) Applicant: Fujitsu Semiconductor Limited, Yokohama (JP)

(72) Inventor: Wensheng Wang, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/756,675

(22) Filed: Feb. 1, 2013

(65) Prior Publication Data

US 2013/0140676 A1 Jun. 6, 2013

Related U.S. Application Data

(63) Continuation of application No. 12/547,126, filed on Aug. 25, 2009, now Pat. No. 8,390,045, which is a continuation of application No. PCT/JP2007/055694, filed on Mar. 20, 2007.

(51) Int. Cl.
| | |
|---|---|
| *H01L 21/283* | (2006.01) |
| *H01L 21/8239* | (2006.01) |
| *H01L 29/43* | (2006.01) |
| *H01L 29/772* | (2006.01) |

(52) U.S. Cl.
USPC ............................. 257/295; 257/E29.143

(58) Field of Classification Search
None
See application file for complete search history.

(56) References Cited

U.S. PATENT DOCUMENTS

| | | | |
|---|---|---|---|
| 6,146,906 | A | 11/2000 | Inoue et al. |
| 6,169,305 | B1 | 1/2001 | Takai et al. |
| 6,531,726 | B1 | 3/2003 | Takamatsu |
| 6,624,458 | B2 | 9/2003 | Takamatsu et al. |

(Continued)

FOREIGN PATENT DOCUMENTS

| | | |
|---|---|---|
| JP | 10-242078 A | 9/1998 |
| JP | 2000-058525 A | 2/2000 |

(Continued)

OTHER PUBLICATIONS

International Search Report of PCT/JP2007/055694, mailing date of Jun. 19, 2007.

(Continued)

*Primary Examiner* — Thomas L Dickey
*Assistant Examiner* — Joseph Schoenholtz
(74) *Attorney, Agent, or Firm* — Westerman, Hattori, Daniels & Adrian, LLP

(57) ABSTRACT

A semiconductor device includes a substrate and a ferroelectric capacitor including a lower electrode, a ferroelectric film, and an upper electrode. The upper electrode includes a first layer formed of an oxide whose stoichiometric composition is expressed as $AOx_1$ and whose actual composition is expressed as $AOx_2$; a second layer formed on the first layer and formed of an oxide whose stoichiometric composition is expressed as $BOy_1$ and whose actual composition is expressed as $BOy_2$; and a metal layer formed on the second layer. The second layer is higher in ratio of oxidation than the first layer. The composition parameters $x_1$, $x_2$, $y_1$, and $y_2$ satisfy $y_2/y_1 > x_2/x_1$, and the second layer includes an interface layer of the stoichiometric composition formed at an interface with the metal layer. The interface layer is higher in ratio of oxidation than the rest of the second layer.

8 Claims, 49 Drawing Sheets

(56) References Cited

U.S. PATENT DOCUMENTS

| | | |
|---|---|---|
| 6,740,533 B2 | 5/2004 | Takamatsu et al. |
| 6,887,716 B2 | 5/2005 | Fox et al. |
| 7,052,951 B2 | 5/2006 | Joo et al. |
| 7,078,242 B2 | 7/2006 | Matsuura et al. |
| 7,259,416 B2 | 8/2007 | Miura |
| 7,407,818 B2 | 8/2008 | Hara et al. |
| 7,465,657 B2 | 12/2008 | Miura |
| 7,592,657 B2 | 9/2009 | Wang |
| 7,776,621 B2 | 8/2010 | Wang |
| 8,390,045 B2 * | 3/2013 | Wang .......................... 257/295 |
| 2002/0074601 A1 | 6/2002 | Fox et al. |
| 2002/0117700 A1 | 8/2002 | Fox |
| 2002/0185668 A1 | 12/2002 | Takamatsu et al. |
| 2003/0089938 A1 | 5/2003 | Saigoh et al. |
| 2003/0213986 A1 | 11/2003 | Takamatsu et al. |
| 2005/0136556 A1 | 6/2005 | Matsuura et al. |
| 2005/0156216 A1 | 7/2005 | Cross et al. |
| 2005/0170534 A1 | 8/2005 | Hase |
| 2006/0043445 A1 | 3/2006 | Wang |
| 2006/0175642 A1 | 8/2006 | Dote et al. |
| 2006/0183250 A1 | 8/2006 | Choi et al. |
| 2006/0199392 A1 | 9/2006 | Hara et al. |
| 2007/0052065 A1 | 3/2007 | Kanaya |

FOREIGN PATENT DOCUMENTS

| | | |
|---|---|---|
| JP | 2000-091270 A | 3/2000 |
| JP | 2001-127262 A | 5/2001 |
| JP | 2002-110934 A | 4/2002 |
| JP | 2002-203948 A | 7/2002 |
| JP | 3299909 B2 | 7/2002 |
| JP | 2002-246564 A | 8/2002 |
| JP | 2002-289793 A | 10/2002 |
| JP | 2002-324894 A | 11/2002 |
| JP | 2003-197874 A | 7/2003 |
| JP | 2003-204043 A | 7/2003 |
| JP | 2003-347517 A | 12/2003 |
| JP | 2004-273787 A | 9/2004 |
| JP | 2004-296929 A | 10/2004 |
| JP | 3661850 A | 6/2005 |
| JP | 3661850 B2 | 6/2005 |
| JP | 2005-183842 A | 7/2005 |
| JP | 2006-073648 A | 3/2006 |
| JP | 2006-128274 A | 5/2006 |
| JP | 2006-222227 A | 8/2006 |
| JP | 2006-245457 A | 9/2006 |

OTHER PUBLICATIONS

International Search Report of PCT/JP2008/051090, mailing date of Mar. 25, 2008.

C.K. Huang, On the Suppression of Hydrogen Degradation in PbZr0.4Ti0.6O3 Ferroelectric Capacitors with PtOx Top Electrode, J. of Applied Physics, 98 104105 (2005).

Inoue, N; Hayashi, Y.; "Smart Fabrication Process of an Ir—IrOx Top-electrode on a PZT Film for Reliable FeRAM", Journal of the Electrochemical Society, vol. 151, No. 2, G113-G118, 2004.

Wessling, Borge, Sputter Deposition of Iridium and Iridium Oxide for stimulation electrode coatings. Diss. Fakultat Fur Elektrotechnik Und Informationstechnik, 2007.

Johan Vlekken et al., Quantitation of Major Elements With Secondary Ion Mass Spectrometry by Using M2+-Molecular Ions, Journal of the American Society for Mass Spectrometry, vol. 9, Issue 6, Jun. 1998, pp. 638-642.

US Office Action dated May 13, 2011, issue in related U.S. Appl. No. 12/584,911.

* cited by examiner $O_2 = 1\%$ $O_2$ = 20%

$O_2 = 30\%$ $O_2 = 50\%$

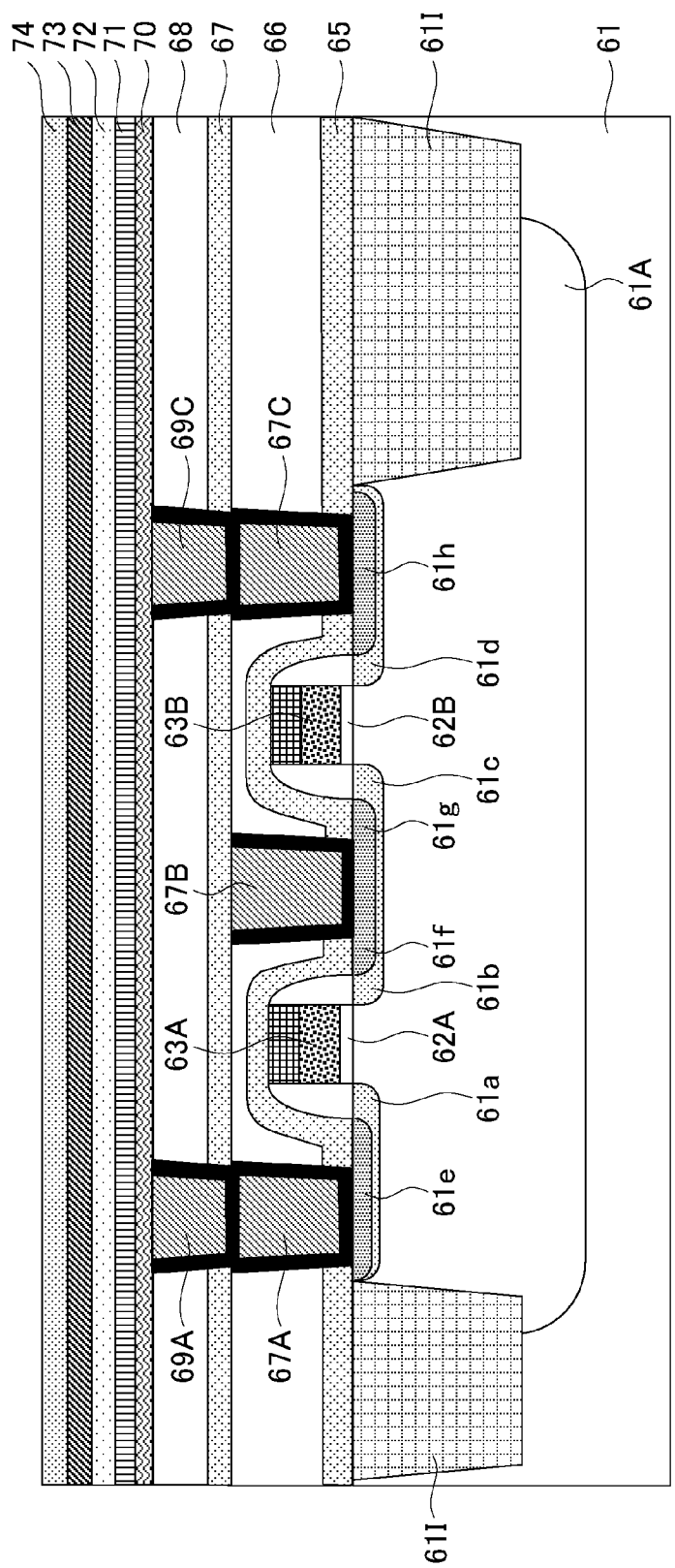

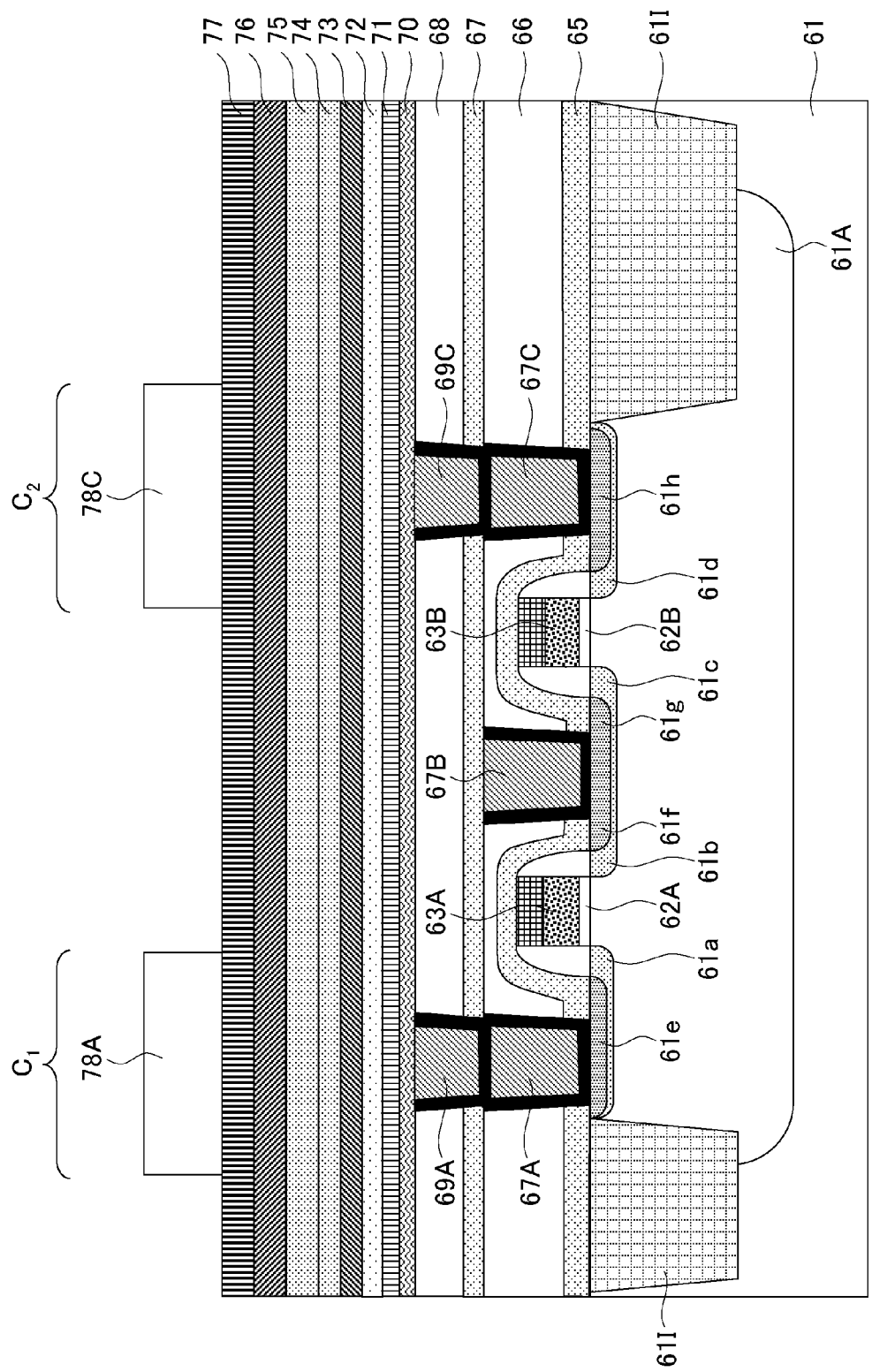

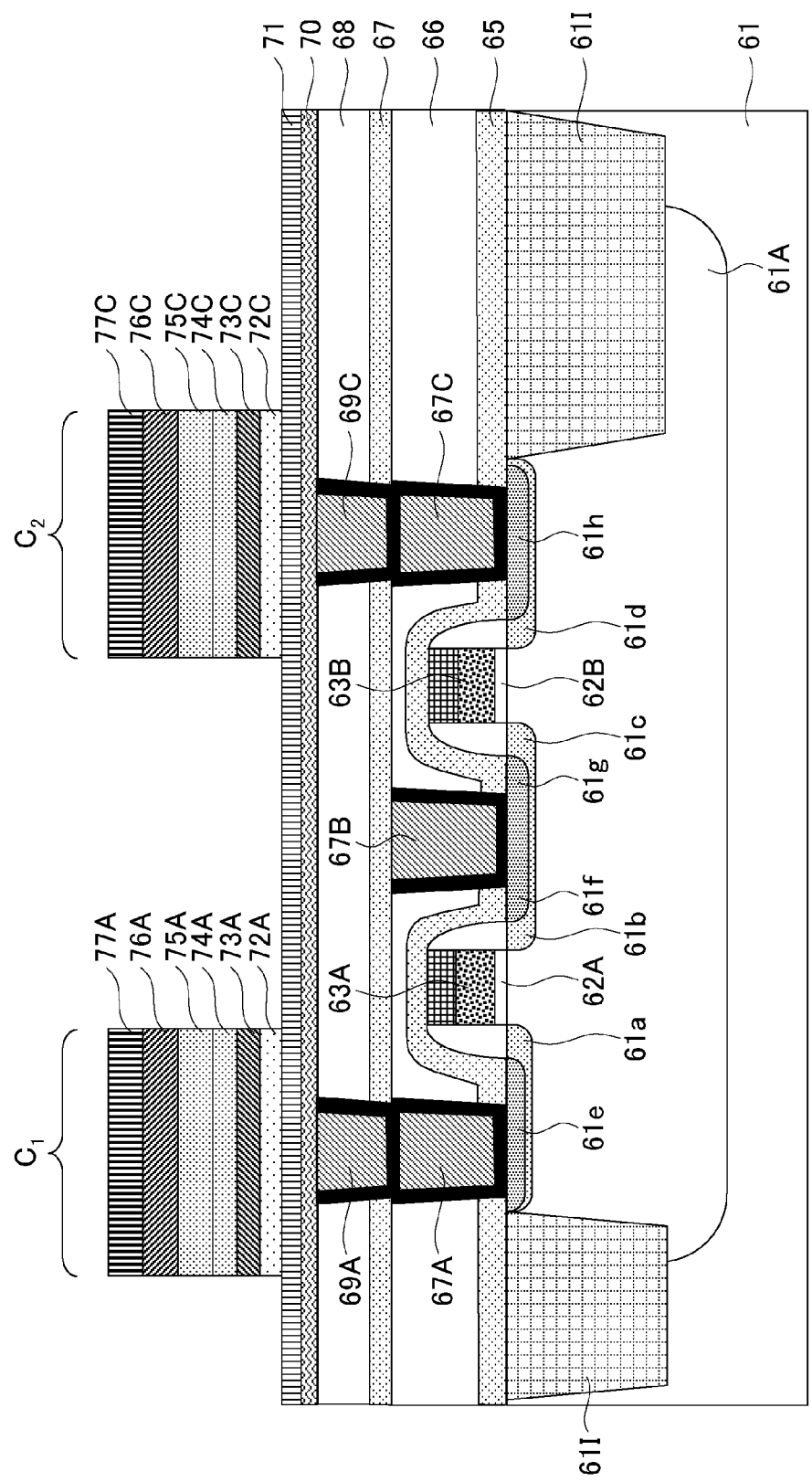

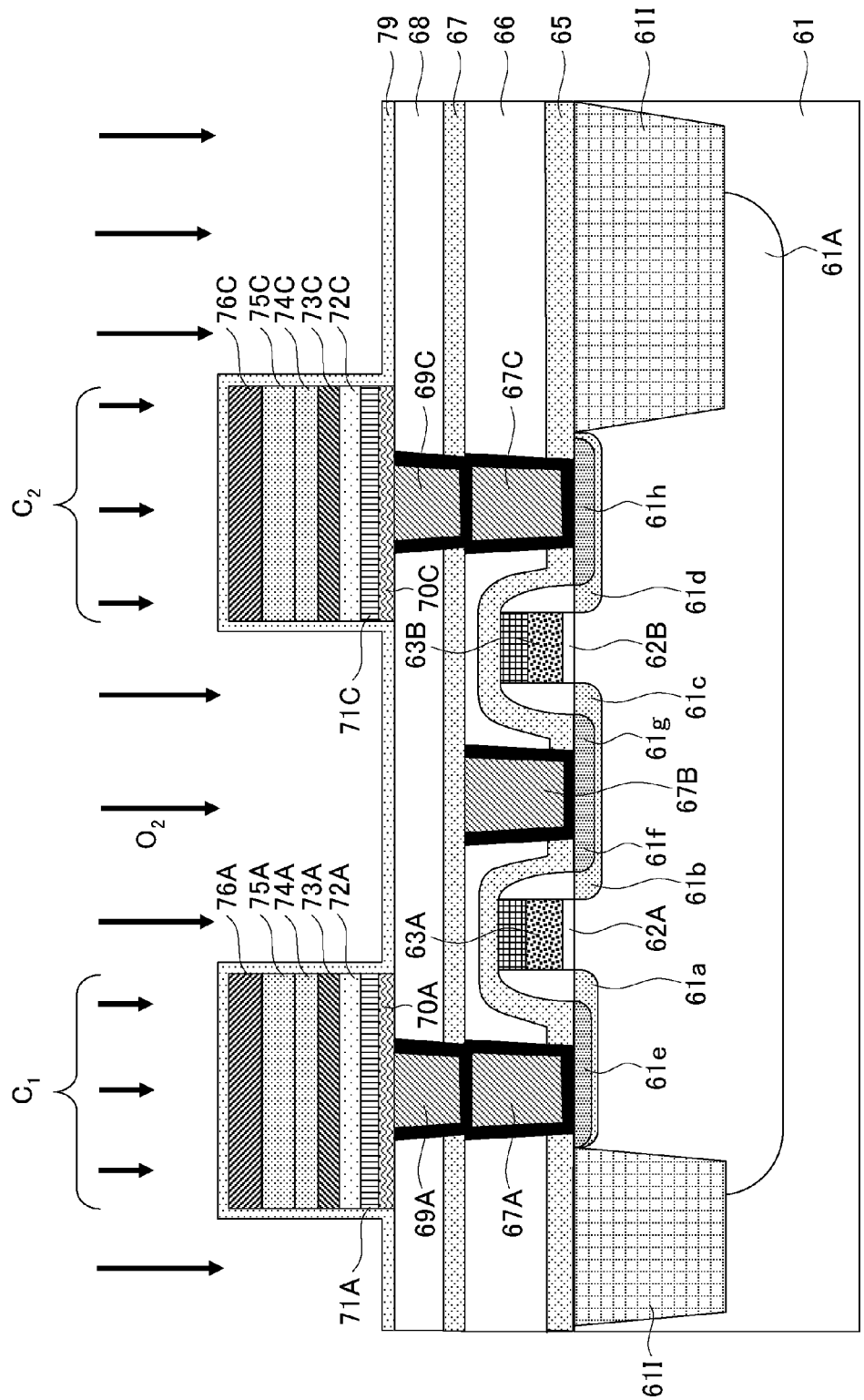

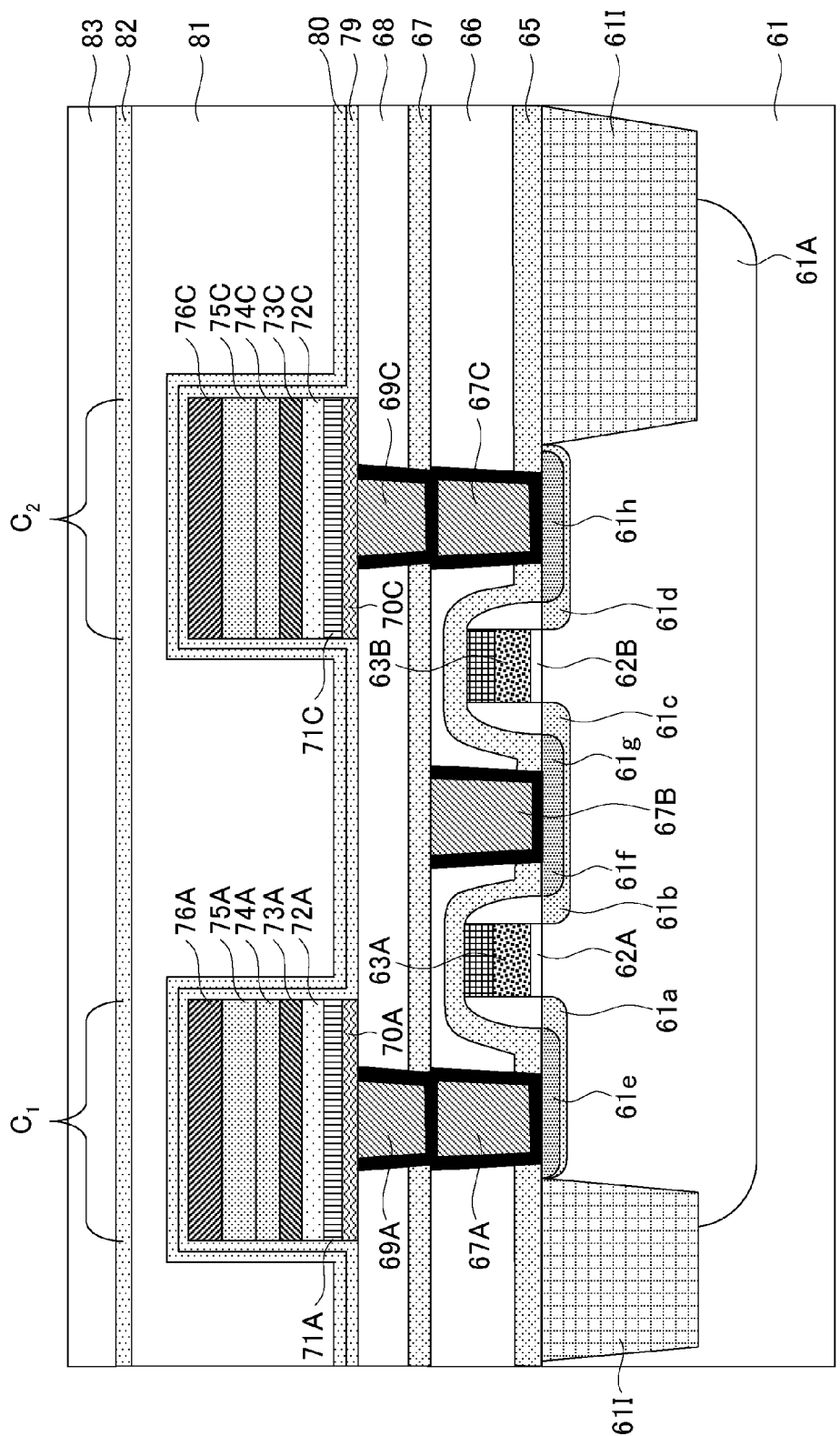

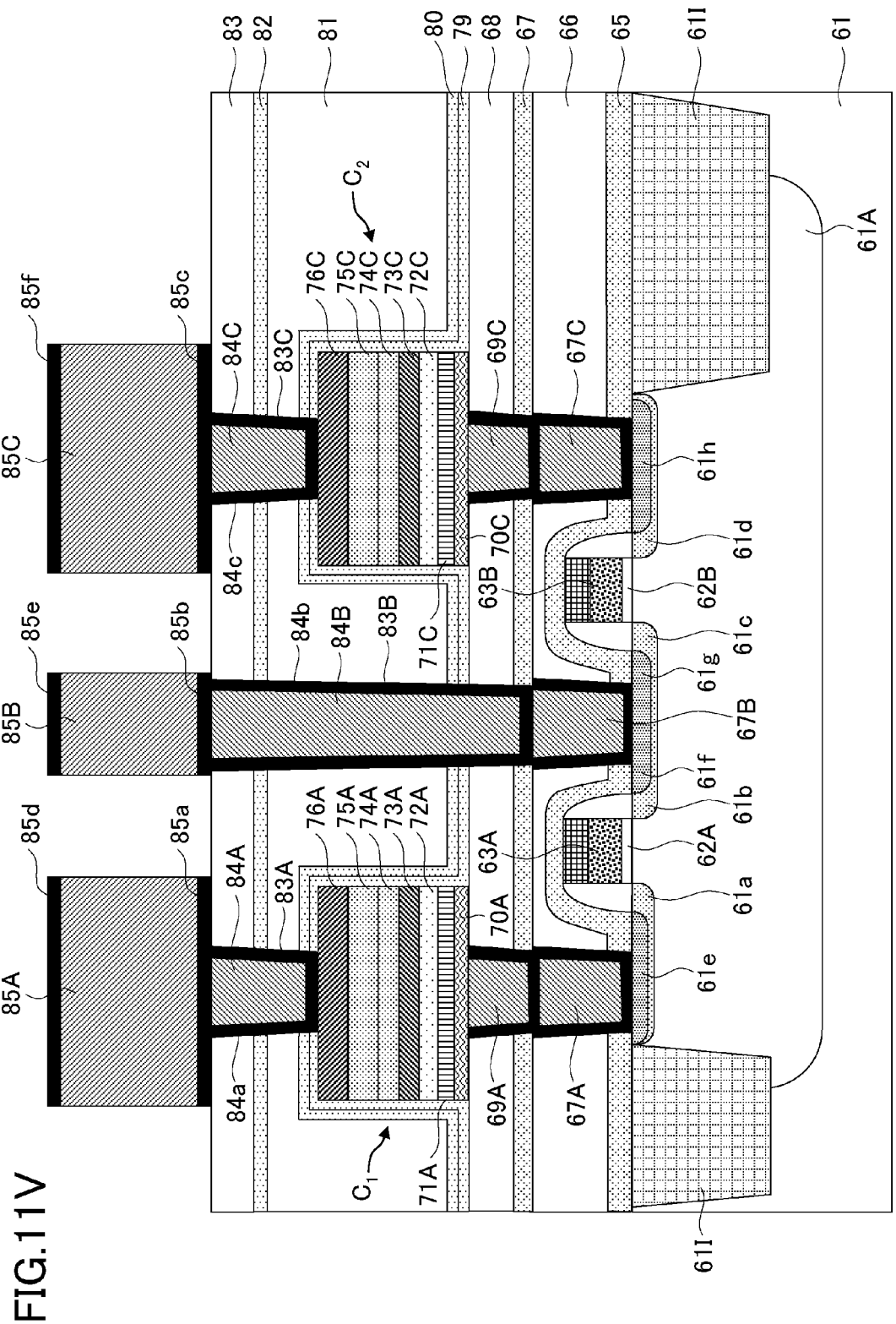

SEMICONDUCTOR DEVICE AND METHOD OF MANUFACTURING SAME

CROSS-REFERENCE TO RELATED APPLICATION(S)

This application is a continuation of U.S. application Ser. No. 12/547,126, filed on Aug. 25, 2009 which is a continuation application filed under 35 U.S.C. 111(a) claiming benefit under 35 U.S.C. 120 and 365(c) of PCT International Application No. PCT/JP2007/055694, filed on Mar. 20, 2007, the entire contents of which are incorporated herein by reference.

FIELD

A certain aspect of the embodiments discussed herein is related to semiconductor devices and methods of manufacturing same.

BACKGROUND

Ferroelectric memories, which are voltage-driven nonvolatile semiconductor memory devices, have preferable characteristics such as high-speed operation, low power consumption, and nonvolatility of retained information during power shutdown. Ferroelectric memories have already been used in IC cards and portable electronic devices.

Ferroelectric random access memories (FeRAMs), which may be typical examples of ferroelectric memories, include a ferroelectric capacitor having a ferroelectric film held between a pair of electrodes, and store information by inducing polarization in the ferroelectric capacitor in accordance with the voltage applied between the electrodes. The information thus written into the ferroelectric film in the form of polarization is retained even after removal of the applied voltage.

In such a ferroelectric capacitor, the polarity of the spontaneous polarization is also reversed in response to the reversal of the polarity of the applied voltage. Accordingly, the written information may be read by detecting this spontaneous polarization. FeRAMs operate with lower voltage than flash memories, and enable writing information at high speed with low power.

It is desirable to repeat heat treatment in an oxygen atmosphere in the process of manufacturing such FeRAMs in order to recover the characteristics of the ferroelectric film degraded by processing in a non-oxidizing atmosphere. Oxygen deficiencies are easily caused in the ferroelectric film of the ferroelectric capacitor by processing in a non-oxidizing atmosphere, so that characteristics as a ferroelectric film, such as the amount of switching charge and a leak current value, may be degraded. Therefore, conventionally, a metal that is less likely to be oxidized even in an oxygen atmosphere, such as Pt, or a conductive oxide such as IrOx or RuOx is used as the upper electrode of the ferroelectric capacitor.

In recent years, FeRAMs are no exceptions to exacting requirements for microfabrication, so that there are also a demand for miniaturization of the ferroelectric capacitor and a demand for adoption of a multilayer interconnection structure. Further, there is also a demand for FeRAMs that operate with low voltage in view of application to portable information processors.

In order for FeRAMs to be operable with low voltage, the ferroelectric film of the ferroelectric capacitor has a large amount of switching charge $Q_{sw}$. In the case of using a multilayer interconnection structure, however, there is the problem of the degradation of the characteristics of the already formed ferroelectric capacitor due to a reducing atmosphere or a non-oxidizing atmosphere used in the process of forming the multilayer interconnection structure.

For example, in the case of forming the upper electrode with a Pt film or an Ir film, there is a problem in that hydrogen in the reducing atmosphere used in forming an interlayer insulating film in the multilayer interconnection structure enters the Pt film or Ir film to be activated through the catalysis of the metal, so that the activated hydrogen reduces the ferroelectric film in the ferroelectric capacitor. The reduction of the ferroelectric film substantially degrades the operating characteristics of the ferroelectric capacitor. This problem of the degradation of the characteristics of the ferroelectric film is particularly conspicuous in the case of a miniaturized ferroelectric capacitor having its capacitor insulating film formed of a miniaturized ferroelectric film pattern.

The following are examples of related art of the present invention: Japanese Laid-open Patent Publication No. 2004-273787, Japanese Patent No. 3661850, Japanese Laid-open Patent Publication No. 2006-128274, Japanese Laid-open Patent Publication No. 2000-91270, Japanese Laid-open Patent Publication No. 10-242078, Japanese Laid-open Patent Publication No. 2001-127262, Japanese Laid-open Patent Publication No. 2002-246564, Japanese Laid-open Patent Publication No. 2005-183842, Japanese Laid-open Patent Publication No. 2006-73648, Japanese Laid-open Patent Publication No. 2006-222227, Japanese Laid-open Patent Publication No. 2000-58525, Japanese Laid-open Patent Publication No. 2003-197874, Japanese Laid-open Patent Publication No. 2002-289793, and Japanese Laid-open Patent Publication No. 2003-347517.

SUMMARY

According to an aspect of the present invention, a semiconductor device includes a substrate; and a ferroelectric capacitor formed on the substrate, the ferroelectric capacitor including a lower electrode; a ferroelectric film formed on the lower electrode; and an upper electrode formed on the ferroelectric film, the upper electrode including a first layer formed of an oxide whose stoichiometric composition is expressed as chemical formula $AOx_1$ using a composition parameter $x_1$ and whose actual composition is expressed as chemical formula $AOx_2$ using a composition parameter $x_2$; a second layer formed on the first layer, the second layer being formed of an oxide whose stoichiometric composition is expressed as chemical formula $BOy_1$ using a composition parameter $y_1$ and whose actual composition is expressed as chemical formula $BOy_2$ using a composition parameter $y_2$; and a metal layer formed on the second layer, wherein the second layer is higher in ratio of oxidation than the first layer, the composition parameters $x_1$, $x_2$, $y_1$, and $y_2$ satisfy $y_2/y_1 > x_2/x_1$, and the second layer includes an interface layer of the stoichiometric composition formed at an interface with the metal layer, the interface layer being higher in ratio of oxidation than a rest of the second layer.

According to another aspect of the present invention, a method of manufacturing a semiconductor device includes forming a ferroelectric capacitor, wherein forming the ferroelectric capacitor includes forming a lower electrode; depositing a ferroelectric film on the lower electrode; depositing a first conductive oxide film on the ferroelectric film; crystallizing the first conductive oxide film in an oxidizing atmosphere; depositing a second conductive oxide film in a microcrystalline state on the first conductive oxide film after said crystallizing; crystallizing a surface of the second conductive oxide film in an oxidizing atmosphere; and depositing a metal film on the second conductive oxide film after said crystallizing the surface thereof.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWING(S)

DESCRIPTION OF EMBODIMENTS

As described above, in the case of forming the upper electrode with a Pt film or an Ir film, there is the problem of the degradation of the characteristics of the ferroelectric film.

Therefore, for example, Patent Document 2 listed above proposes the technique of configuring the upper electrode, formed on the ferroelectric film, with a crystallized first conductive oxide film and a second conductive oxide film formed on the first conductive oxide film, where the composition of the second conductive oxide film is closer to a stoichiometric composition than that of the first conductive oxide film is.

Figure 1:
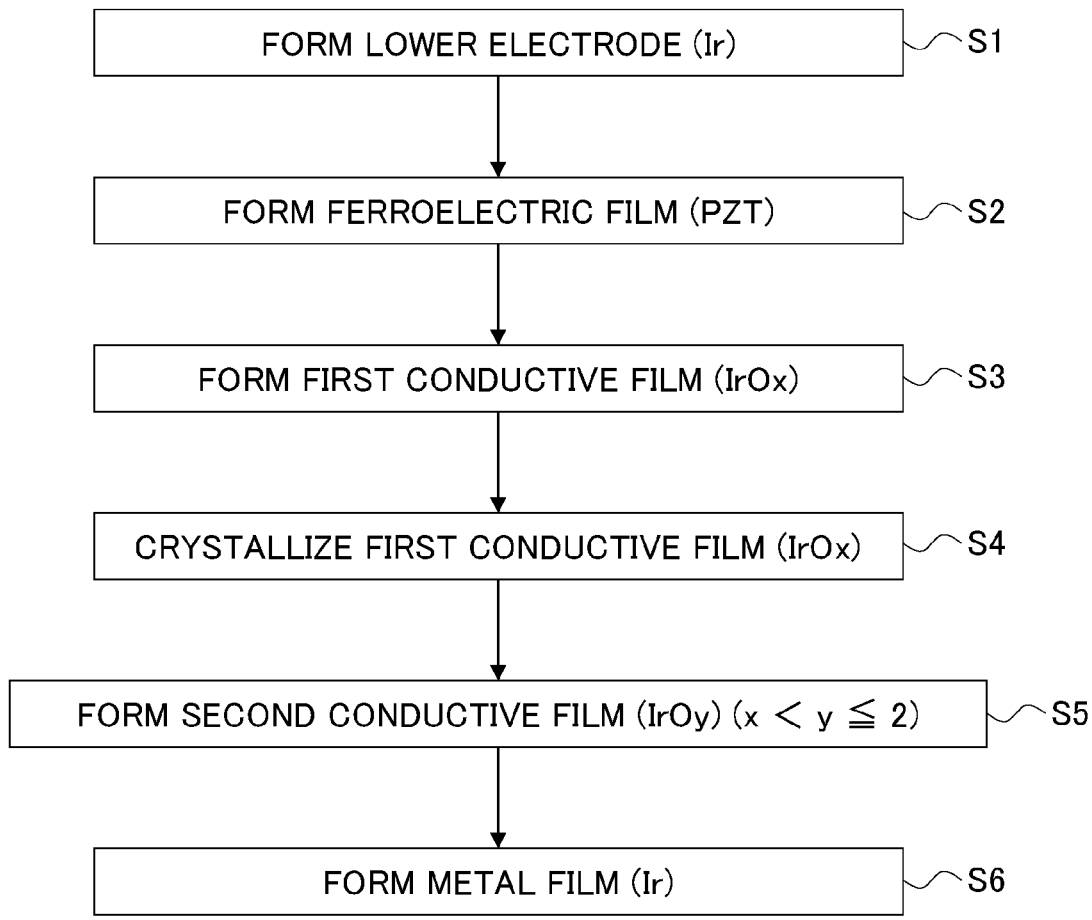
FIG. 1 is a flowchart illustrating a method of manufacturing a conventional ferroelectric capacitor.

FIG. 1 is a flowchart illustrating a method of manufacturing a ferroelectric capacitor according to Patent Document 2.

Referring to FIG. 1, first, in step S1, a lower electrode is formed, and in step S2, a ferroelectric film such as a PZT (lead zirconate titanate) film is formed on the lower electrode.

Next, in step S3, a first conductive oxide film of an iridium oxide (IrOx) is formed on the ferroelectric film by sputtering as part of an upper electrode. Then, in step S4, the first conductive oxide film is crystallized by being subjected to crystallizing heat treatment in a controlled oxidizing atmosphere.

Further, in step S5, a second conductive oxide film of an iridium oxide (IrOy) is formed on the crystallized first conductive oxide film by sputtering with a higher oxidization ratio ($x<y\leq2$). Then, in step S6, a metal electrode of Ir is formed on the second conductive oxide film.

Figure 2:
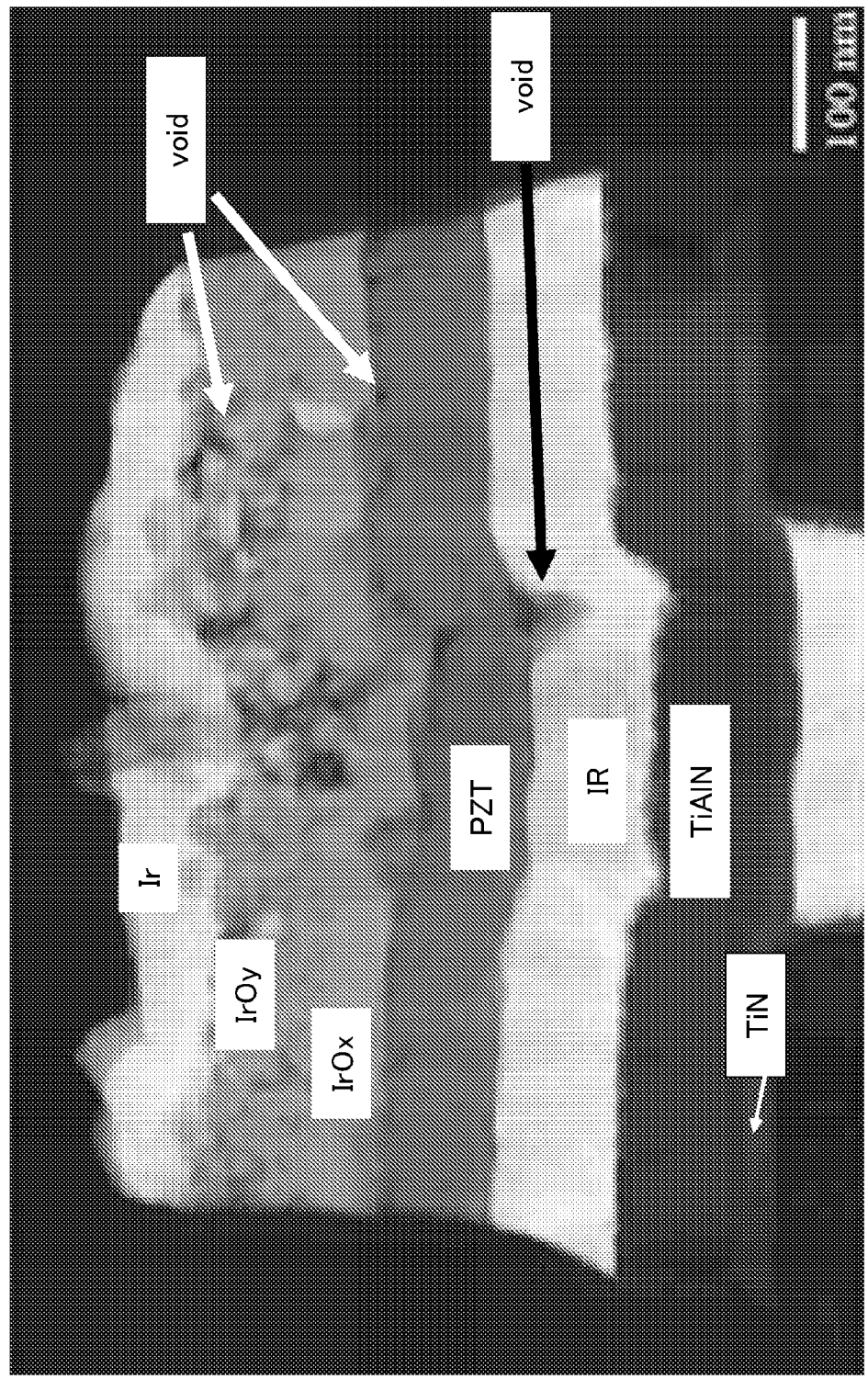
FIG. 2 is a diagram illustrating the conventional ferroelectric capacitor.

However, the studies that form the basis of the present invention have found that according to the technique of Patent Document 2, since the second conductive oxide film is formed at low temperatures, the second conductive oxide film is crystallized in a subsequent process such as a heat treatment process in forming a multilayer interconnection structure, so that the second conductive oxide film may contract to cause generation of voids as illustrated in FIG. 2.

Referring to FIG. 2, the ferroelectric capacitor is formed over a TiN orientation control film with a TiAlN oxygen barrier film interposed therebetween. The ferroelectric capacitor is formed of the lower Ir electrode, the ferroelectric PZT film thereon, and the upper electrode layer thereon. The upper electrode layer is formed of the first conductive oxide film IrOx formed of an iridium oxide, the second conductive oxide film IrOy formed on the first conductive oxide film IrOx, and the metal (Ir) film formed on the second conductive oxide film IrOy. The composition of the second conductive oxide film IrOy, which is also formed of an iridium oxide, is closer to a stoichiometric composition than that of the first conductive oxide film IrOx is. FIG. 2 illustrates multiple voids formed in the second conductive oxide film IrOy. Further, because of the formation of these voids, voids are also formed at the interface of the ferroelectric PZT film and the first conductive oxide film IrOx. On the other hand, the void at the interface between the lower Ir electrode and the ferroelectric PZT film, which is a reflection (result) of the unevenness of the surface of a via plug under the TiN orientation control film, may be eliminated by planarization.

If voids are thus generated in the second conductive oxide film IrOy on a large scale, hydrogen enters the voids in a process conducted after the formation of the metal (Ir) film, such as a multilayer interconnection structure forming process, so as to reduce the iridium oxide or enter even the ferroelectric PZT film below the iridium oxide, thus causing the problem of the degradation of the electrical characteristics of the ferroelectric capacitor.

Preferred embodiments of the present invention are explained below with reference to accompanying drawings.

[a] First Embodiment

Figure 3A:
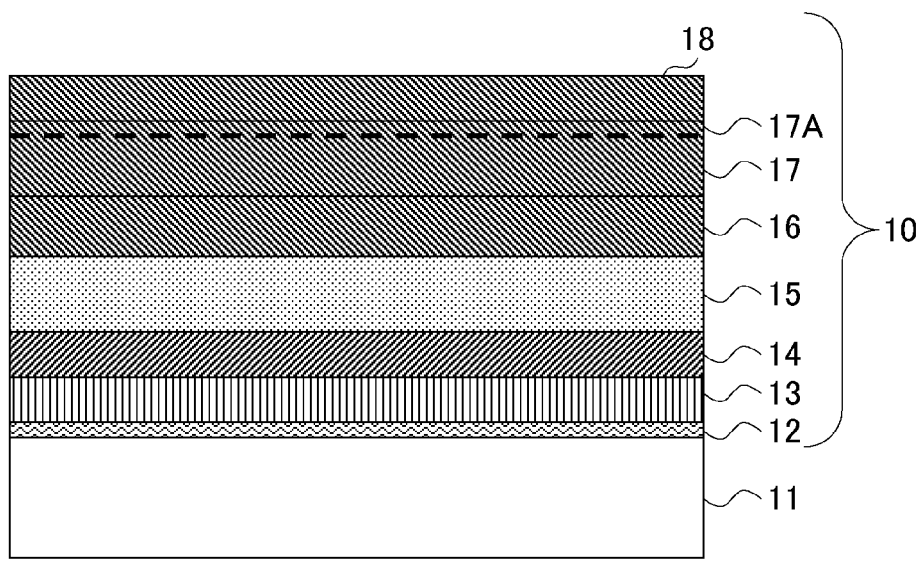
FIG. 3A is a diagram illustrating a ferroelectric capacitor according to a first embodiment.

FIG. 3A is a diagram illustrating a ferroelectric capacitor 10 according to a first embodiment.

Referring to FIG. 3A, the ferroelectric capacitor 10 is formed on a silicon oxide film 11 covering a silicon substrate (not graphically illustrated). The ferroelectric capacitor 10 includes an orientation control film 12 formed on the silicon oxide film 11; a conductive oxygen barrier film 13 (a conductive oxygen diffusion barrier film) formed on the orientation control film 12; a lower electrode 14 formed on the conductive oxygen barrier film 13; a ferroelectric film 15 (a ferroelectric capacitor insulating film) formed on the lower electrode 14; a first conductive oxide film 16 formed on the ferroelectric film 15; a second conductive oxide film 17 formed on the first conductive oxide film 16; a stoichiometric composition region 17A formed at the surface of the second conductive oxide film 17; and a metal film 18 formed on the second conductive oxide film 17 and in contact with the stoichiometric composition region 17A.

The orientation control film 12 is formed of a TiN film having a (111) orientation or a Ti film having a (002) orientation, and controls the crystal orientation of the ferroelectric film 15.

The conductive oxygen barrier film 13 is formed of a TiAlN film having a (111) orientation, and prevents oxygen from entering interconnection patterns (not graphically illustrated) in the silicon oxide film 11.

The lower electrode 14 is formed of a Pt film having a (111) orientation. The ferroelectric film 15 is formed of a PZT film having a (111) orientation.

The first conductive oxide film 16 is formed of a first iridium (Ir) oxide crystallized film. The second conductive oxide film 17 is formed of a second iridium (Ir) oxide crystallized film.

The stoichiometric composition region 17A is formed of an iridium (Ir) oxide film of a stoichiometric composition ($IrO_2$) having a thickness of 1 nm to 20 nm, and is higher in oxygen concentration than any other parts of the second conductive oxide film 17. The metal film 18 is formed of an iridium (Ir) film.

The first conductive oxide film 16, the second conductive oxide film 17 including the stoichiometric composition region 17A, and the metal film 18 form the upper electrode of the ferroelectric capacitor 10 of FIG. 3A.

Figure 3B:
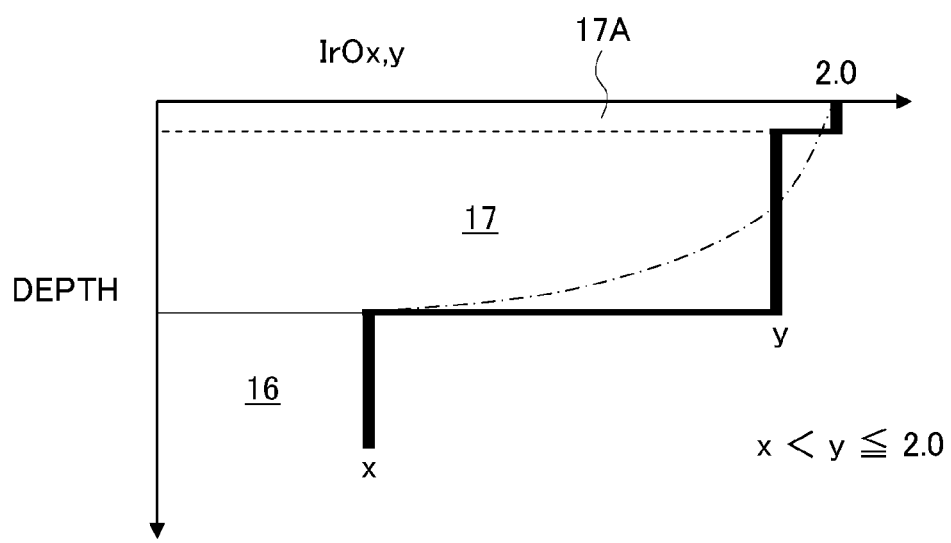
FIG. 3B is another diagram illustrating the ferroelectric capacitor of FIG. 3A according to the first embodiment.

FIG. 3B is a schematic diagram illustrating the distribution of composition parameters x and y in the depth direction in the case of expressing the compositions of the first conductive oxide film 16 and the second conductive oxide film 17 including the stoichiometric composition region 17A as IrOx and IrOy, respectively, using the composition parameters x and y.

According to this embodiment, the second conductive oxide film 17 is, after its formation, subjected to rapid heat treatment to be crystallized in an oxidizing atmosphere before formation of the metal film 18. Accordingly, oxygen is introduced into the second conductive oxide film 17 simultaneously with its crystallization, so that at the same time that the composition of the second conductive oxide film 17 approaches a stoichiometric composition, a surface layer having a stable stoichiometric composition is formed at its surface portion. Therefore, even when heat treatment is performed in a process after formation of the metal film 18, such as a process for forming an interconnection structure, such formation of voids as described above with reference to FIG. 2 is prevented in the second conductive oxide film 17, so that degradation of the characteristics of the ferroelectric capacitor 10 due to such void formation is avoided.

This embodiment includes such a case as indicated by a one-dot chain line in FIG. 3B, where the oxygen concentration profile in the second conductive oxide film 17 decreases gradually in a downward direction from the stoichiometric composition region 17A (surface layer). In this case as well, the stoichiometric composition region 17A having a stoichiometric composition is believed to be formed at the surface of the conductive oxide film 17.

Figure 4:
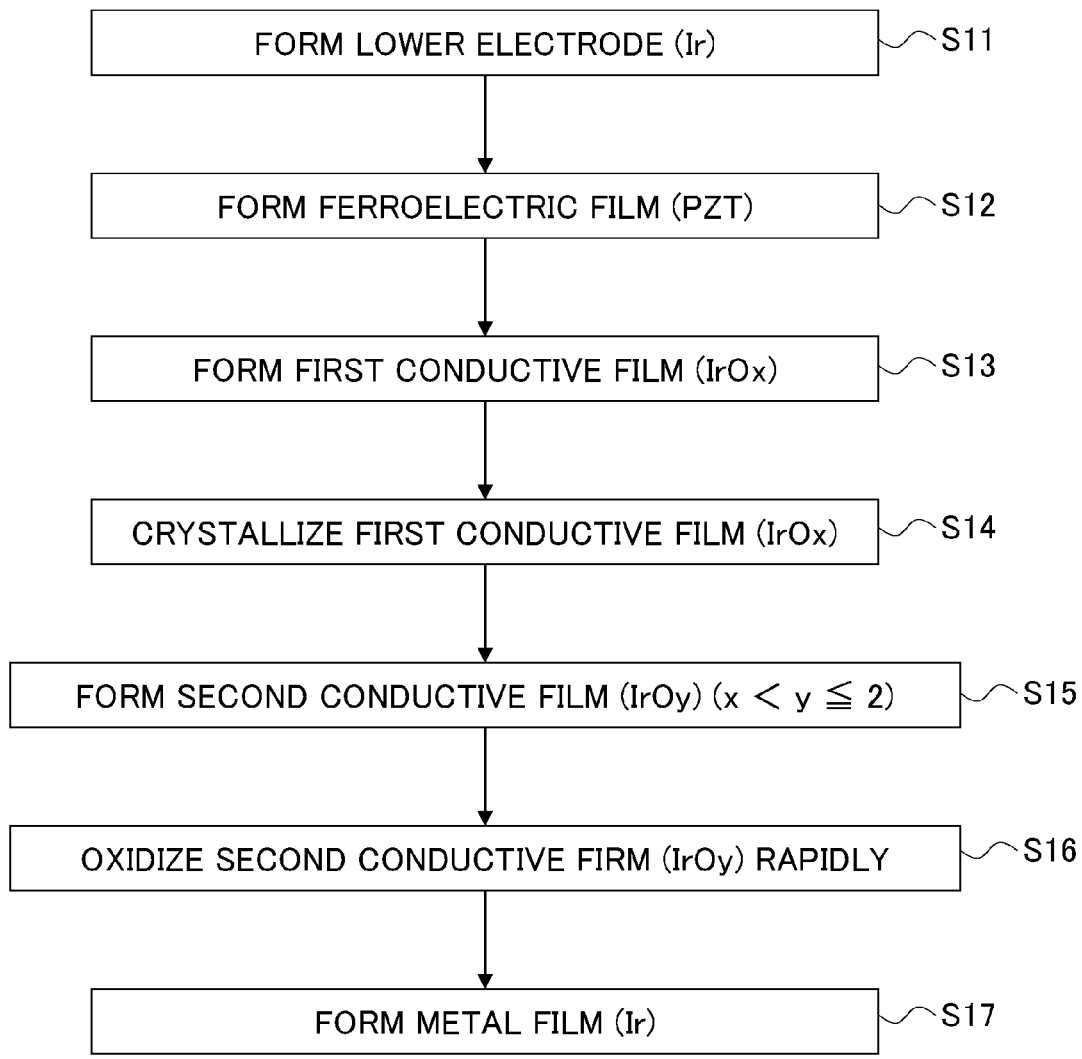
FIG. 4 is a flowchart illustrating a process for manufacturing the ferroelectric capacitor of FIG. 3A according to the first embodiment.

FIG. 4 is a flowchart illustrating a process for manufacturing the ferroelectric capacitor 10 of FIG. 3A. FIGS. 5A through 5H are diagrams illustrating the process for manufacturing the ferroelectric capacitor 10 of FIG. 3A.

Figure 5A:
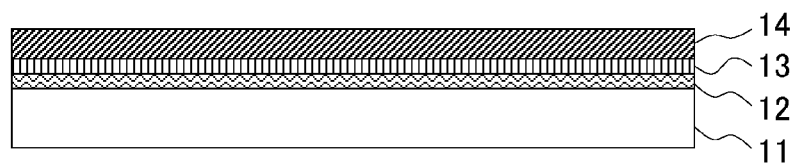
FIGS. 5A through 5H are diagrams illustrating the process for manufacturing the ferroelectric capacitor of FIG. 3A according to the first embodiment.

Referring to FIG. 5A, a Ti film having a (002) orientation is formed on the silicon oxide film 11 covering a silicon substrate (not graphically illustrated) as the orientation control film 12 by sputtering. On the orientation control film 12, a TiAlN film is formed as the conductive oxygen barrier film 13 by reactive sputtering. The silicon oxide film 11 may carry an $Al_2O_3$ film on its surface.

For example, the Ti film (orientation control film) 12 may be formed by supplying sputtering power of 2.6 kW for five seconds at a substrate temperature of 20° C. in an Ar atmosphere at a pressure of 0.15 Pa with a distance of 60 mm between a substrate to be processed and a target in a DC sputtering apparatus. Further, the TiAlN film (conductive oxygen barrier film) 13 may be formed to be 100 nm in thickness by supplying sputtering power of 1.0 kW at a substrate temperature of 400° C. while feeding Ar gas and nitrogen gas at flow rates of 40 sccm and 10 sccm, respectively, in an $Ar/N_2$ atmosphere at a pressure of 253.3 Pa using a Ti—Al alloy target in the same DC sputtering apparatus.

It is preferable to nitride the Ti film 12 once after its formation. By thus nitriding the Ti film 12, it is possible to prevent Ti from being oxidized from film side surfaces in a recovering heat treatment of the ferroelectric film 15 to be performed later.

Here, the conductive oxygen barrier film 13 is not limited (in material) to TiAlN, and may be an Ir or Ru film. The orientation control film 12 is not limited (in material) to Ti or TiN, and Pt, Ir, Re, Ru, Pd, Os and alloys thereof may also be used for the orientation control film 12. Further, the orientation control film 12 may be a single layer film or a laminated (multilayer) film of Ti, Al, Ir, Pt, Ru, Pd, Os, Rh, PtOx, IrOx, RuOx, PdOx, etc.

Further, in the process of FIG. 5A, the lower electrode 14 (lower electrode film) of a Pt film having a thickness of approximately 100 nm is formed on the conductive oxygen barrier film 13 by sputtering with sputtering power of 0.5 kW at a substrate temperature of 400° C. in an Ar atmosphere at a pressure of 0.2 Pa, for example. This corresponds to step S11 of FIG. 4. The lower electrode 14 is not limited (in material) to pure Pt, and may be a noble metal alloy including Pt or a laminated (multilayer) film of Pt or a noble metal alloy including Pt and a platinum oxide (PtO).

The lower electrode 14 (Pt lower electrode film) thus formed has a (111) orientation, and effectively restricts the orientation of the ferroelectric film 15 to be formed thereon to a (111) orientation.

Figure 5B:
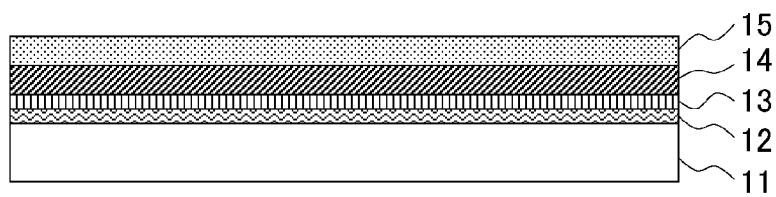

Next, in the process of FIG. 5B, a PZT film is formed as the ferroelectric film 15 of 100 nm to 200 nm in thickness on the lower electrode 14 by high-frequency sputtering with a power of 1000 W at a substrate temperature of 50° C. in an Ar atmosphere at a pressure of 0.9 Pa using a target of a PLZT composition, for example. This corresponds to step S12 of FIG. 4. The ferroelectric film 15 thus formed is in an amorphous state, and has a PLZT composition in the case where the target used has a PLZT composition. Alternatively, the ferroelectric film 15 may be formed by MOCVD.

Figure 5C:
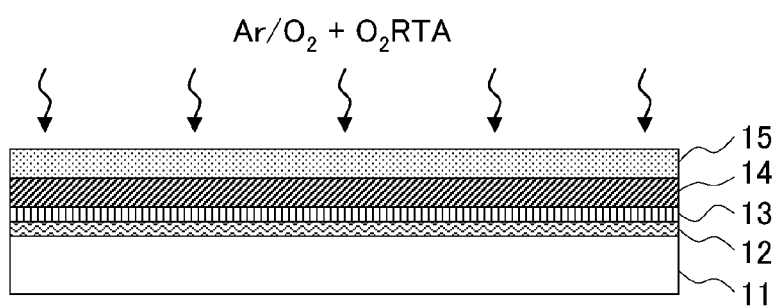

Next, in the process of FIG. 5C, the structure of FIG. 5B is subjected to rapid heat treatment at a temperature lower than or equal to 650° C. in an oxygen-containing Ar atmosphere at a pressure of 0.1 MPa, so as to compensate for oxygen deficiencies in the ferroelectric film 15. Subsequently, the structure of FIG. 5B is further subjected to rapid heat treatment (rapid thermal annealing [RTA]) at 750° C. in an oxygen atmosphere so as to crystallize the ferroelectric film 15. This rapid heat treatment densifies the Pt film forming the lower electrode 14 so as to prevent the interdiffusion of Pt and oxygen between the lower electrode 14 and the ferroelectric film 15.

Figure 5D:
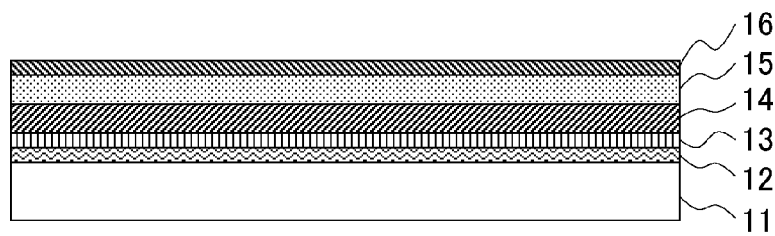

Next, in the process of FIG. 5D, an iridium oxide film of 20 nm to 75 nm in thickness is deposited as the first conductive oxide film 16 on the ferroelectric film 15 by sputtering. This corresponds to step S13 of FIG. 4. For example, such sputtering may be performed by feeding Ar gas and oxygen gas at flow rates of 140 sccm and 60 sccm, respectively, and inputting sputtering power of approximately 1 kW under a pressure of 0.3 Pa at a temperature higher than or equal to 150° C. and lower than or equal to 350° C., for example, 300° C. The iridium oxide film 16 (the first conductive oxide film 16) thus formed is in a crystalline state, and has a nonstoichiometric composition IrOx whose parameter x representing an oxygen composition is 1.92 (x=1.92).

Alternatively, the iridium oxide film 16 of FIG. 5D may be formed by RF sputtering at a temperature higher than or equal to 10° C. and lower than or equal to 50° C., for example, room temperature. In this case, Ar gas and oxygen gas are fed at flow rates of 100 sccm and 52 to 59 sccm, respectively, and sputtering power of approximately 2 kW under a pressure of 0.23 Pa. The iridium oxide film 16 thus formed is in an amorphous state, and has a nonstoichiometric composition IrOx whose composition parameter x is 1.20 through 1.50.

Further, according to this embodiment, in the process of FIG. 5E, the structure of FIG. 5D is subjected to heat treatment in a controlled oxidizing atmosphere so as to crystallize the iridium oxide film 16 in order to prevent formation of voids in conductive oxide films forming part of the upper electrode structure illustrated with reference to FIG. 2. This corresponds to step S14 of FIG. 4.

It has been found that such heat treatment of the iridium oxide film 16 in an oxidizing atmosphere deserves attention because there is likely to be abnormal growth of iridium oxide crystal grains.

Figure 6A:
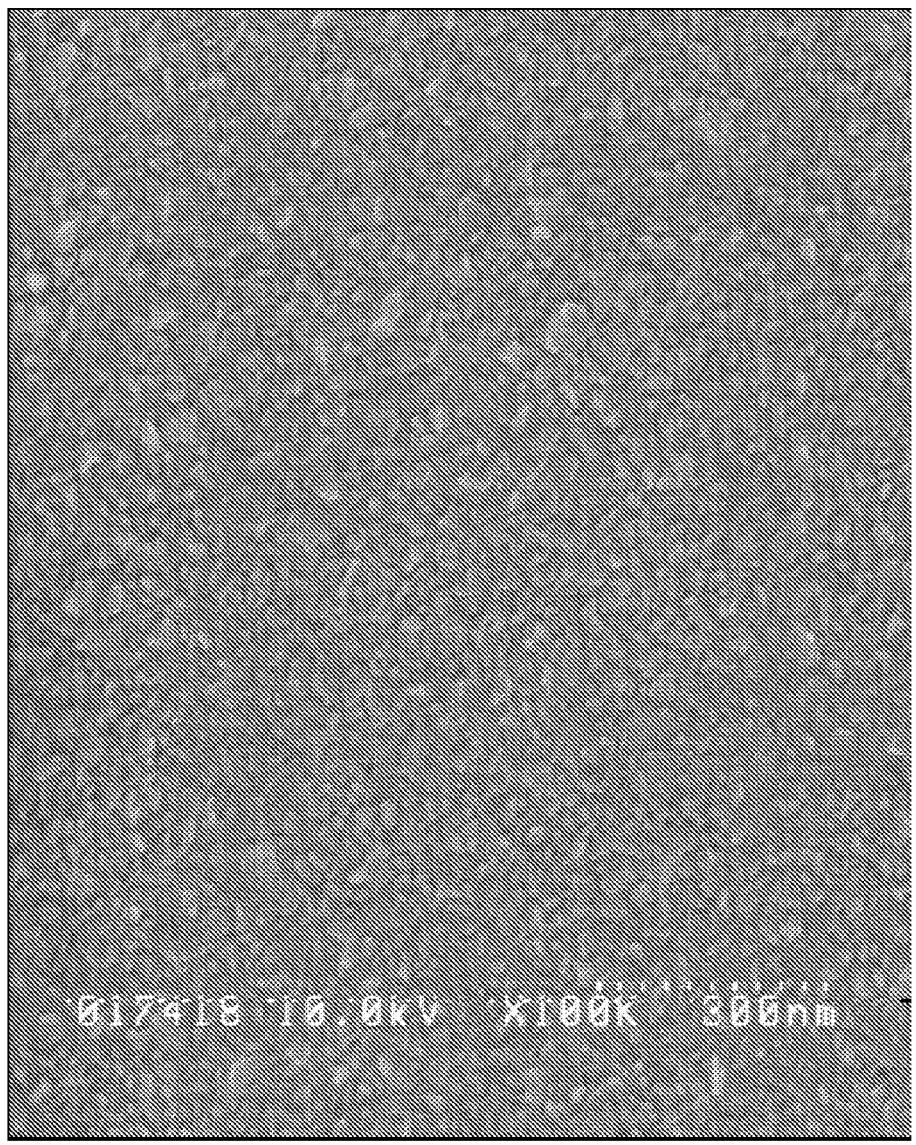
FIGS. 6A through 6D illustrate surface conditions of a film obtained in the process of FIG. 5E according to the first embodiment.
Figure 6B:
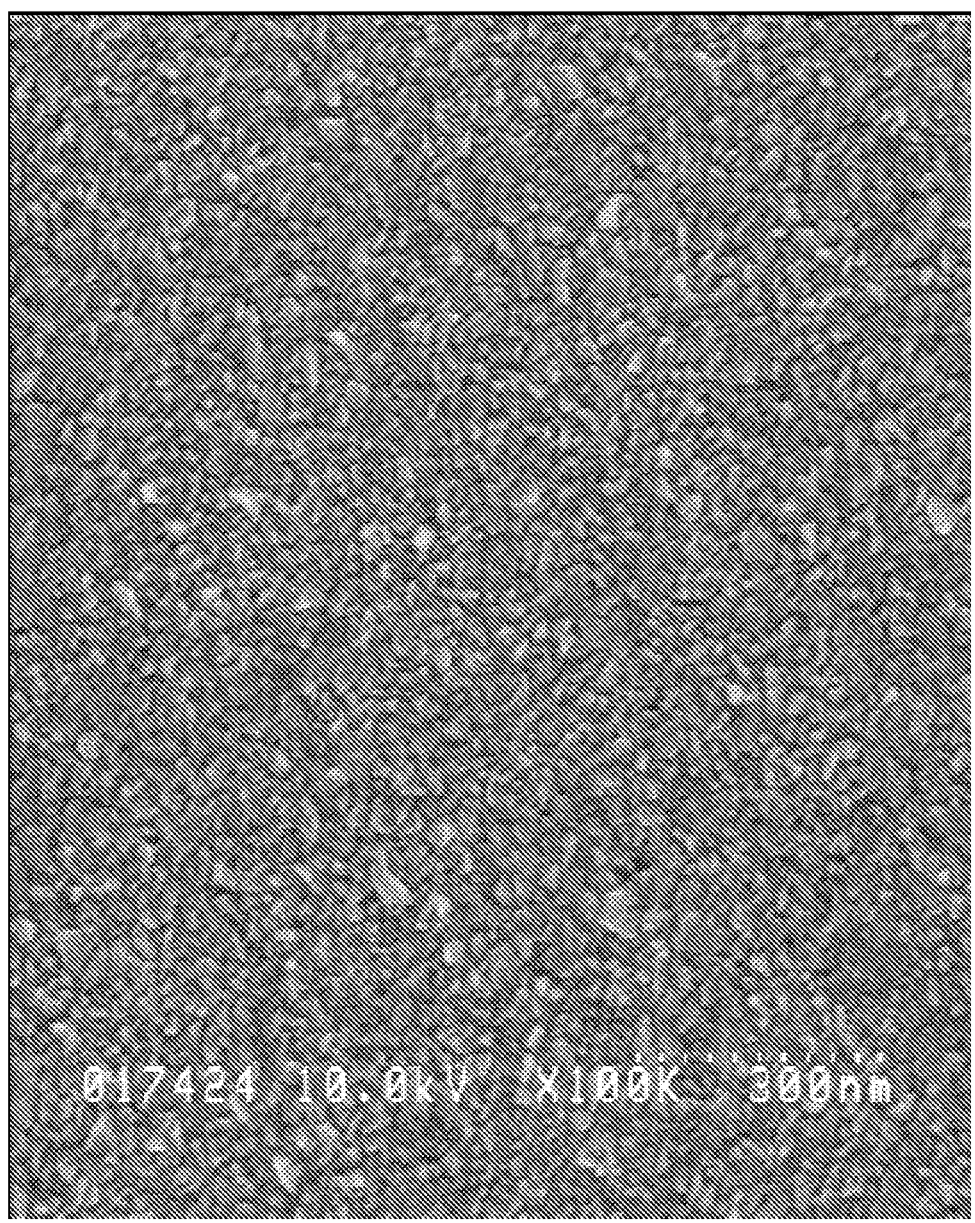
Figure 6C:
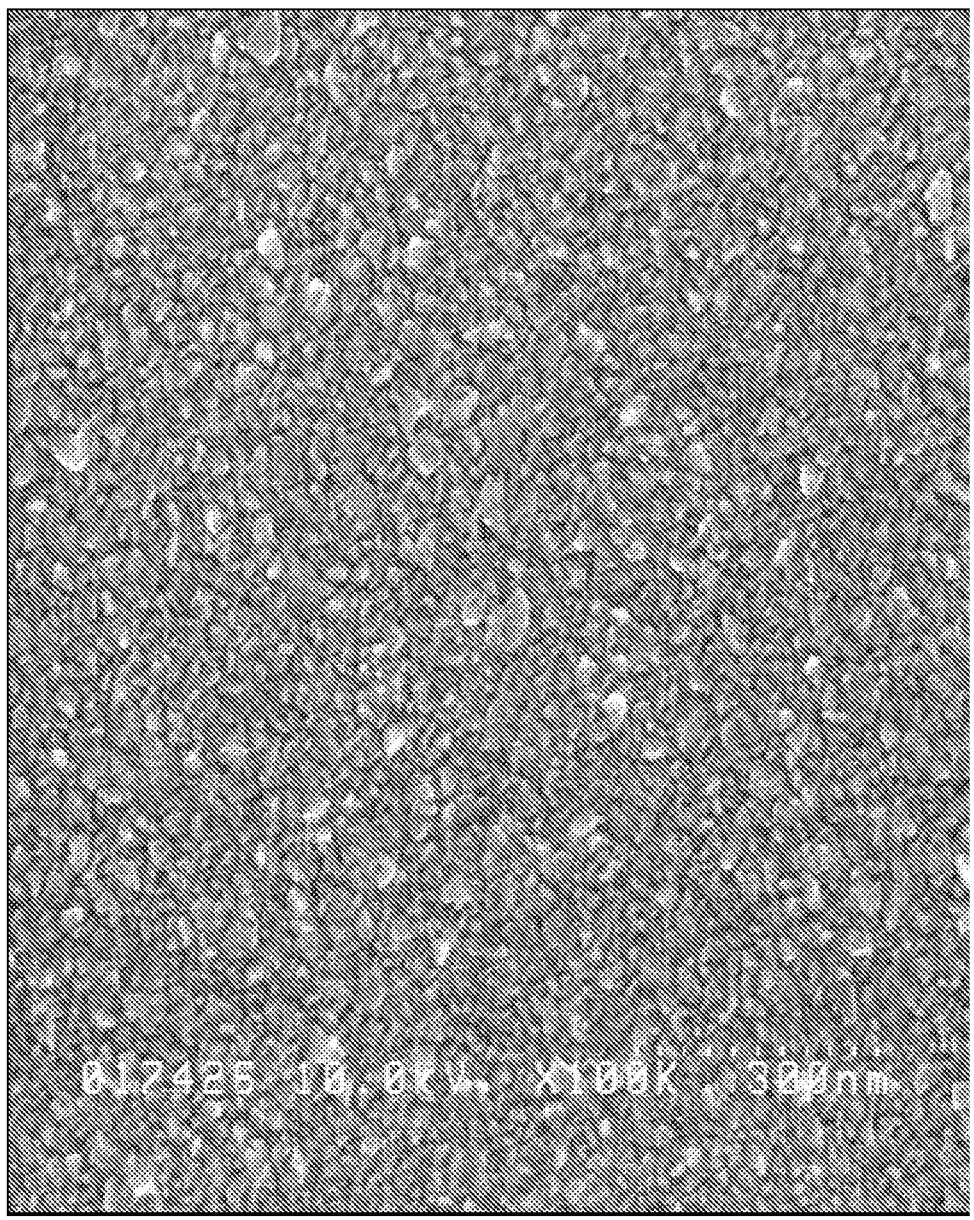

FIG. 6A is a scanning electron microscope (SEM) photograph illustrating the surface condition of the iridium oxide film 16 in the case of performing such heat treatment with rapid heat treatment for 60 seconds at a temperature of 725° C. in an Ar-oxygen gas mixture atmosphere of an oxygen concentration of 1%. Likewise, FIGS. 6B, 6C, and 6D are SEM photographs of the surface conditions of the iridium oxide films 16 in the case of performing the same heat treatment in Ar-oxygen gas mixture atmospheres of oxygen concentrations of 20%, 30%, and 50%, respectively.

Figure 6D:
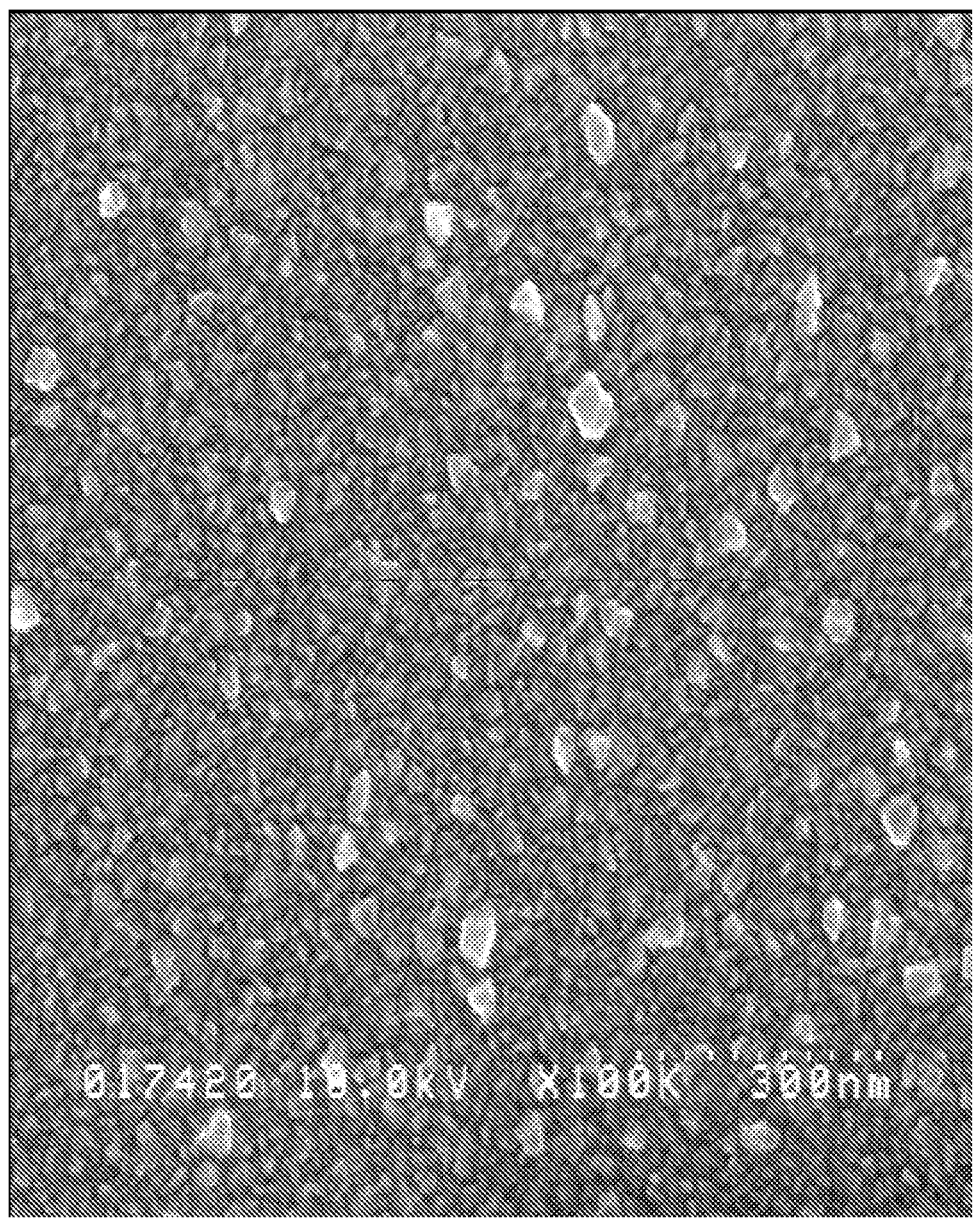
Figure 7A:
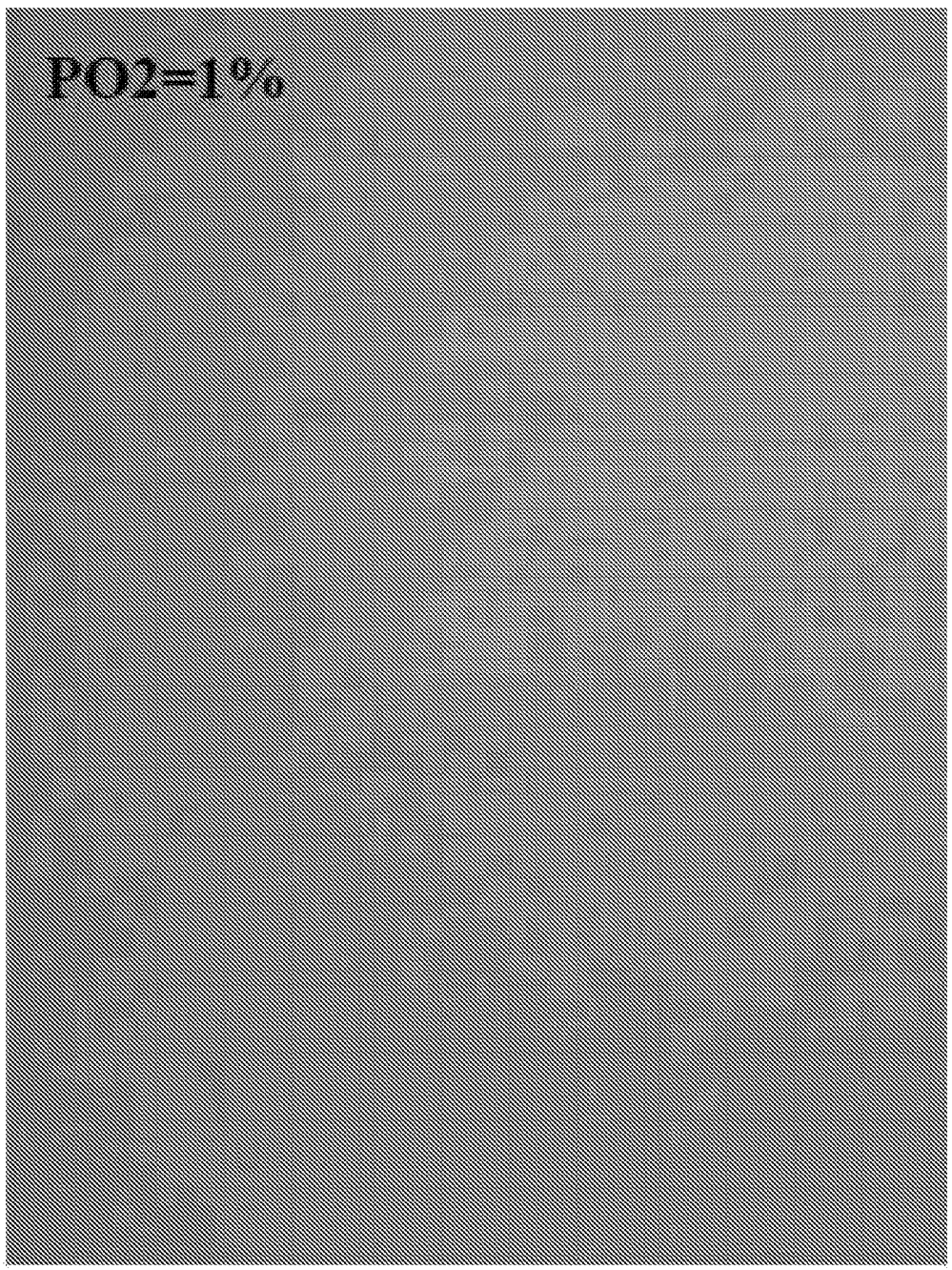
FIGS. 7A through 7F illustrate surface conditions of a film obtained in the process of FIG. 5G according to the first embodiment.
Figure 7B:
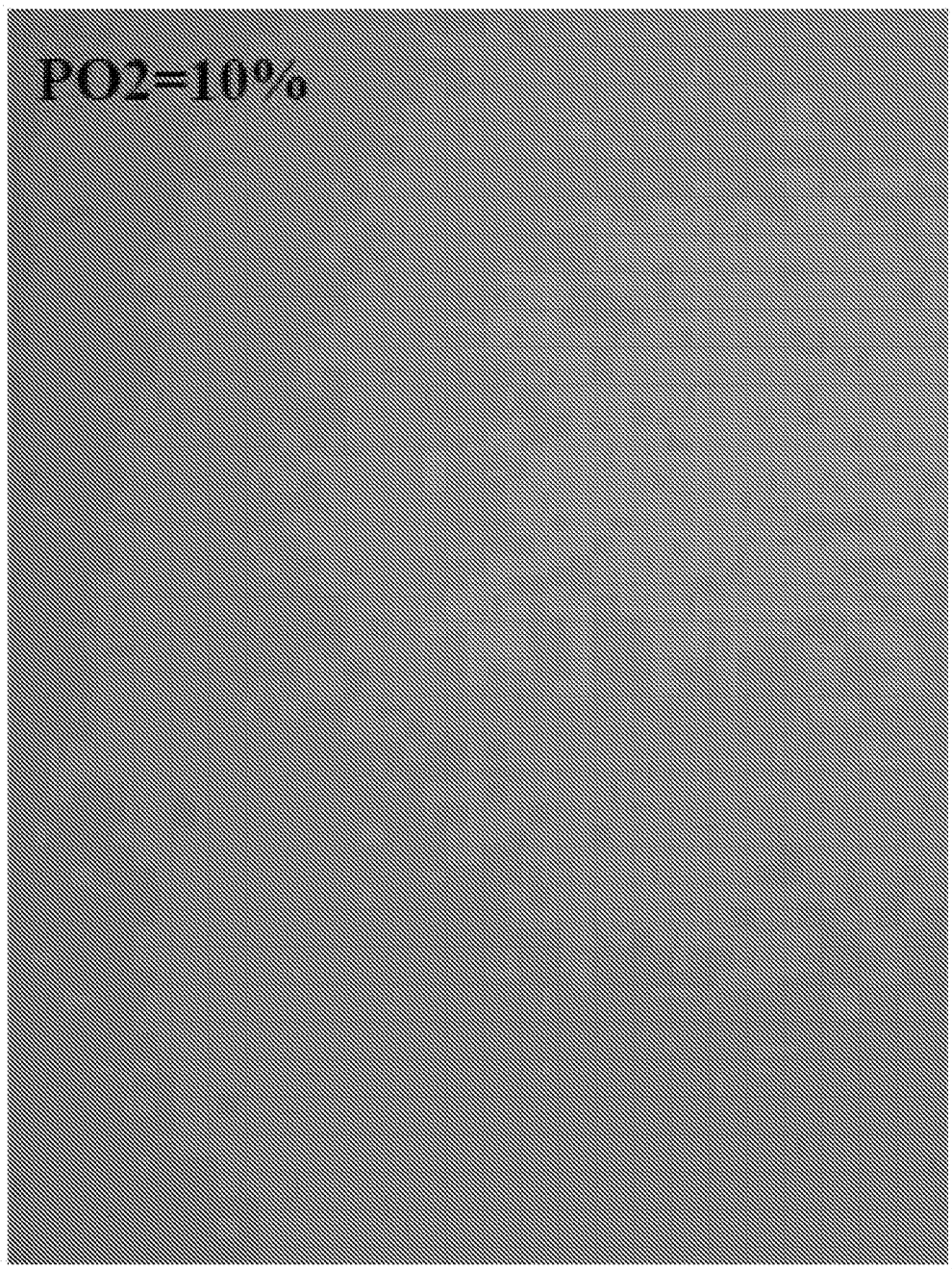
Figure 7C:
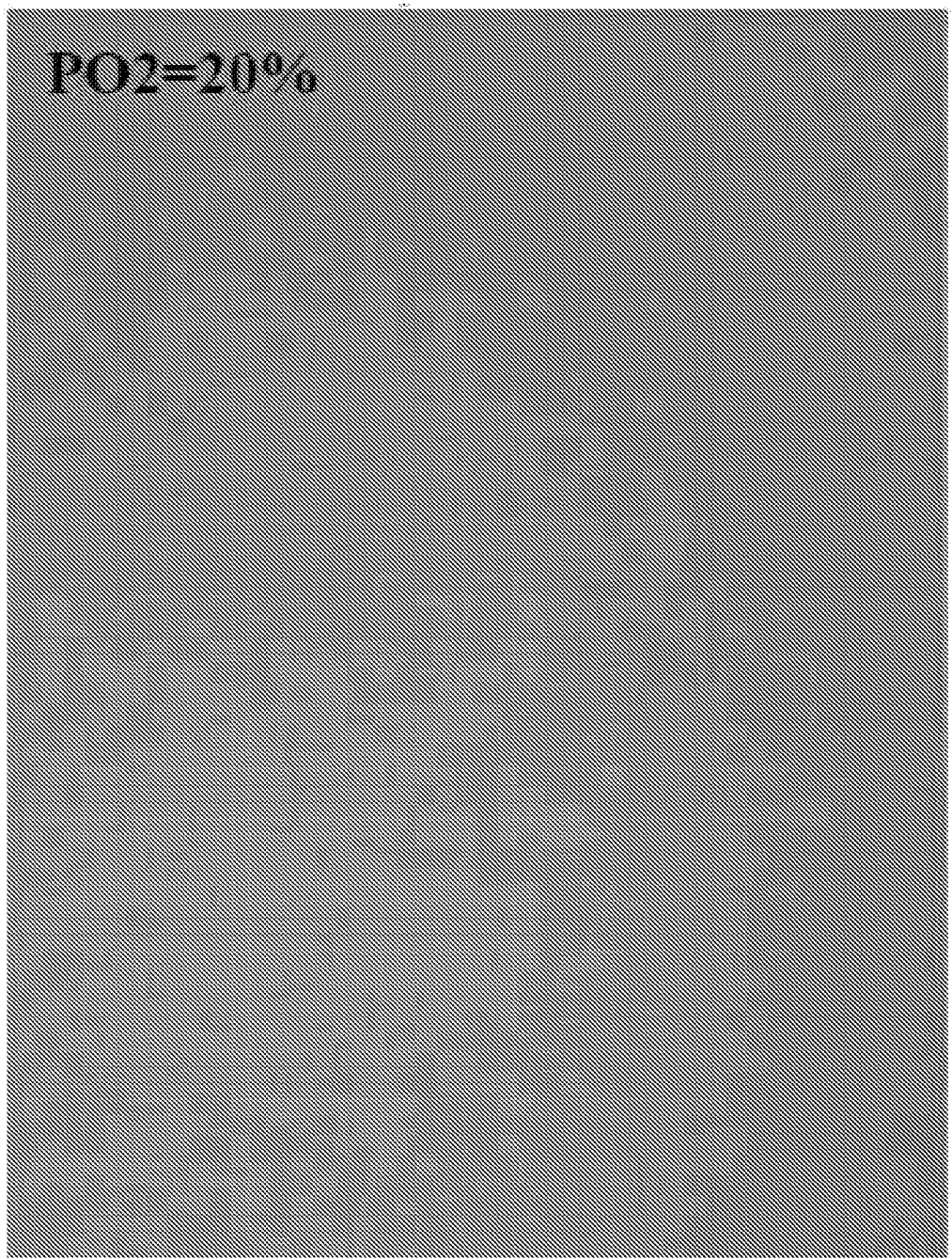
Figure 7D:
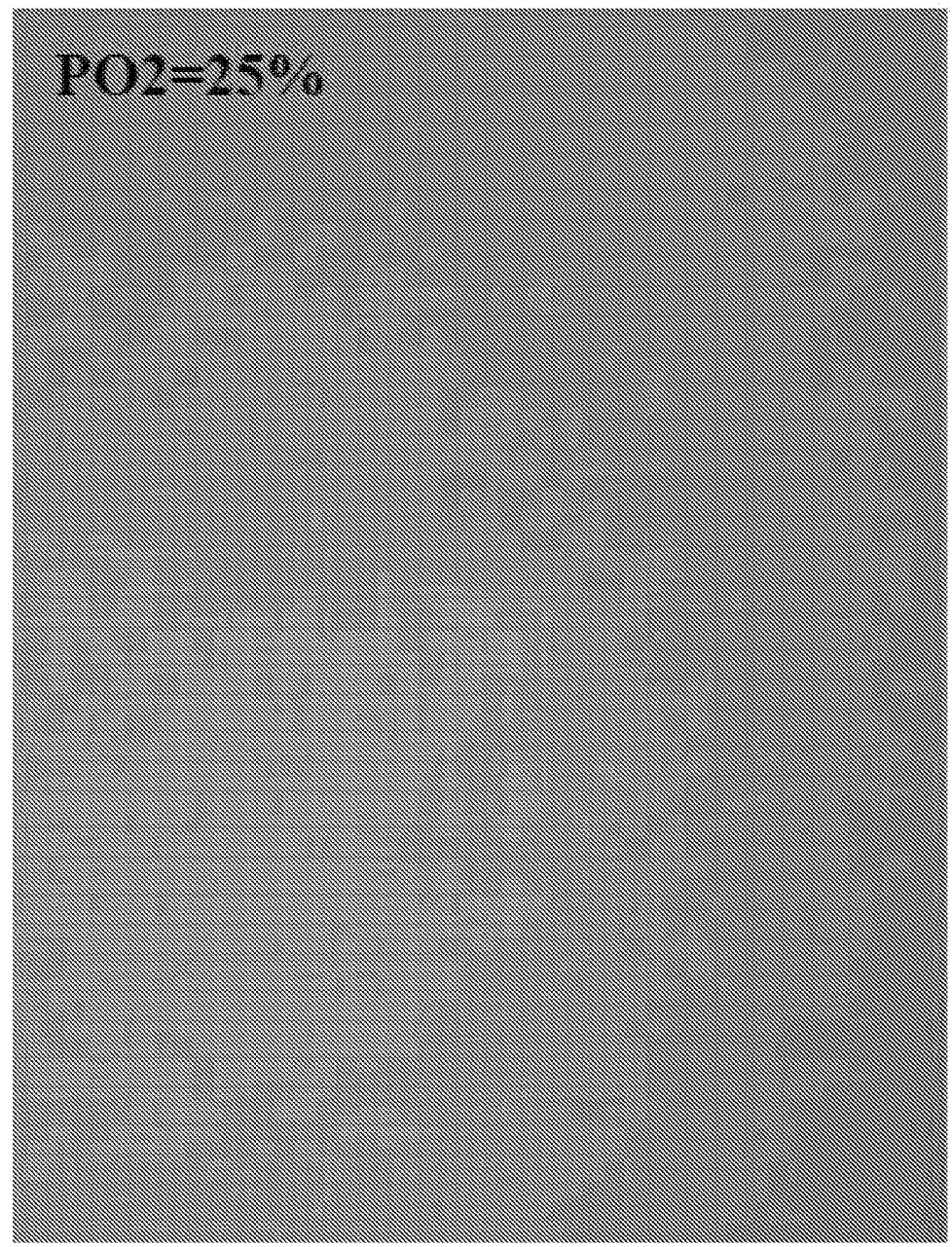
Figure 7E:
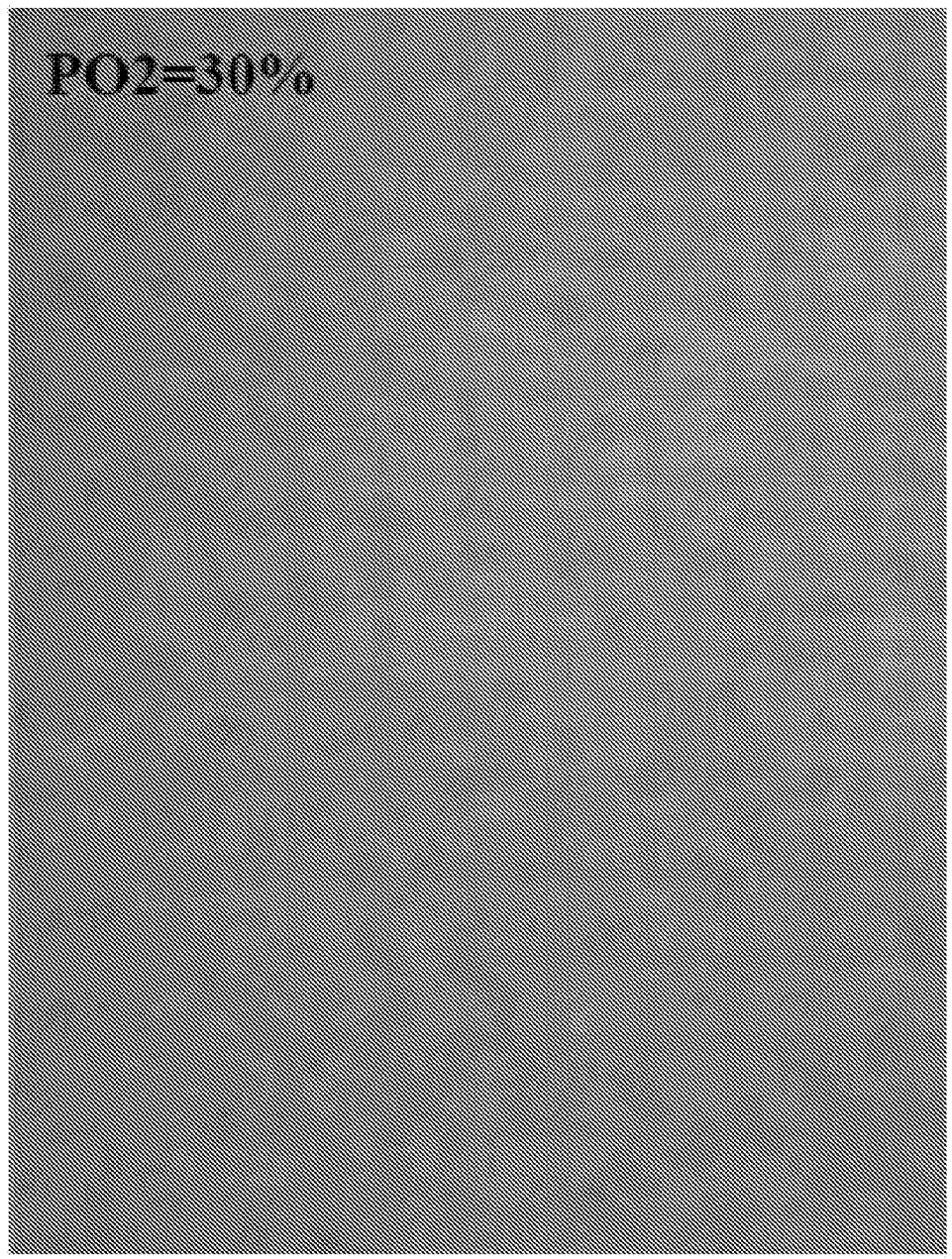
Figure 7F:
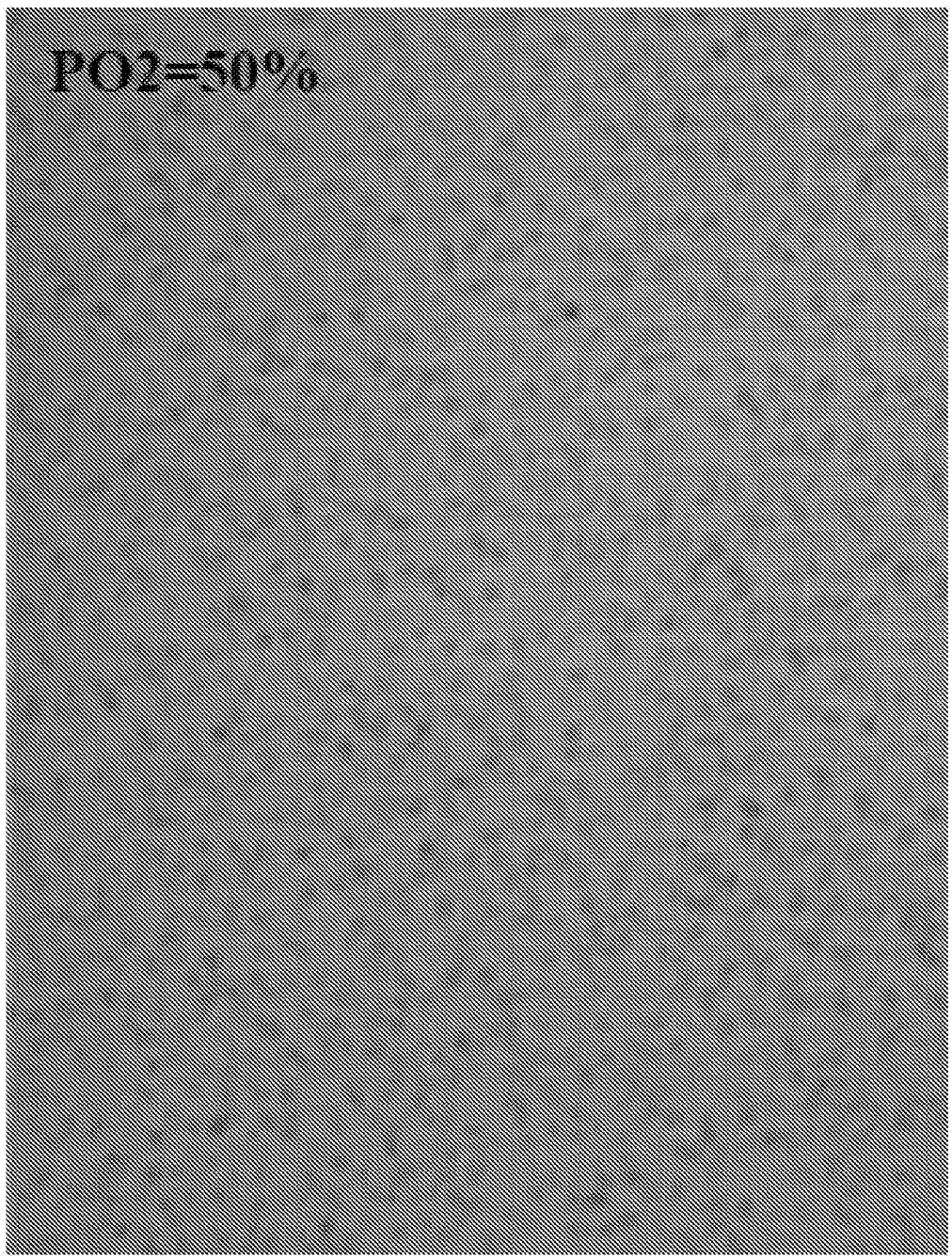

Referring to FIGS. 6A through 6D, it is seen that within the range of oxygen concentrations of 1% to 30%, the size of crystal grains in the iridium oxide film 16 gradually increases with an increase in the oxygen concentration in the atmosphere, while the crystal grain size is substantially uniform and no isolated giant crystal is generated. On the other hand, with the oxygen concentration being higher than 30%, isolated giant crystals of iridium oxide are seen as illustrated in FIG. 6D.

If abnormal growth thus occurs on the surface of the iridium oxide film 16, the abnormality of the surface morphology is transmitted to the iridium oxide film 17 (the second conductive oxide film 17) on the iridium oxide film 16, so that abnormality may also be caused in the surface morphology of the iridium oxide film 17.

Figure 5E:
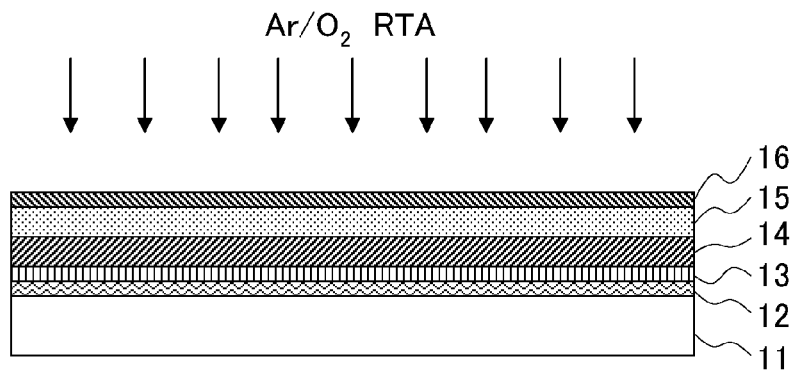

Therefore, it is desirable to perform the heat treatment of the process of FIG. 5E in an atmosphere of an oxygen concentration of 30% or less. On the other hand, in the case of performing the heat treatment of the process of FIG. 5E in an oxygen-free inert gas atmosphere, oxygen at the surface of the iridium oxide film 16 is separated. Accordingly, an oxygen concentration of at least 0.1% is believed to be desired for the heat treatment atmosphere. Therefore, according to this embodiment, the heat treatment of the process of FIG. 5E is performed in an Ar-oxygen gas mixture atmosphere of an oxygen concentration of 20%. It is believed to be preferable to perform such heat treatment with an oxygen concentration higher than or equal to 1% and lower than or equal to 20%.

Further, at temperatures lower than 650° C., the effect of the heat treatment of the process of FIG. 5E is low, so that the ferroelectric capacitor 10 has unsatisfactory electrical characteristics. On the other hand, if the temperature of the heat treatment exceeds 750° C., the barrier characteristics of the TiAlN conductive oxygen barrier film 13 under the lower electrode 24 may be degraded. Accordingly, the temperature of the heat treatment is preferably higher than or equal to 650° C. and lower than or equal to 750° C. Therefore, according to this embodiment, the heat treatment (of the process of FIG. 5E) is performed with rapid heat treatment for 60 seconds at a temperature of 725° C. in an Ar-oxygen gas mixture atmosphere of an oxygen concentration of 20%.

According to this embodiment, the iridium oxide film 16 has a nonstoichiometric composition as described above. Accordingly, as a result of the heat treatment of FIG. 5E, Pb is diffused from the PZT film forming the ferroelectric film 15 into the iridium oxide (IrOx) film 16, so that a flat interface is formed between the ferroelectric film 15 and the iridium oxide film 16. As a result, on application of voltage to the ferroelectric capacitor 10, a uniform electric field is induced in the ferroelectric film 15 so as to allow polarization reversal to be induced in the ferroelectric capacitor 10 at low drive voltage.

Figure 5F:
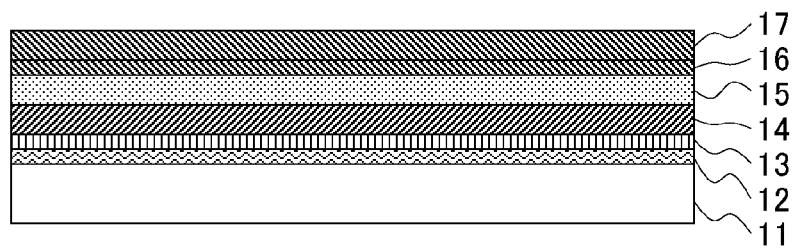

Next, according to this embodiment, in the process of FIG. 5F, the iridium oxide film 17 is formed to be 100 nm to 150 nm in thickness on the structure of FIG. 5E by sputtering at a substrate temperature higher than or equal to 50° C. and lower than or equal to 80° C. The iridium oxide film 17 thus formed is in a microcrystalline state. This corresponds to step S15 of FIG. 4. If the iridium oxide film 17 thus formed is in an amorphous state, the iridium oxide film 17 becomes non-uniform after crystallization in the subsequent process in which the iridium oxide film 17 is subjected to crystallization heat treatment, so that voids described with reference to FIG. 2 are likely to be generated in the iridium oxide film 17. Further, if the iridium oxide film 17 is formed at a temperature higher than or equal to 150° C., some crystal grains grow abnormally so as to prevent a flat surface morphology from being obtained although the obtained iridium oxide film 17 is in a crystallized state. Further, the obtained iridium oxide film 17 includes both microcrystals and crystals if the film formation temperature is lower than or equal to 100° C., and is formed of only microcrystals if the film formation temperature is lower than or equal to 80° C. Therefore, according to this embodiment, the film formation process of FIG. 5F by sputtering is performed at a temperature higher than or equal to 50° C. and lower than or equal to 80° C., for example, 60° C.

At this point, in the process of FIG. 5F, the iridium oxide film 17 is formed by sputtering by feeding Ar gas and oxygen gas at flow rates of 100 sccm and 100 sccm, respectively, and inputting sputtering power of, for example, 1 kW under a pressure of 0.3 Pa. In the case of forming the iridium oxide film 17 under these conditions, it is possible to prevent abnormal oxidation and the resultant abnormal growth of crystal grains on the surface of the iridium oxide film 17.

Figure 5G:
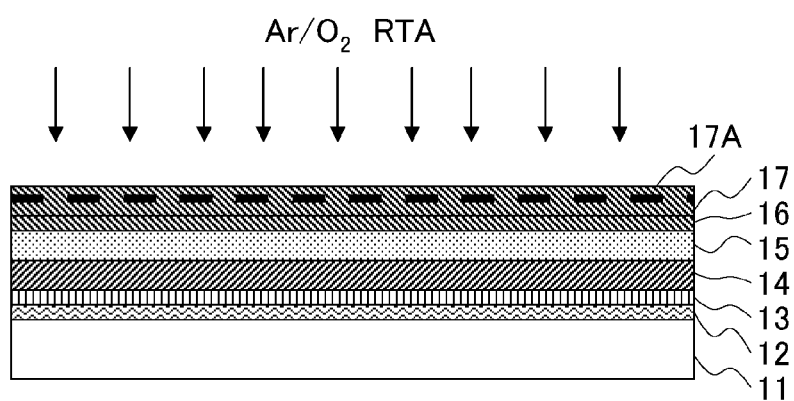

Next, in the process of FIG. 5G, which corresponds to step S16 of FIG. 4, the structure of FIG. 5F is crystallized by being subjected to rapid heat treatment (rapid thermal annealing [RTA]) for 60 seconds at a temperature within the range of 650° C. to 750° C., for example, 700° C., under normal pressure or reduced pressure in an Ar-oxygen gas mixture atmosphere.

FIGS. 7A, 7B, 7C, 7D, 7E, and 7F are metallurgical microscope photographs observing the surface conditions of the obtained iridium oxide films 17 in the case of performing the heat treatment of FIG. 5G in Ar-oxygen gas mixture atmospheres with oxygen concentrations of 1%, 10%, 20%, 25%, 30%, and 50%, respectively, at a pressure of 0.1 MPa.

Referring to FIGS. 7A through 7E, uniform surface conditions are observed up to an oxygen concentration of 30%. However, with an oxygen concentration higher than 30%, a non-uniform structure is observed and it is seen that abnormal growth is caused on the surface as in FIG. 7F.

Therefore, according to this embodiment, the heat treatment process of FIG. 5G is performed with an oxygen concentration higher than or equal to 0.1% and lower than or equal to 30%, preferably an oxygen concentration higher than or equal to 1% and lower than or equal to 20%, the same as in the heat treatment process of FIG. 5E, so as to avoid such a problem of abnormal growth.

Figure 8A:
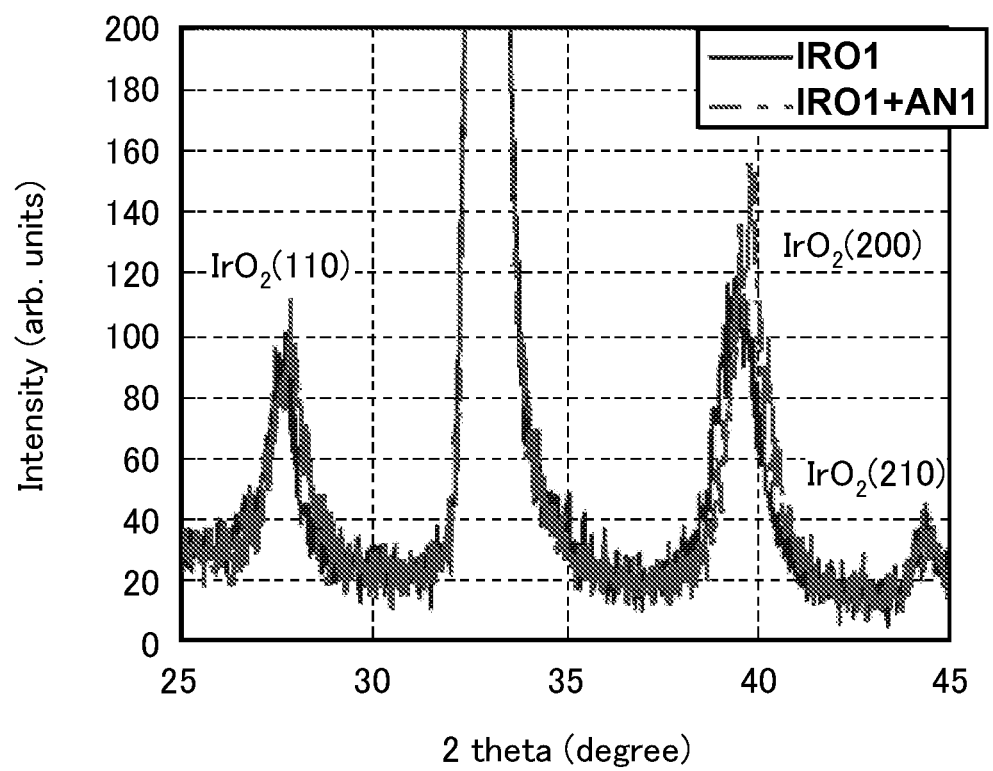
FIG. 8A is a graph illustrating a change in an X-ray diffraction caused by the heat treatment process of FIG. 5E according to the first embodiment.
Figure 8B:
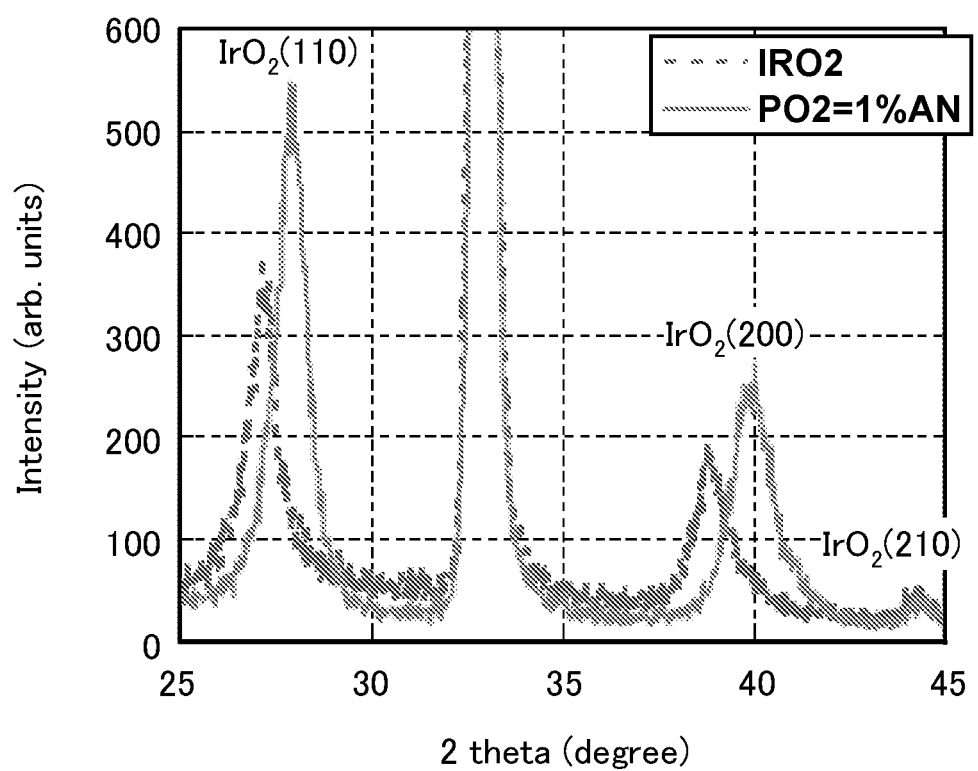
FIG. 8B is a graph illustrating a change in an X-ray diffraction caused by the heat treatment process of FIG. 5G according to the first embodiment.
Figure 8C:
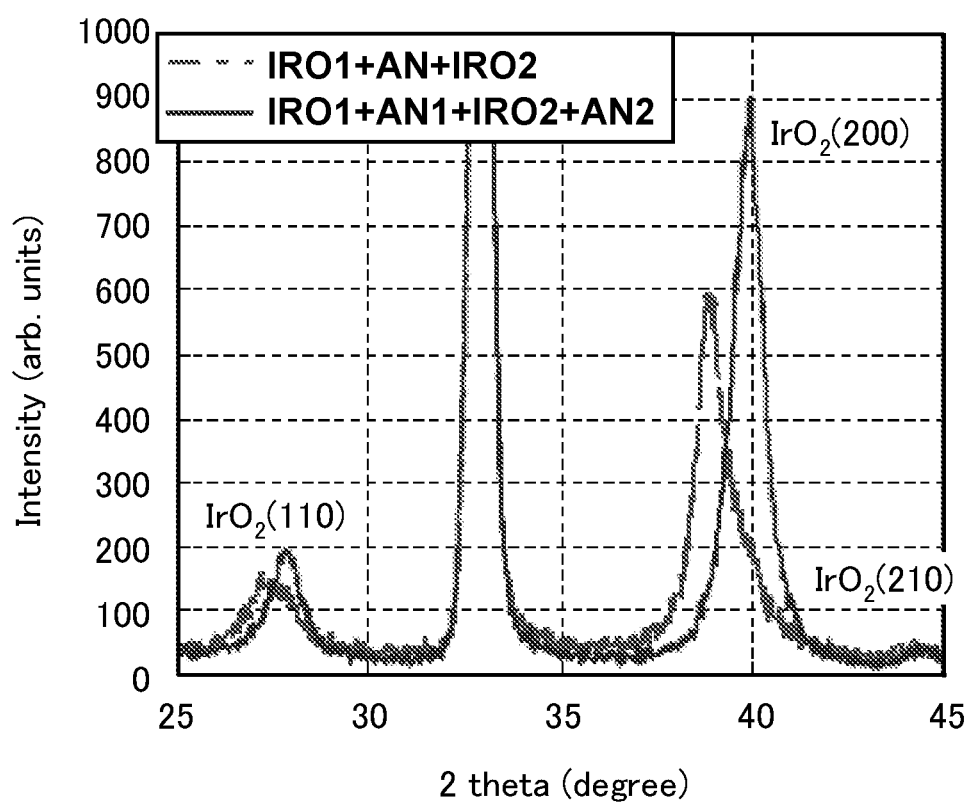
FIG. 8C is another graph illustrating a change in an X-ray diffraction caused by the heat treatment process of FIG. 5G according to the first embodiment.

FIGS. 8A, 8B, and 8C are graphs representing X-ray diffraction patterns of the first iridium oxide film 16, the second iridium oxide film 17, and the laminated structure of the first and second iridium oxide films 16 and 17, respectively.

Referring to FIG. 8A, the solid line corresponds to the condition of the iridium oxide film 16 immediately after its formation, and the broken line corresponds to the condition of the iridium oxide film 16 after being subjected to the heat treatment process of FIG. 5E. When these are compared, it is found that the heat treatment of FIG. 5E hardly causes any change to the diffraction pattern in each of the peak position and the 2θ angle and that diffraction peaks also substantially coincide with the diffraction peaks of the $IrO_2$ film, which is of a stoichiometric composition. This indicates that the iridium oxide film 16 has been crystallized completely by the heat treatment process of FIG. 5E.

FIG. 8B is a graph presenting the X-ray diffraction patterns of the independently formed iridium oxide film 17 immediately after its formation (broken line) and after being subjected to the heat treatment of FIG. 5G in an atmosphere of an oxygen concentration of 1% (solid line) in a comparative manner. In this case, immediately after the film formation, the film 17 is in a microcrystalline state with the (110) and (200) diffraction peaks being low and the 2θ angle being shifted to the lower angle side compared with that of $IrO_2$. On the other hand, it is seen that after the heat treatment, the film 17 is completely crystallized and the (110) and (200) diffraction peaks substantially match the corresponding (110) and (200) peaks of the stoichiometric composition $IrO_2$ film.

Further, FIG. 8C is a graph representing the X-ray diffraction patterns of the multilayer structure of the iridium oxide films 16 and 17 as illustrated in FIG. 5G before and after the heat treatment of FIG. 5G in a comparative manner. In FIG. 8C, the broken line corresponds to the condition before the heat treatment process of FIG. 5G, and the solid line corresponds to the condition after the heat treatment process of FIG. 5G.

Referring to FIG. 8C, in this experiment, substantially the same results as those of FIG. 8B were obtained. That is, immediately after the formation of the iridium oxide film 17, the film 17 is in a microcrystalline state with the (110) and (200) diffraction peaks being low and the 2θ angle being shifted to the lower angle side compared with that of $IrO_2$. On the other hand, it is seen that after the heat treatment of FIG. 5G, the iridium oxide film 17 is completely crystallized and the (110) and (200) diffraction peaks substantially match the corresponding (110) and (200) peaks of the stoichiometric composition $IrO_2$ film.

Figure 8D:
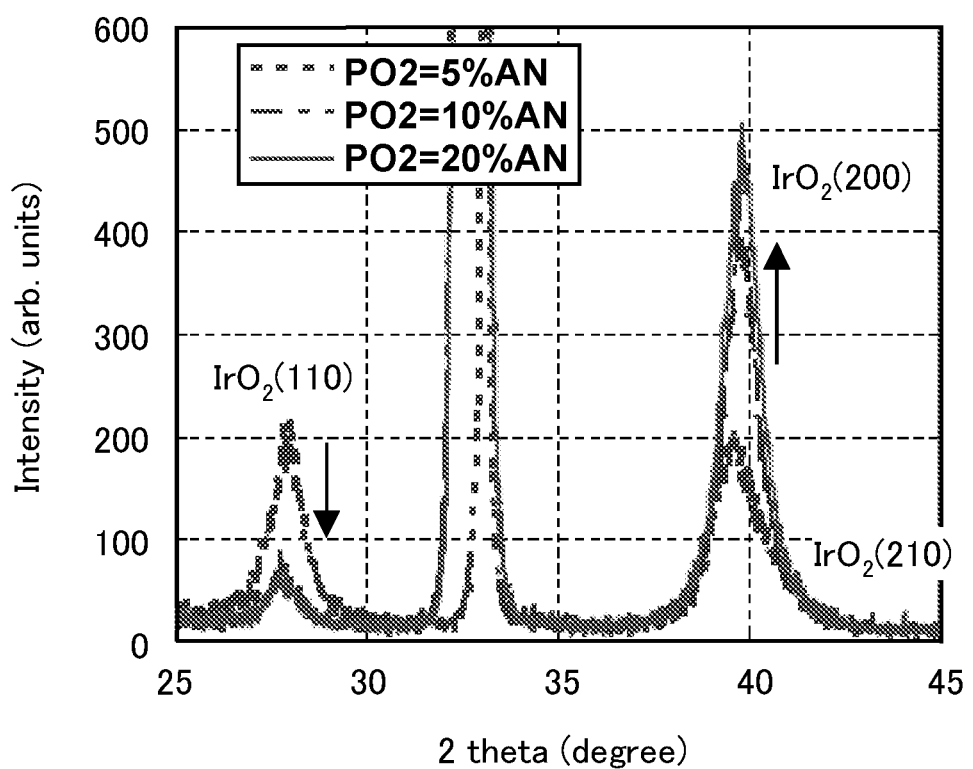
FIG. 8D is another graph illustrating a change in an X-ray diffraction caused by the heat treatment process of FIG. 5G according to the first embodiment.

Further, FIG. 8D illustrates the case of varying the oxygen concentration in the atmosphere in subjecting the iridium oxide film 17 independently to heat treatment corresponding to the process of FIG. 5G.

It is seen from FIG. 8D that as the oxygen concentration in the atmosphere increases, the Ir (110) peak decreases and the Ir (200) peak increases. This means that the heat treatment has increased the degree of oxidation of the iridium oxide film 17.

That is, it is believed as follows. The iridium oxide film 17 is low in the degree of oxidation and its composition deviates greatly from the ideal stoichiometric composition $IrO_2$ in a microcrystalline state immediately after its formation. On the other hand, the heat treatment of FIG. 5G causes oxygen to be taken into the iridium oxide film 17 from the atmosphere so as to increase the in-film oxygen composition (value) y. At this point, the oxygen composition y is maximized, in particular, at the film surface, so that the stoichiometric composition region 17A (surface region) of 20 nm or less in thickness having a stoichiometric composition $IrO_2$ is formed. As a result, the oxygen concentration profile illustrated in FIG. 3B is generated in the upper electrode structure of the ferroelectric capacitor 10 including the iridium oxide films 16 and 17.

Table 1 below illustrates a collection of data on the oxygen composition parameters x and y after the heat treatment process of FIG. 5G, obtained by HRBS (high-resolution Rutherford backscattering spectrometry) with respect to the first iridium oxide (IrOx) film 16 and the second iridium oxide (IrOy) film 17 thus formed.

TABLE 1

| CONDUCTIVE OXIDE FILM | FILM FORMATION TEMPERATURE | FILM FORMATION GAS Ar:$O_2$ (Sccm) | HRBS RESULTS x, y |
|---|---|---|---|
| IrOx | 20° C. | 100:52 | 1.20 |
| IrOx | 20° C. | 100:59 | 1.50 |
| IrOx | 300° C. | 140:60 | 1.92 |
| IrOy | 20° C. | 100:100 | 2.10 |
| IrOy | 60° C. | 100:100 | 2.10 |
| IrOy | 300° C. | 100:100 | 2.05 |

Referring to Table 1, the oxygen composition parameter x of the first iridium oxide film 16 has a value of 1.20 to 1.50 when formed at a substrate temperature of 20° C. and a value of 1.92 when formed at a substrate temperature of 300° C., and the oxygen composition parameter y of the second iridium oxide film 17 has a value of 2.10 when formed at a substrate temperature of 20° C. to 60° C. and a value of 2.05 when formed at a substrate temperature of 300° C.

Here, it is believed that as described above, oxygen is introduced into the iridium oxide film 17 from its surface by the heat treatment in the process of FIG. 5G so that while the iridium oxide film 17 has a substantially stoichiometric composition $IrO_2$ at its surface, the oxygen concentration is reduced inside the film 17, thus resulting in the oxygen distribution described above with reference to FIG. 3B.

Figure 5H:
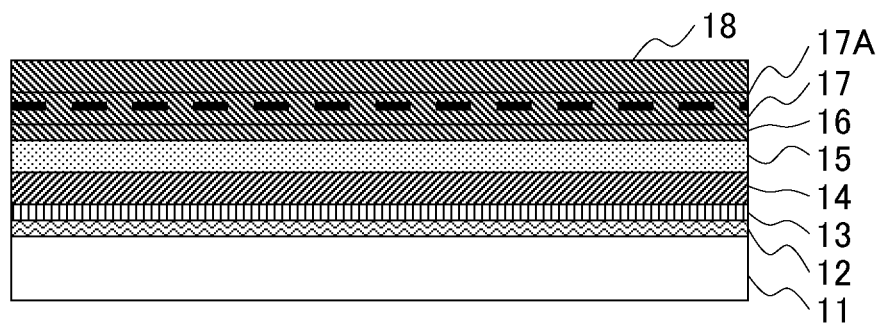
Figure 14:
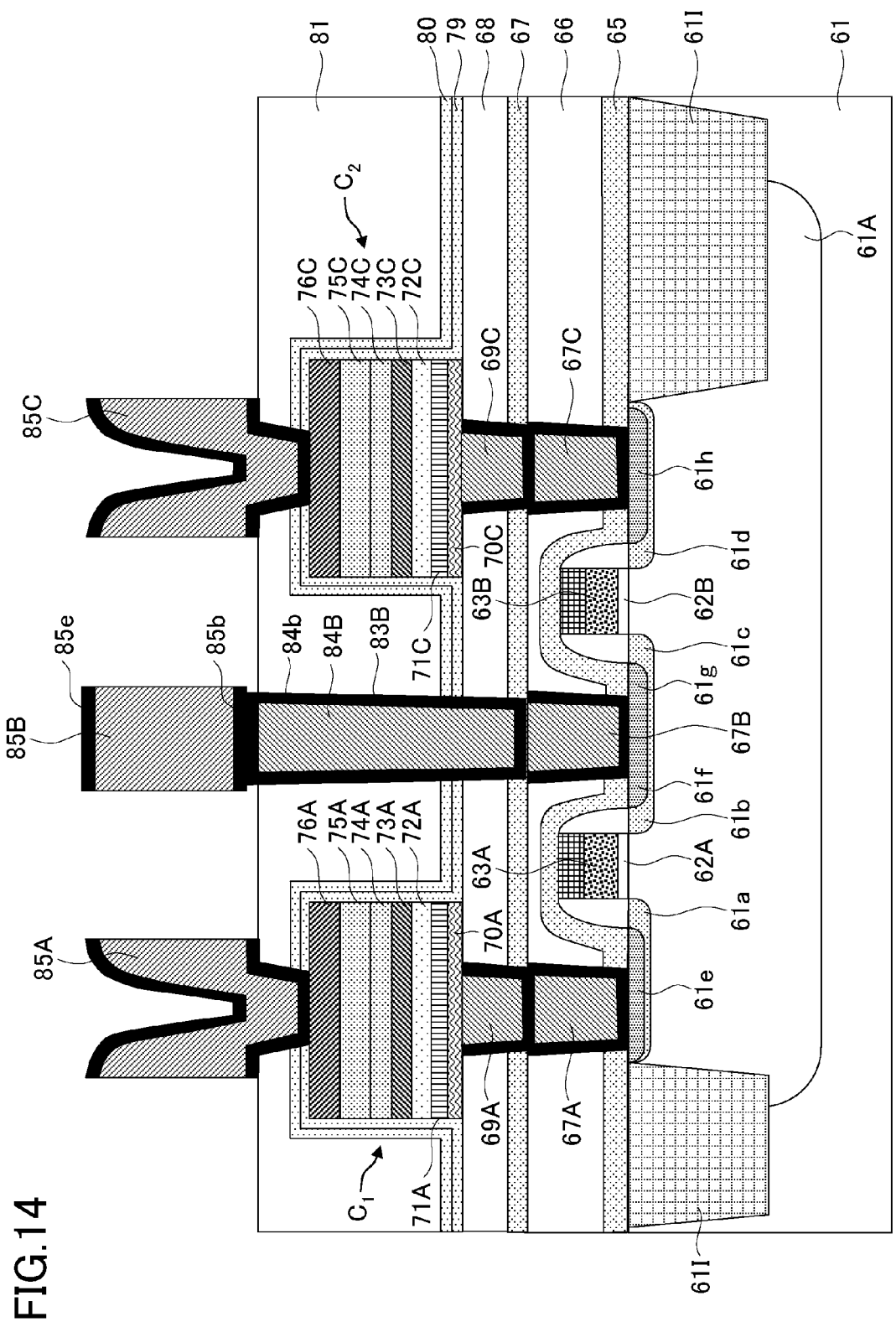
FIG. 14 is a diagram illustrating a method of manufacturing a ferroelectric memory according to a fourth embodiment.

Next, in the process of FIG. 5H, which corresponds to step S17 of FIG. 14, the metal Ir film 18 is formed on the iridium oxide film 17 of FIG. 5G, so that the ferroelectric capacitor 10 is completed.

Figure 9A:
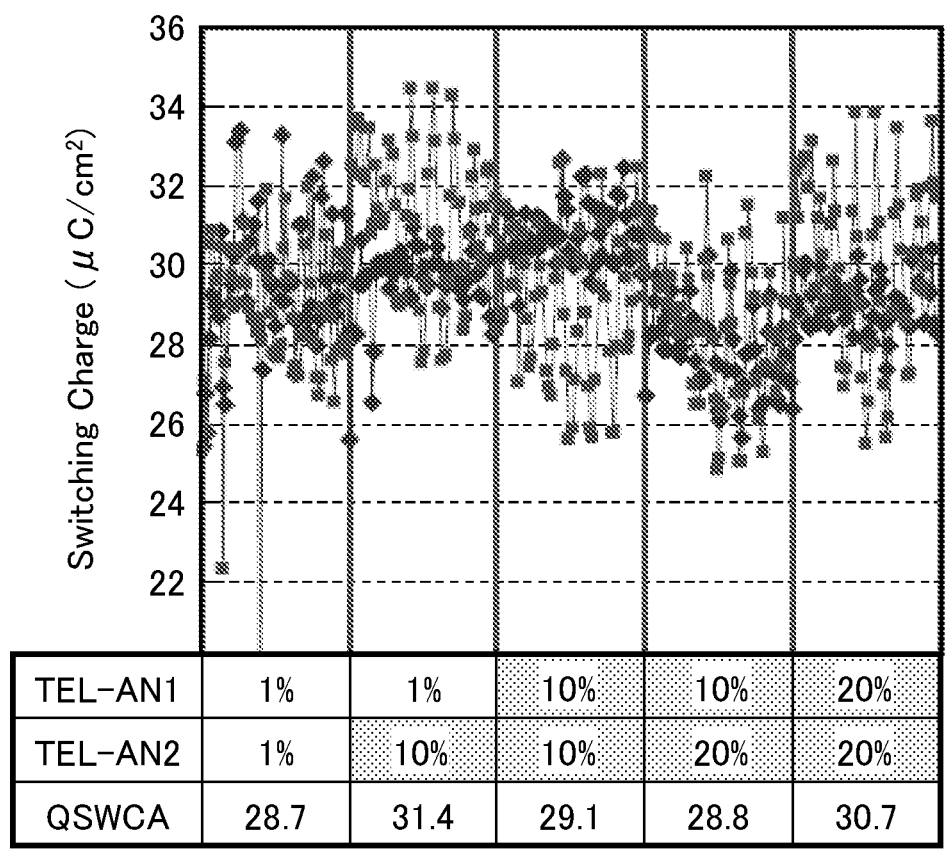
FIG. 9A illustrates an electrical characteristic of the ferroelectric capacitor of FIG. 3A according to the first embodiment.
Figure 9B:
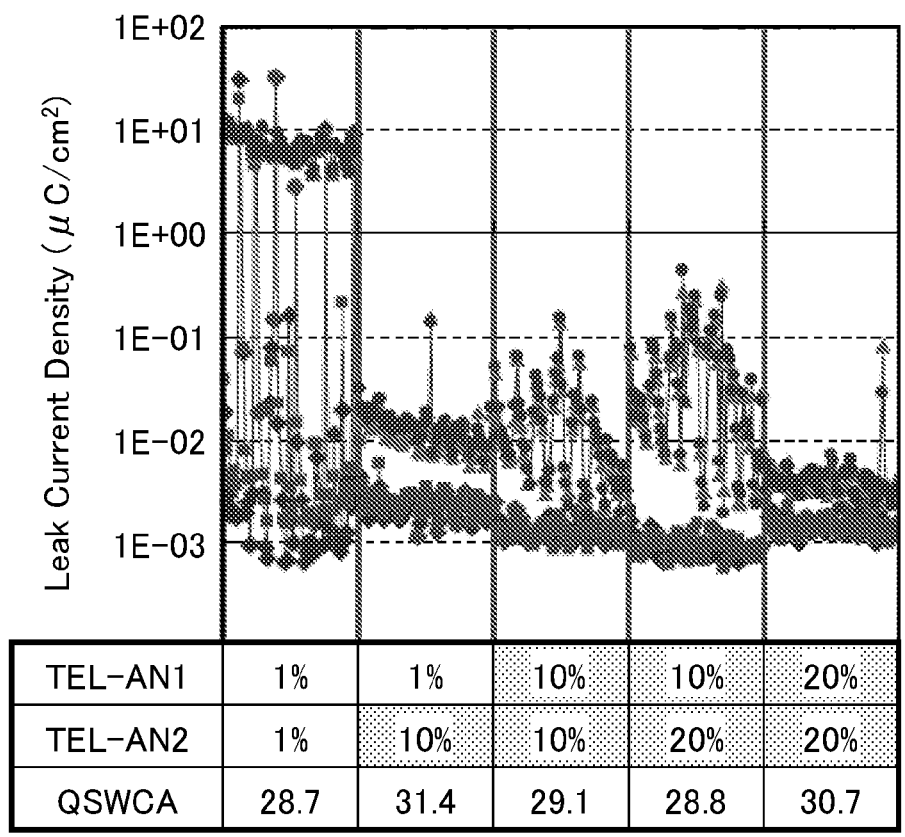
FIG. 9B illustrates an electrical characteristic of the ferroelectric capacitor of FIG. 3A according to the first embodiment.

FIGS. 9A and 9B illustrate the amount of switching charge $Q_{sw}$ and the leak current density, respectively, of the ferroelectric capacitor 10 thus obtained. FIGS. 9A and 9B illustrate the case where the ferroelectric capacitor 10 is 50 μm×50 μm in size and the measurements were performed with a multilayer interconnection structure of five layers on the ferroelectric capacitor 10. In FIGS. 9A and 9B, TEL-AN1 indicates the oxygen concentration in the atmosphere in the heat treatment process of FIG. 5E, and TEL-AN2 indicates the oxygen concentration in the atmosphere in the heat treatment process of FIG. 5G.

Referring to FIG. 9A, according to this embodiment, values greater than or equal to 28 μC/cm² are obtained as the amount of switching charge $Q_{sw}$. These values are far greater than the value (28 μC/cm²) obtained in Patent Document 2. Further, it is seen from FIG. 9B that the leak current may be substantially reduced particularly in the case of performing the heat treatment process of FIG. 5G with oxygen concentrations higher than or equal to 10%. This indicates that the formation of voids described above with reference to FIG. 2 is controlled effectively in the iridium oxide film 17. On the other hand, a large leak current is generated in the case of an oxygen concentration of 1% in the heat treatment process of FIG. 5G. This indicates that the voids described above with reference to FIG. 2 are generated on a large scale in the iridium oxide film 17.

Figure 10:
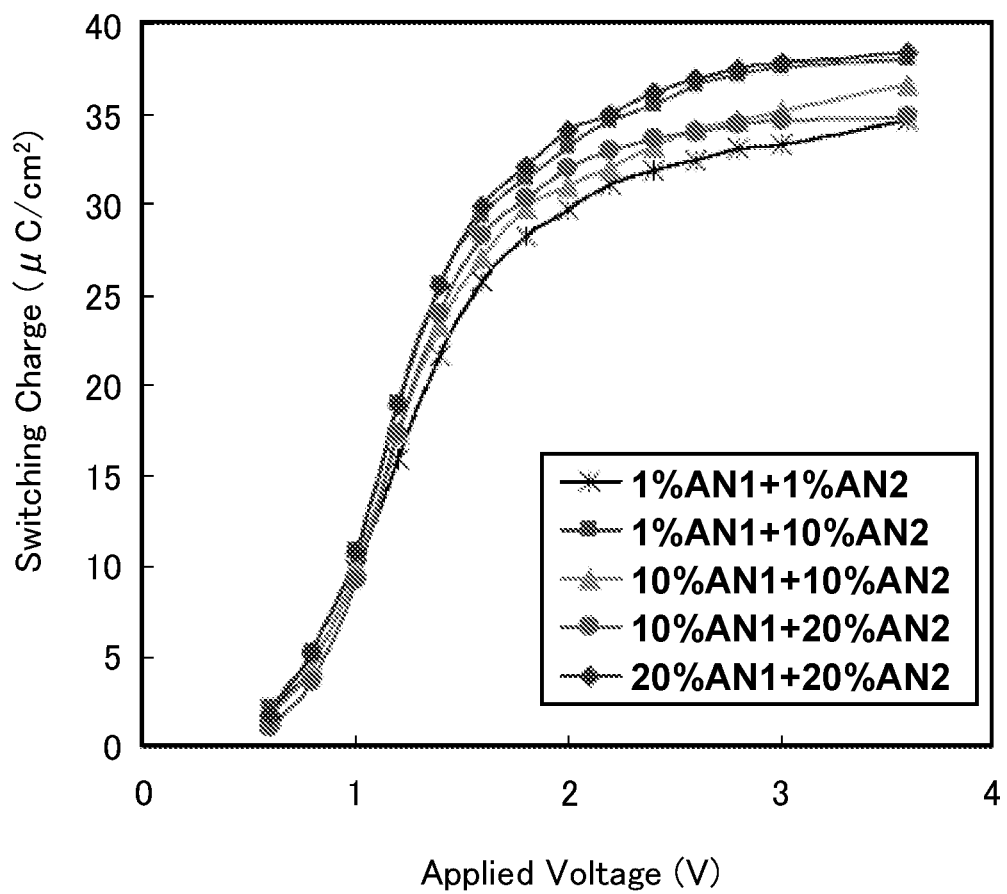
FIG. 10 illustrates an electrical characteristic of the ferroelectric capacitor of FIG. 3A according to the first embodiment.

Further, FIG. 10 illustrates the relationship between the amount of switching charge $Q_{sw}$ and the applied voltage of the ferroelectric capacitor 10 thus obtained.

Referring to FIG. 10, the relationship between the amount of switching charge $Q_{sw}$ and the applied voltage is affected by the heat treatment process of FIG. 5E and the heat treatment process o FIG. 5G. By performing these heat treatment processes with an oxygen concentration of 20%, the relationship may be changed so as to cause the amount of switching charge $Q_{sw}$ to rise sharply. According to this embodiment, by thus performing the heat treatment processes of FIGS. 5E and 5G in an atmosphere of a relatively high oxygen concentration, it is possible to control formation of voids in the iridium oxide film 17, so that the problem of entrance of hydrogen or water into a ferroelectric capacitor is solved even when the subsequent process of forming a multilayer interconnection structure is performed.

According to this embodiment, in forming the ferroelectric capacitor 10 of FIG. 3A, the heat treatment processes of FIGS. 5E and 5G are performed in an Ar-oxygen gas mixture atmosphere of an oxygen concentration of 30% or less. As a result, it is possible to avoid abnormal growth of iridium oxide crystals on the surfaces of the first and second iridium oxide films 16 and 17. In the processes of FIGS. 5E and 5G, the Ar gas may be replaced with other inert gases such as nitrogen gas and He gas. Further, the oxygen gas may be replaced with other oxidizing gases such as $N_2O$ and ozone.

In this embodiment, after step S12 of FIG. 4, a thinner amorphous ferroelectric film may be formed on the crystallized ferroelectric film 15 to compensate for oxygen deficiencies, and thereafter or immediately thereafter, the first iridium oxide film 16 may be formed thereon.

Further, after step S16 and before step S17 of FIG. 4, further rapid heat treatment may be performed at 650° C. to 750° C. so as to increase the adhesion between the ferroelectric film 15 and the upper electrode (the first and second iridium oxide films 16 and 17).

According to this embodiment, the first and second conductive oxide films 16 and 17 are described as iridium oxide films. However, this embodiment is not limited to such a particular material, and materials such as a ruthenium oxide, a rhodium oxide, a rhenium oxide, and an osmium oxide may also be used for the first and second conductive oxide films 16 and 17. These conductive oxide films may be formed by sputtering using metal elements such as Ir, Ru, Rh, Re, and Os as targets.

[b] Second Embodiment

Figure 11A:
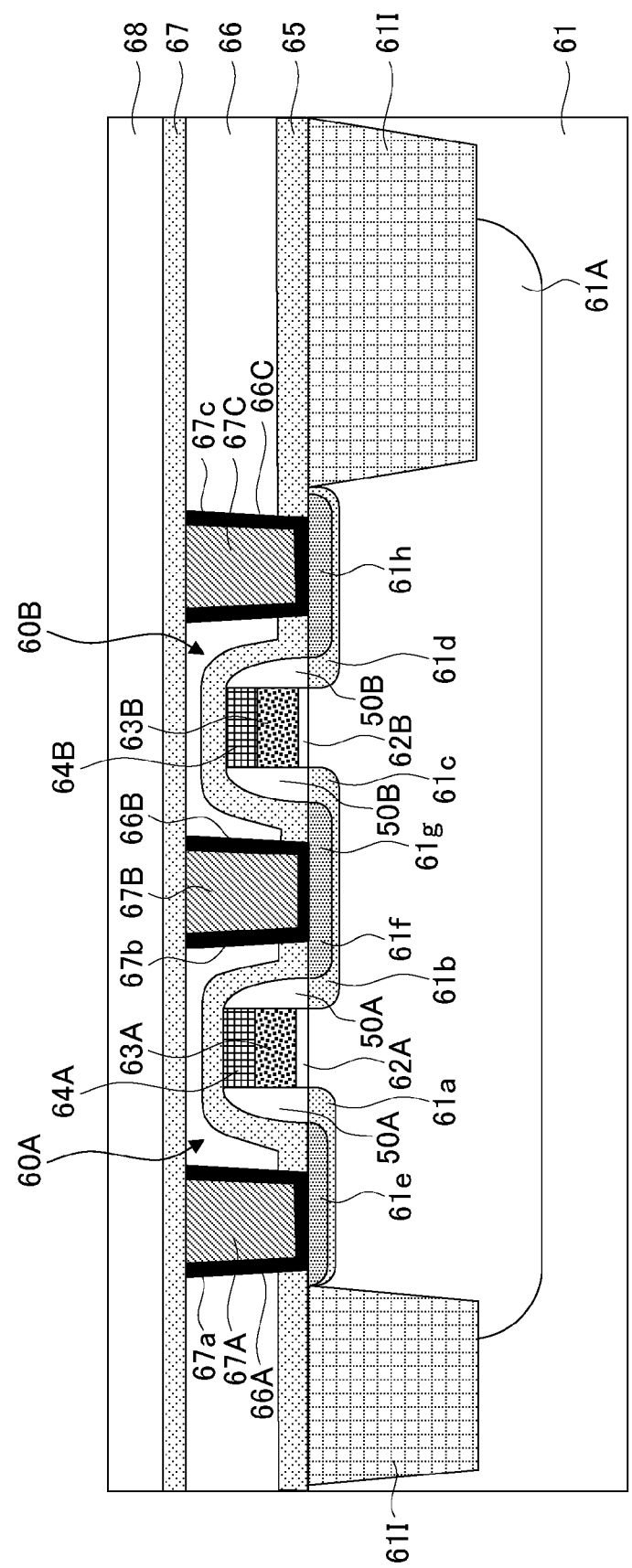
FIGS. 11A through 11V are diagrams illustrating a method of manufacturing a ferroelectric memory according to a second embodiment.

A description is given, with reference to FIGS. 11A through 11V, of a process for manufacturing a ferroelectric memory according to a second embodiment of the present invention.

Referring to FIG. 11A, an n-type well is formed as a device region 61A in a silicon substrate 61. A first MOS transistor 60A and a second MOS transistor 60B are formed on the device region 61A. The first MOS transistor 60A includes a gate insulating film 62A on the silicon substrate 61 and a polysilicon gate electrode 63A on the gate insulating film 62A. The second MOS transistor 60B includes a gate insulating film 62B on the silicon substrate 61 and a polysilicon gate electrode 63B on the gate insulating film 62B.

P⁻-type LDD regions 61a and 61b are formed in the silicon substrate 61 in correspondence to the sidewall faces of the gate electrode 63A. P⁻-type LDD regions 61c and 61d are formed in the silicon substrate 61 in correspondence to the sidewall faces of the gate electrode 63B. Here, the first and second MOS transistors 60A and 60B are formed so as to share the same p⁻-type diffusion regions as the LDD region 61b and the LDD region 61c in the device region 61A.

Silicide layers 64A and 64B are formed on the polysilicon gate electrodes 63A and 63B, respectively. Further, sidewall insulating films 50A and 50B are formed on the sidewall faces of the polysilicon gate electrodes 63A and 63B, respectively.

Further, p⁺-type diffusion regions 61e and 61f are formed in the silicon substrate 61 outside the sidewall insulating films 50A of the gate electrode 63A. Further, p⁺-type diffusion regions 61g and 61h are formed in the silicon substrate 61 outside the sidewall insulating films 50B of the gate electrode 63B. The diffusion regions 61f and 61g are formed of the same p⁺-type diffusion region.

A SiON film 65 of, for example, 200 nm in thickness is formed on the silicon substrate 61 so as to cover the gate electrode 63A including the silicide layer 64A and the sidewall insulating films 50A and the gate electrode 63B including the silicide layer 64B and the sidewall insulating films 50B. A $SiO_2$ interlayer insulating film 66 of, for example, 1000 nm in thickness is formed on the SiON film 65 by plasma CVD using TEOS as a material. Further, the interlayer insulating film 66 is flattened by CMP, and contact holes 66A, 66B, and 66C are formed in the interlayer insulating film 66 so as to expose the diffusion regions 61e, 61f and 61g, and 61h, respectively. Tungsten (W) via plugs 67A, 67B, and 67C are formed on adhesion layers 67a, 67b, and 67c in the contact holes 66A, 66B, and 66C, respectively. Each of the adhesion layers 67a, 67b, and 67c has a multilayer structure of a Ti film of 30 nm in thickness and a TiN film of 20 nm in thickness.

Further, according to the structure of FIG. 11A, another SiON film 67 of, for example, 130 nm in thickness is formed on the interlayer insulating film 66, and another interlayer insulating film 68 of a silicon oxide film of, for example, 300 nm in thickness is formed on the SiON film 67 by plasma CVD using TEOS as a material the same as the interlayer insulating film 66. Here, the SiON film 67 may be replaced with a SiN film or an $Al_2O_3$ film.

Figure 11B:
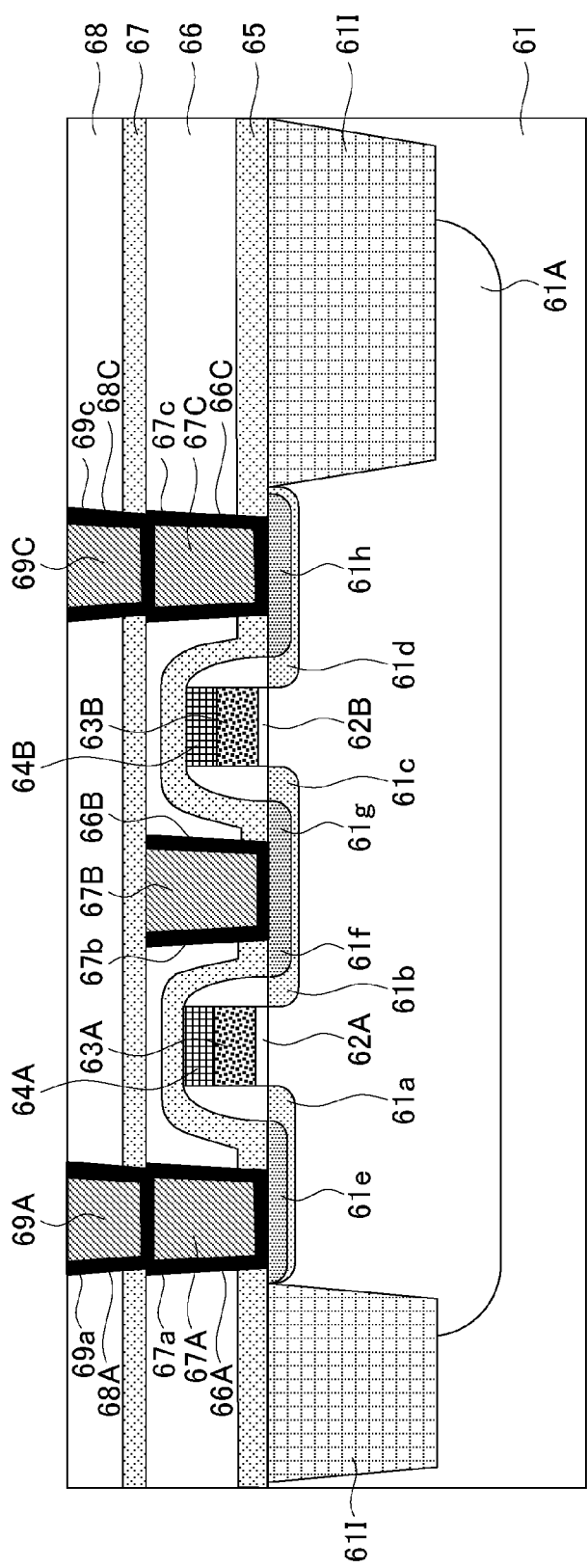

Next, in the process of FIG. 11B, via holes 68A and 68C are formed in the interlayer insulating film 68 so as to expose the via plugs 67A and 67C, respectively. A tungsten via plug 69A is formed on an adhesion layer 69a in the via hole 68A so as to come into contact with the via plug 67A. The adhesion layer 69a has a multilayer structure of a Ti film and a TiN film the same as the adhesion layer 67a. Further, a tungsten via plug 69C is formed on an adhesion layer 69c in the via hole 68C so as to come into contact with the via plug 67C. The adhesion layer 69c has a multilayer structure of a Ti film and a TiN film the same as the adhesion layer 67c.

Figure 11C:
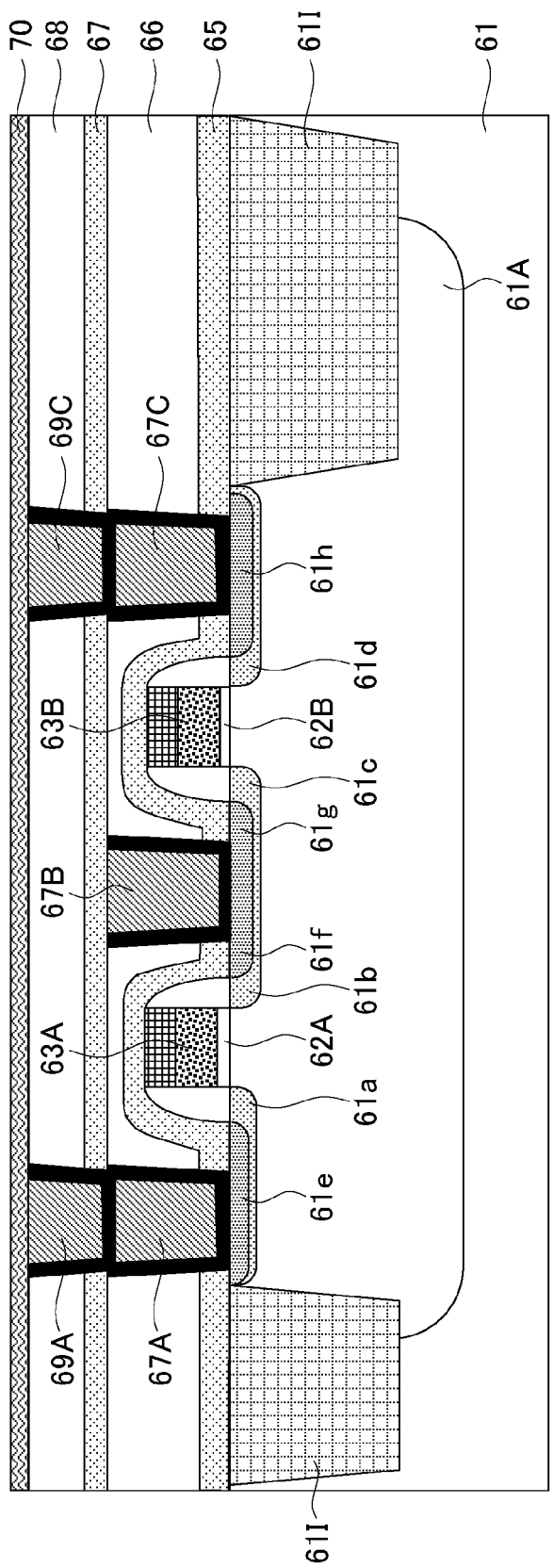

Next, in the process of FIG. 11C, the surface of the interlayer insulating film 68 is processed with $NH_3$ plasma so as to cause NH groups to be bound with oxygen atoms at the surface of the interlayer insulating film 68. Then, a Ti film 70 of, for example, 20 nm in thickness is formed on the interlayer insulating film 68 by sputtering so as to cover the via plugs 69A and 69B. By thus processing the surface of the interlayer insulating film 68 with a $NH_3$ plasma, oxygen atoms at the surface of the interlayer insulating film 68 are terminated by NH groups and bound preferentially with Ti atoms so as not to restrict the orientation of the Ti film 70. Therefore, the Ti film 70 has an ideal (002) orientation.

Further, in the process of FIG. 11C, the Ti film 70 is subjected to rapid heat treatment at 650° C. in a nitrogen atmosphere so as to be converted into a TiN film having a (111) orientation. Hereinafter, this TiN film may also be referred to by the same reference numeral as the Ti film 70.

Figure 11D:
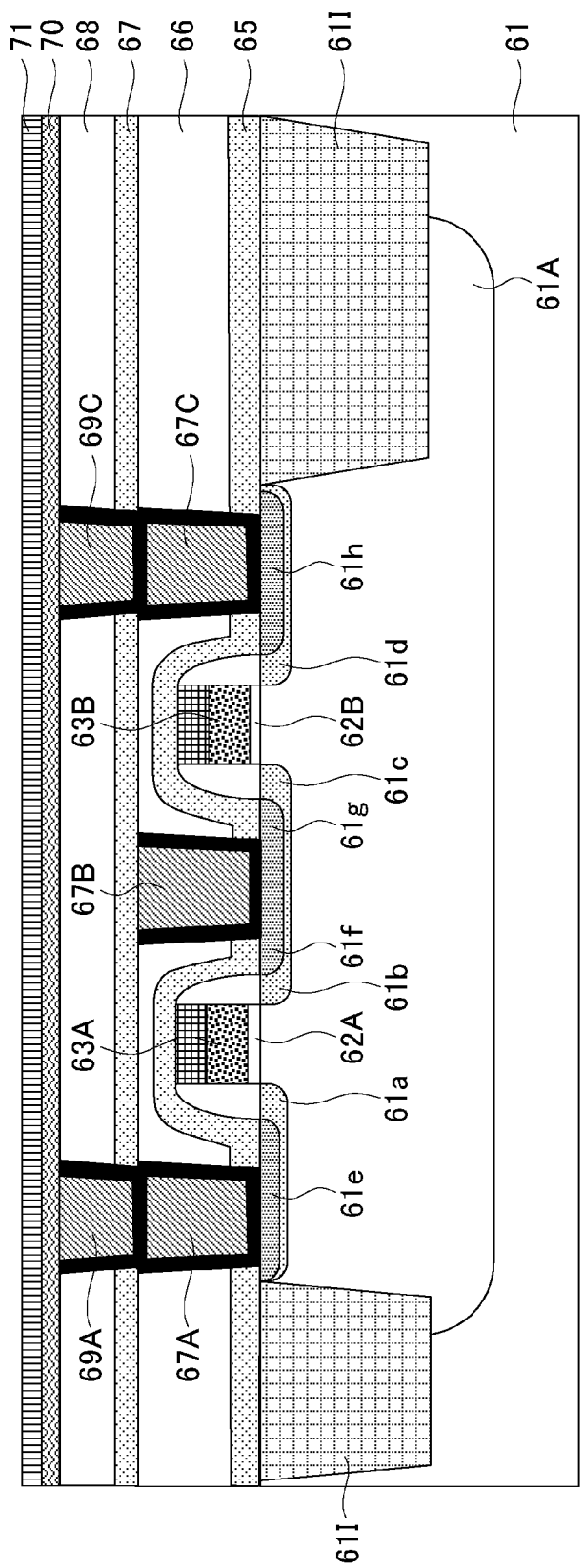
Figure 11E:
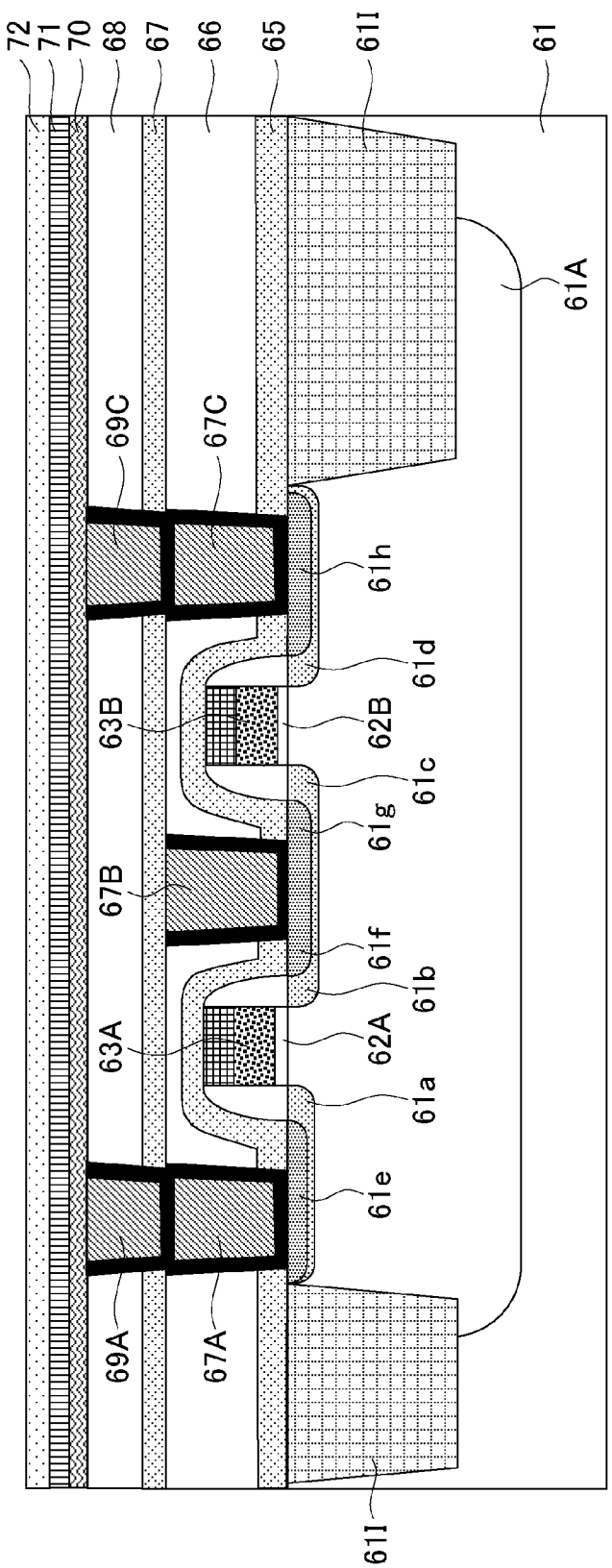

Next, in the process of FIG. 11D, a TiAlN film 71 is formed as an oxygen diffusion barrier on the TiN film 70. Further, in the process of FIG. 11E, an $Al_2O_3$ film 72 having a film thickness more than or equal to 1 nm and less than or equal to 5 nm is formed as a Pb diffusion barrier film on the TiAlN film 71 by sputtering or by oxidizing the TiAlN film 71.

Figure 11F:
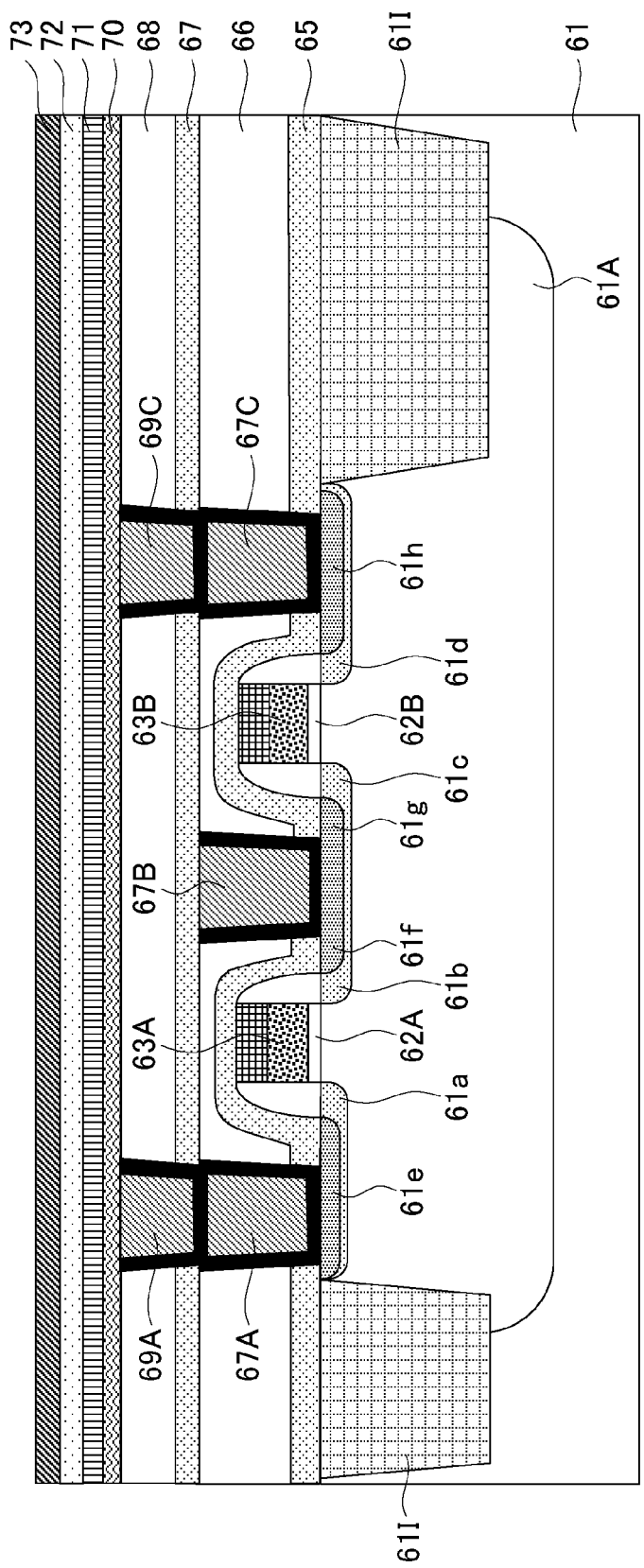

Next, in the process of FIG. 11F, a Pt film of approximately 100 nm in thickness is stacked on the $Al_2O_3$ film 72 by sputtering, so that a lower electrode layer 73 is formed (on the $Al_2O_3$ film 72).

Next, the structure of FIG. 11F is subjected to heat treatment at a temperature higher than or equal to 650° C. for 60 seconds in an Ar atmosphere. Subsequently, in the process of FIG. 11G, a first PZT film 74 having a thickness of 1 nm to 50 nm, preferably, 20 nm to 30 nm, is formed on the lower electrode layer 73 by sputtering.

Figure 11H:
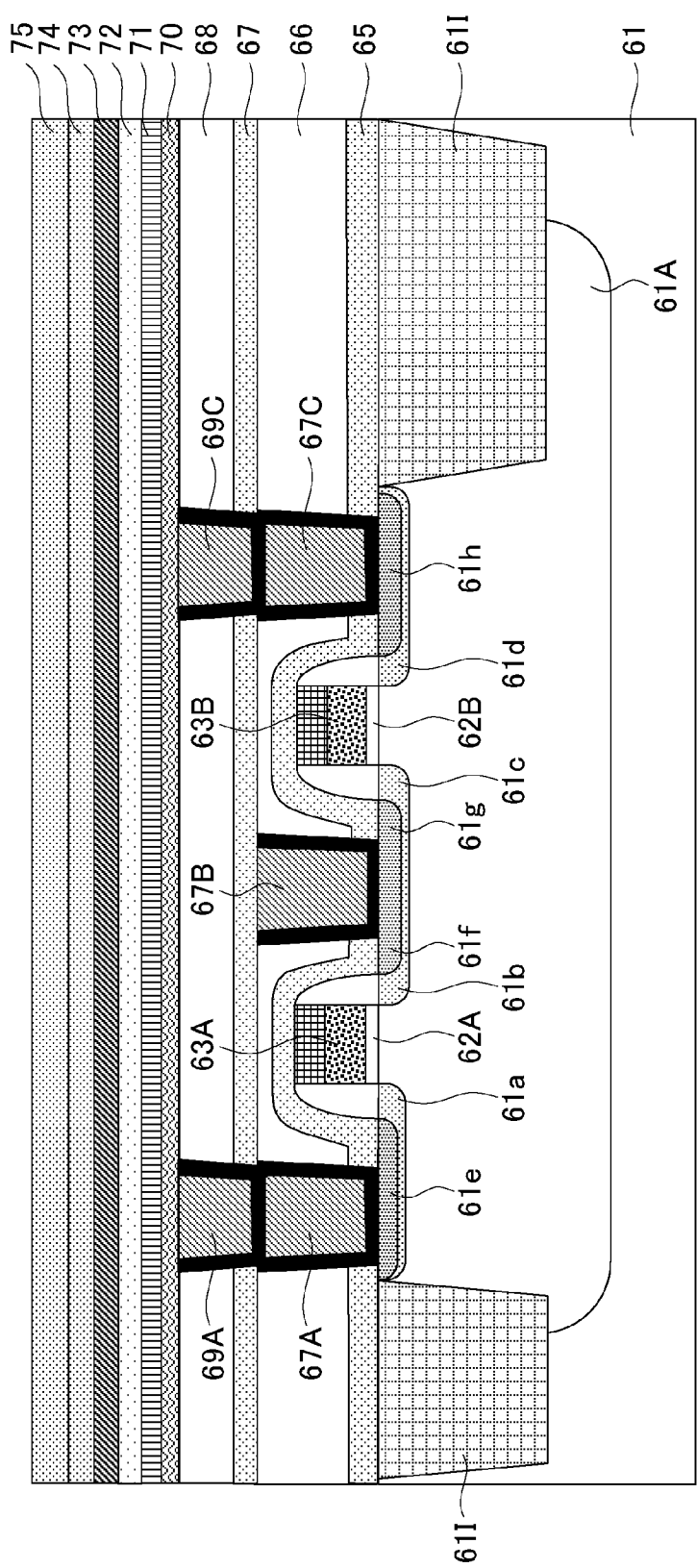

Next, in the process of FIG. 11H, a second PZT film 75 of, for example, 80 nm in thickness is formed on the first PZT film 74 by MOCVD.

Figure 11I:
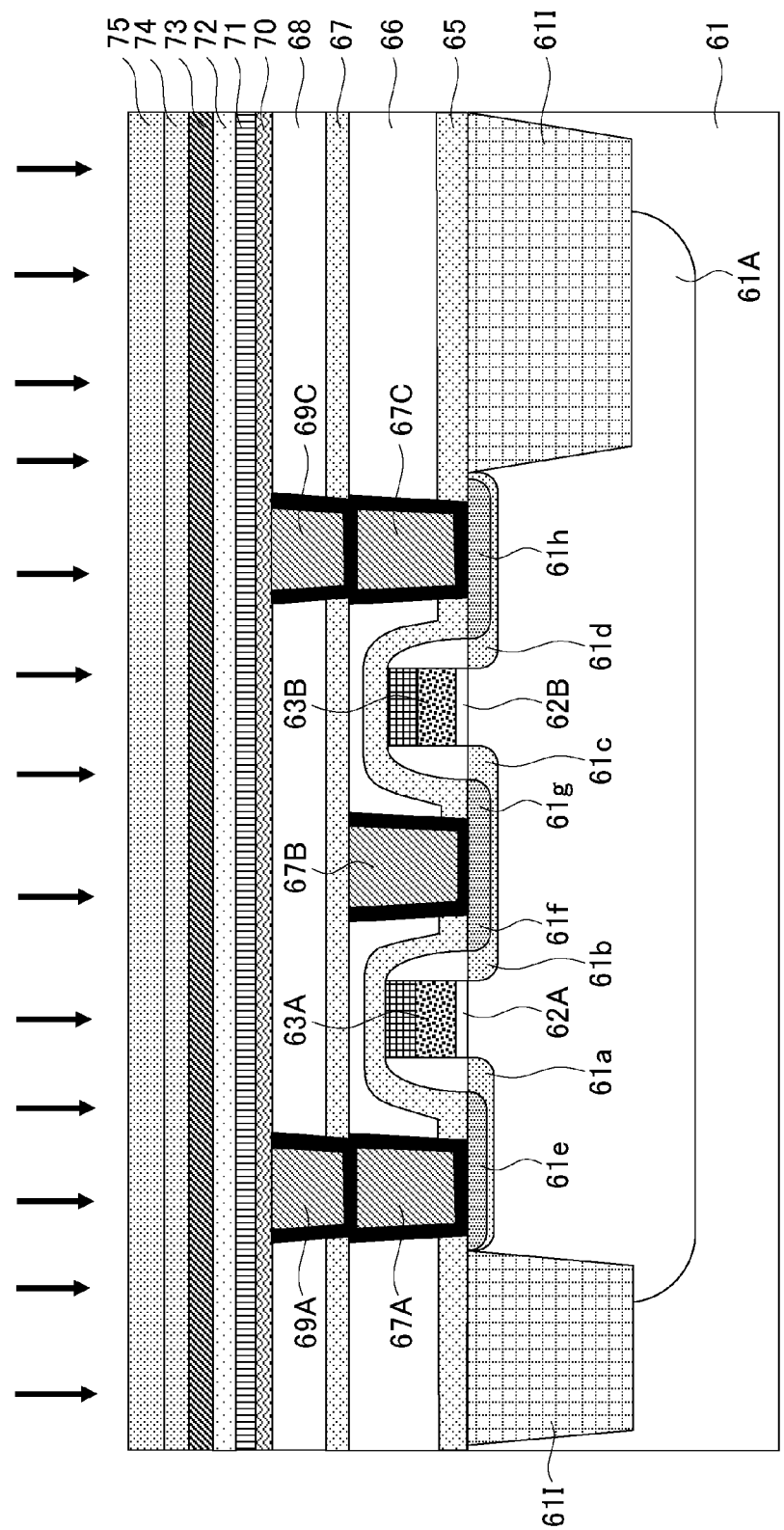

Further, in the process of FIG. 11I, in an atmosphere including oxygen, for example, a gas mixture atmosphere of oxygen gas and an inert gas such as Ar gas, the PZT films 74 and 75 are subjected to heat treatment for 30 to 120 seconds, for example, 90 seconds, while feeding, for example, oxygen gas and Ar gas at flow rates of 0 sccm to 25 sccm and 2000 sccm, respectively, at a temperature of 550° C. to 800° C., for example, 580° C., so that the PZT films 74 and 75 are crystallized. As a result of the crystallization heat treatment of the PZT films 74 and 75, columnar PZT crystals having a (110) orientation grow upward from the surface of the lower electrode 73 in the PZT films 74 and 75.

Figure 11J:
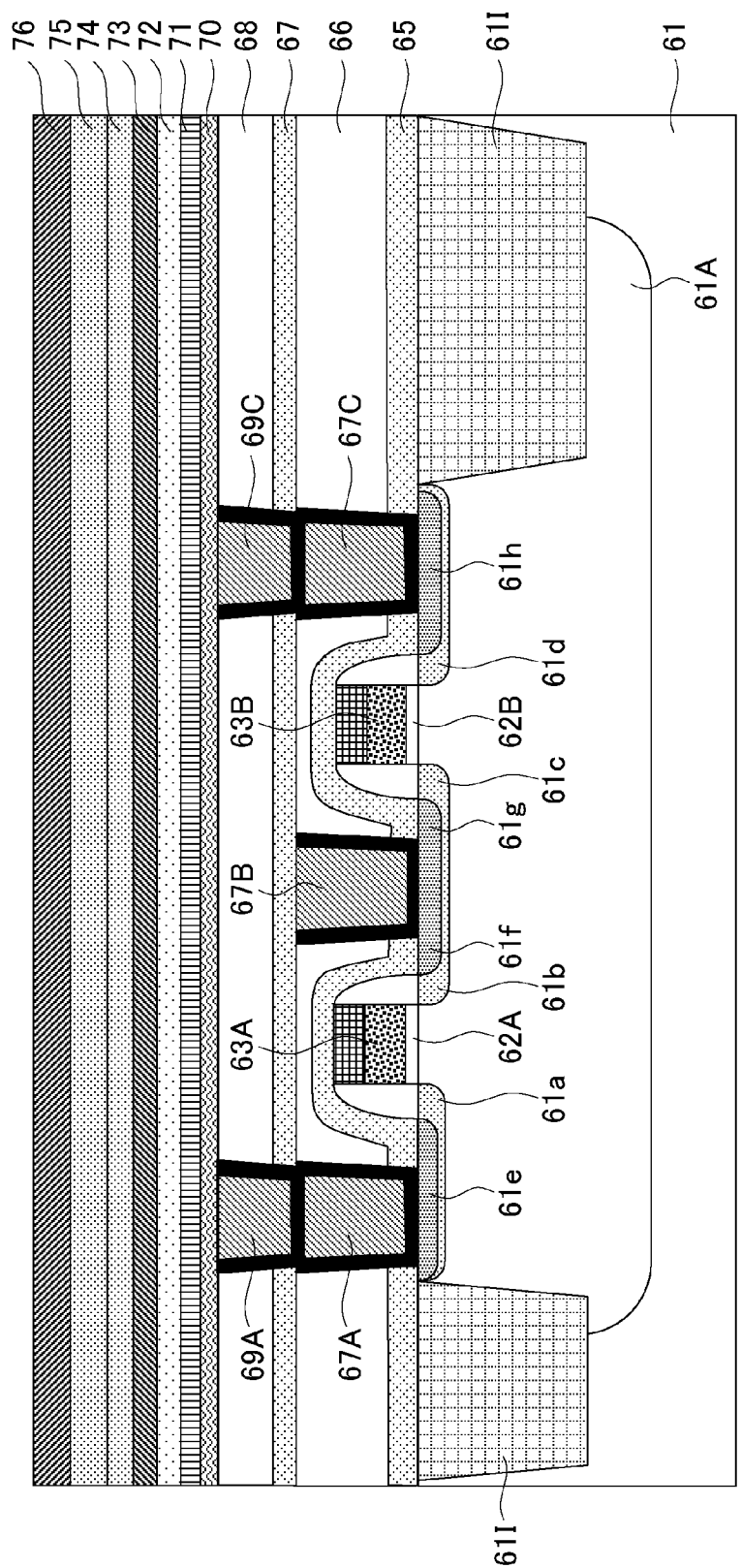
Figure 11K:
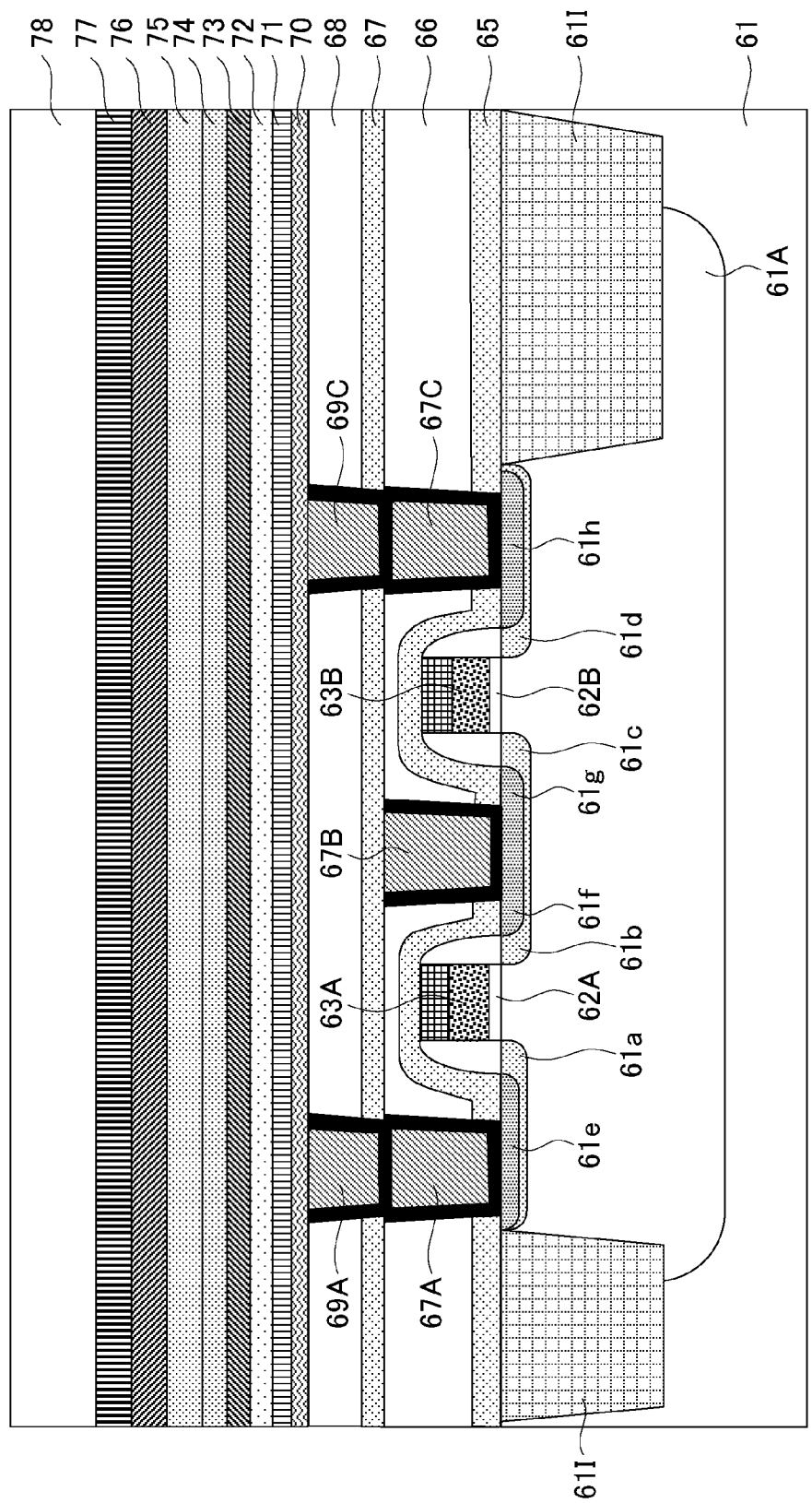

Next, in the process of FIG. 11J, an upper electrode layer (film) 76 having a laminated (multilayer) structure of the first iridium oxide film 16, the second iridium oxide film 17, and the metal iridium film 18 (not graphically illustrated) of the first embodiment is formed on the PZT film 75 by sputtering and heat treatment in a controlled oxidizing atmosphere in the same manner as in FIGS. 5D through 5H of the first embodiment. Further, in the process of FIG. 11K, a TiAlN film 77 and a silicon oxide film 78 are formed as hard mask layers on the upper electrode layer 76 by reactive sputtering and plasma CVD using a TEOS material, respectively.

Further, in the process of FIG. 11L, the silicon oxide film 78 and the underlying TiAlN film 77 are patterned, so that hard mask patterns 78A and 78C corresponding to desired ferroelectric capacitors $C_1$ and $C_2$, respectively, are formed.

Figure 11M:
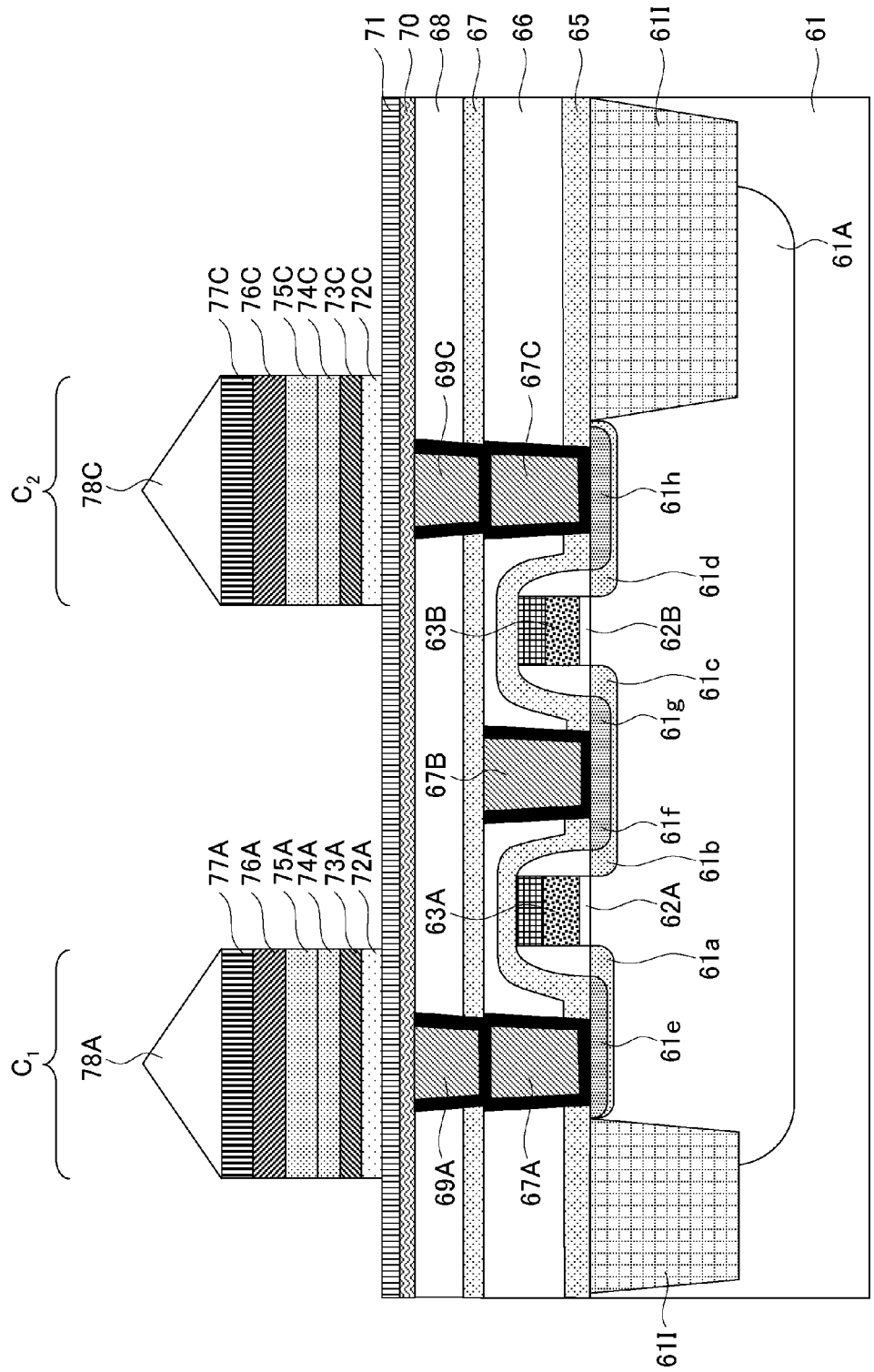

Further, in the next process of FIG. 11M, the TiAlN film 77, the upper electrode layer 76, the PZT films 74 and 75, the lower electrode layer 73, and the $Al_2O_3$ film 72 are patterned by dry etching using HBr, $O_2$, Ar, and $C_4F_8$ using the hard mask patterns 78A and 78C as a mask until the TiAlN film 71 is exposed. As a result, a multilayer structure of an $Al_2O_3$ pattern 72A, a lower electrode pattern 73A, PZT patterns 74A and 75A, an upper electrode pattern 76A, and a TiAlN mask pattern 77A is formed under the hard mask pattern 78A in correspondence to the ferroelectric capacitor $C_1$, and a multilayer structure of an $Al_2O_3$ pattern 72C, a lower electrode pattern 73C, PZT patterns 74C and 75C, an upper electrode pattern 76C, and a TiAlN mask pattern 77C is formed under the hard mask pattern 78C in correspondence to the ferroelectric capacitor $C_2$. Here, the lower electrode pattern 73A, the PZT patterns 74A and 75A, and the upper electrode pattern 76A form the ferroelectric capacitor $C_1$, and the lower electrode pattern 73C, the PZT patterns 74C and 75C, and the upper electrode pattern 76C form the ferroelectric capacitor $C_2$.

Next, in the process of FIG. 11N, the hard mask patterns 78A and 78C are removed by dry etching or wet etching. Then, in the process of FIG. 11O, the TiN film 70 on the interlayer insulating film 68 and the TiAlN film 71 on the TiN film 70 are removed by dry etching using the ferroelectric capacitors $C_1$ and $C_2$ as a mask. As a result, a multilayer structure of a TiN pattern 70A and the TiAlN pattern 71A is formed under the $Al_2O_3$ pattern 72A in the ferroelectric capacitor $C_1$, and a multilayer structure of a TiN pattern 70C and the TiAlN pattern 71C is formed under the $Al_2O_3$ pattern 72C in the ferroelectric capacitor $C_2$.

Figure 11O:
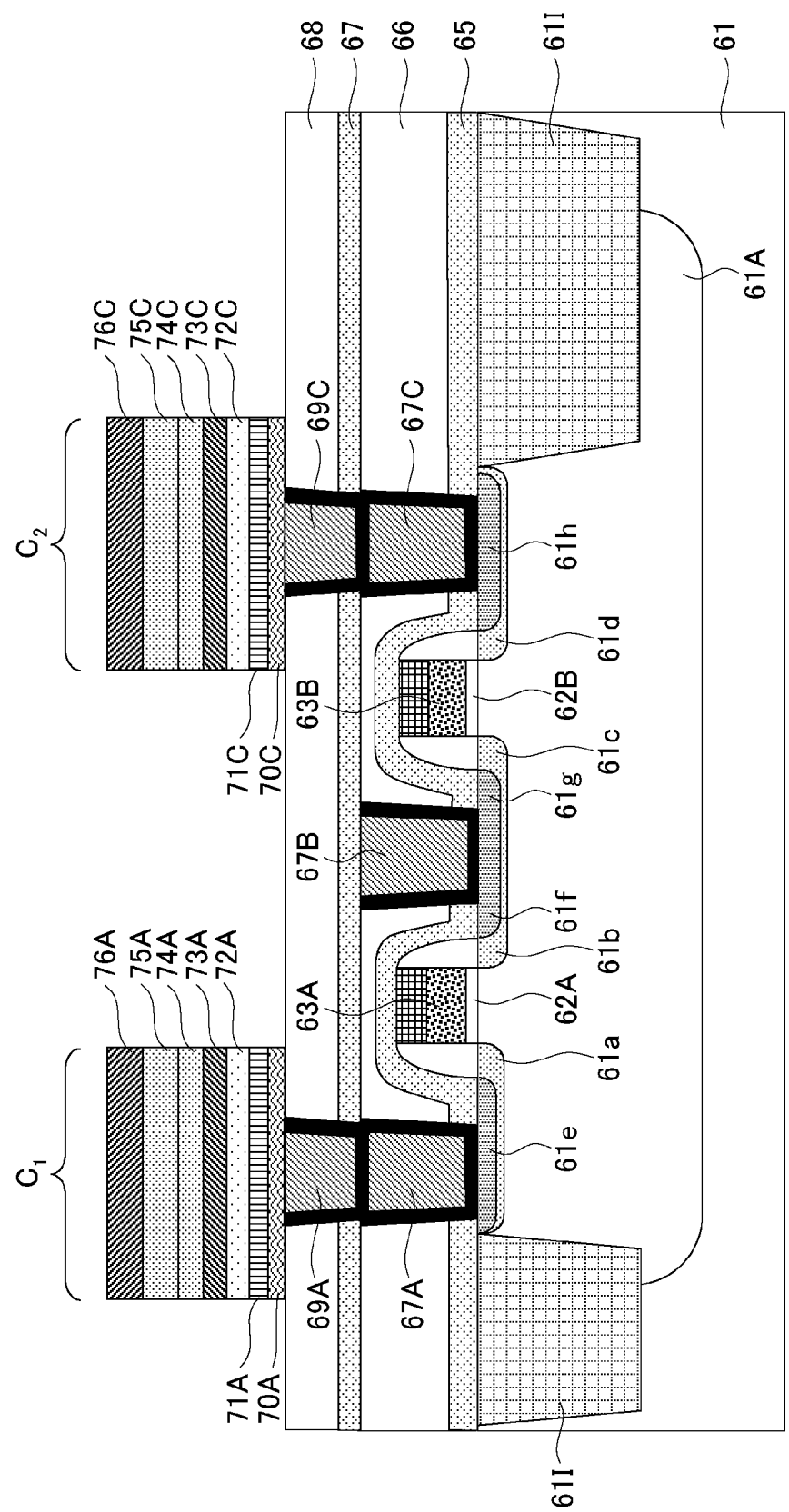
Figure 11P:
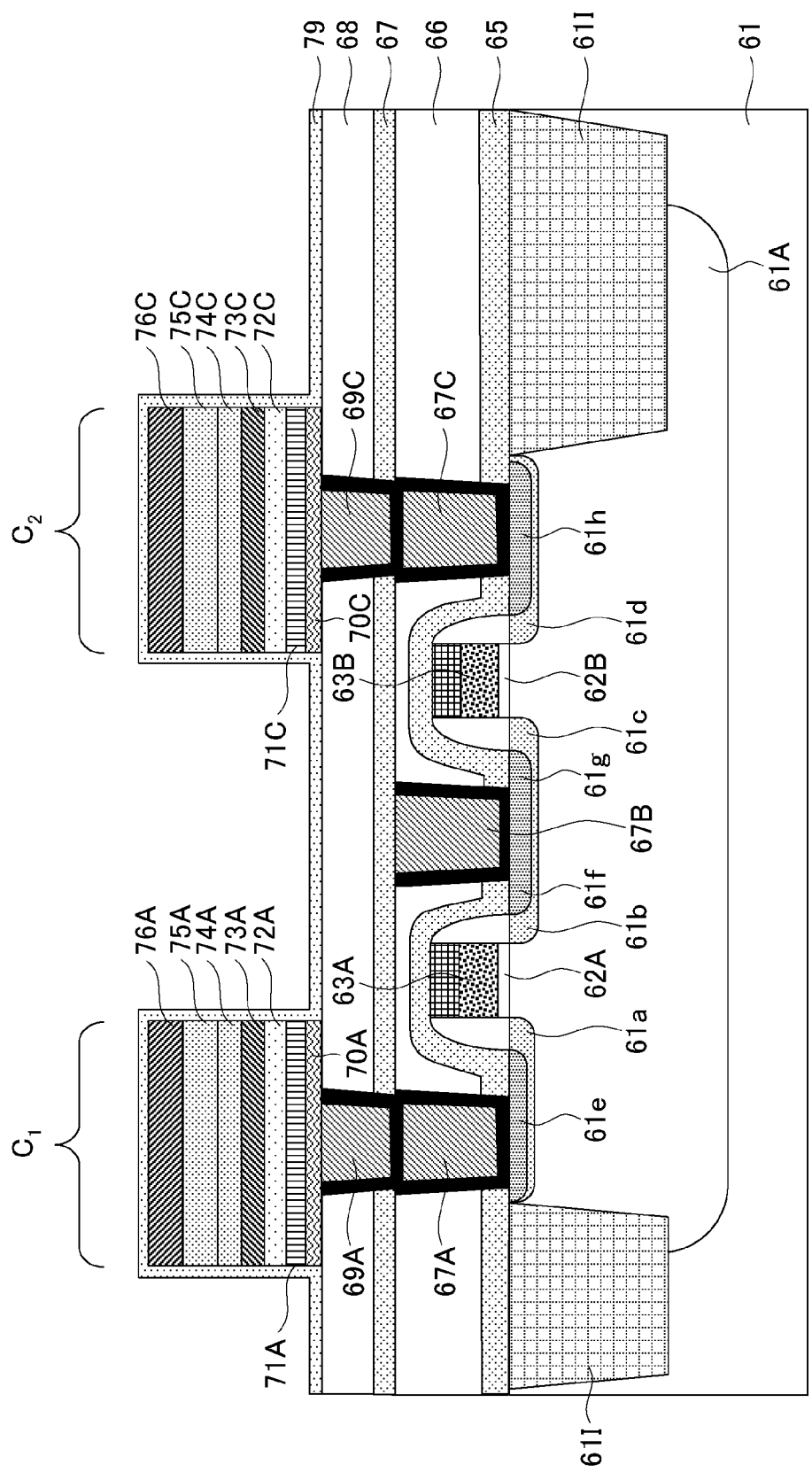

Further, in the process of FIG. 11P, a very thin $Al_2O_3$ film 79 having a thickness of 20 nm or less is formed as a hydrogen barrier film by sputtering or atomic layer deposition (ALD) so as to continuously cover the part of the interlayer insulating film 68 exposed in the above-described process of FIG. 11O and the upper and sidewall faces of the ferroelectric capacitors $C_1$ and $C_2$. Next, in the process of FIG. 11Q, by performing heat treatment at a temperature of 550° C. to 750° C., for example, 650° C., in an oxygen atmosphere, the PZT films 74A and 75A in the ferroelectric capacitor $C_1$ and the PZT films 74C and 75C in the ferroelectric capacitor $C_2$ are caused to recover from such damage as suffered in the dry etching process of FIG. 11O.

Figure 11R:
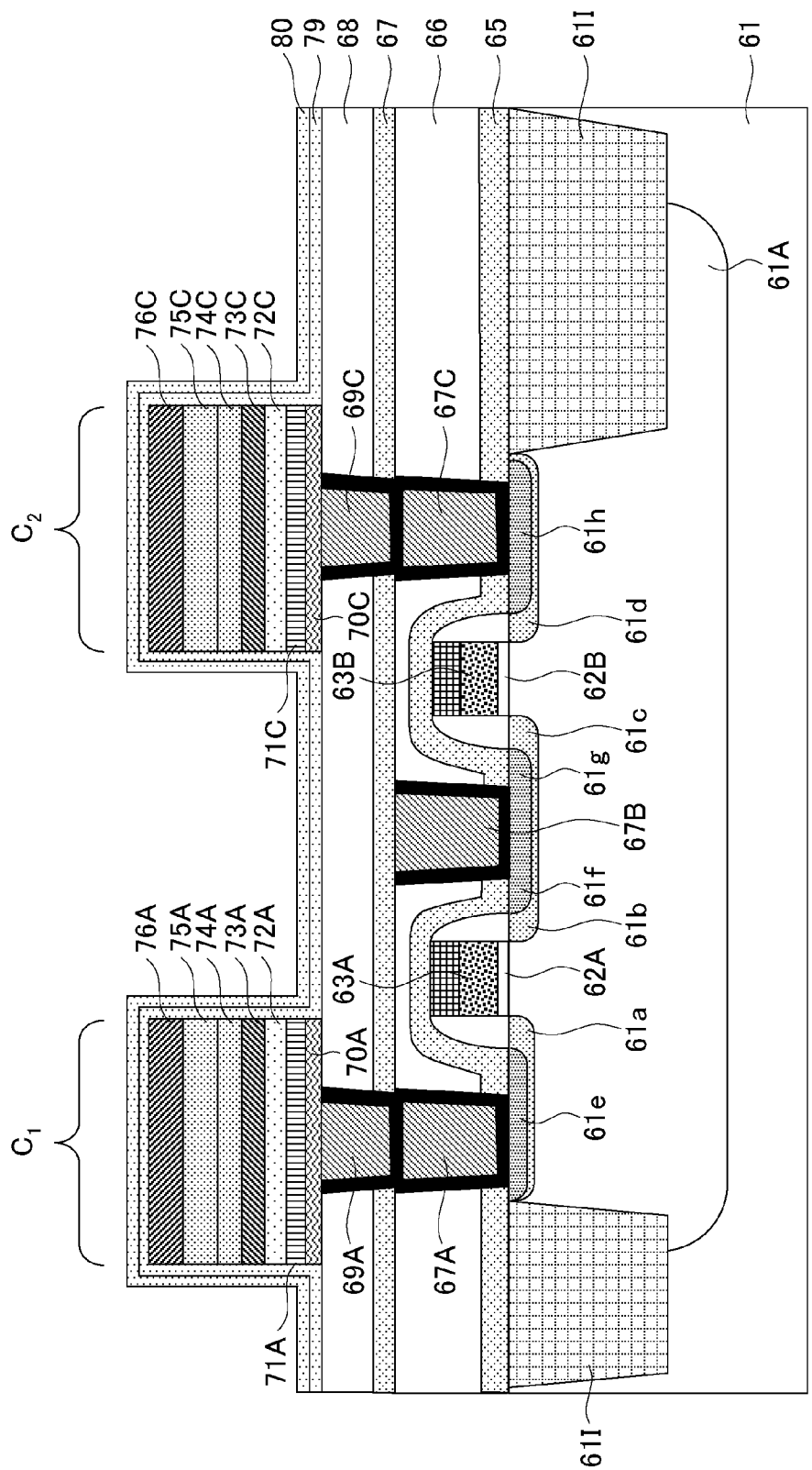
Figure 11S:
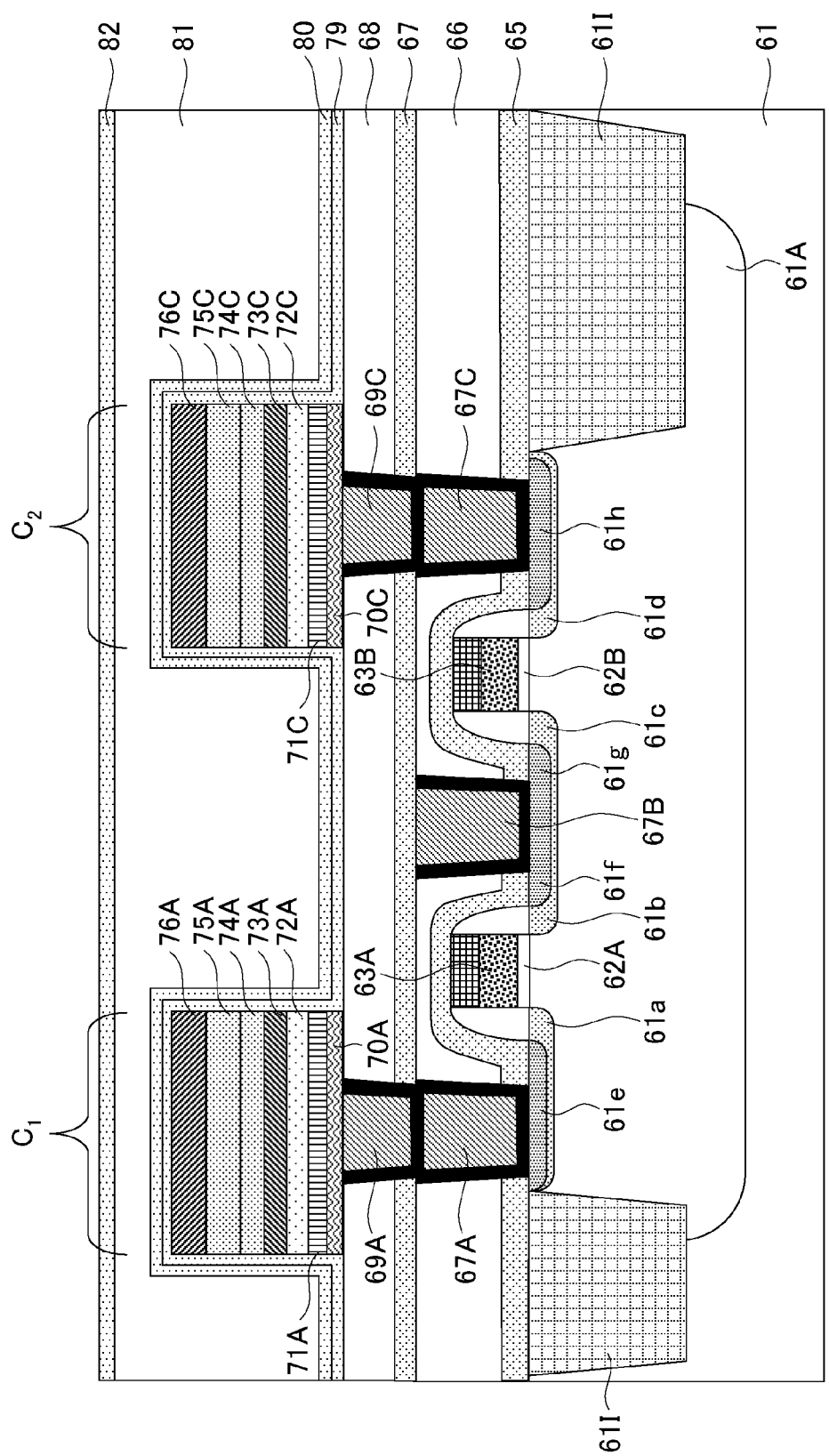

Further, in the process of FIG. 11R, another $Al_2O_3$ film 80 of, for example, 20 nm in thickness is formed as a hydrogen barrier film as well on the $Al_2O_3$ film 79 of FIG. 11P by MOCVD. Further, in the process of FIG. 11S, an interlayer insulating film 81 of a silicon oxide film having a thickness of 1500 nm is formed by plasma CVD using TEOS and a gas mixture of oxygen and helium as a material so as to cover the $Al_2O_3$ hydrogen barrier films 79 and 80 thus formed. In the process of FIG. 11S, the surface of the interlayer insulating film 81 thus formed is flattened by CMP, and thereafter, heat treatment is performed in a plasma using $N_2O$ or nitrogen gas so as to dehydrate the interlayer insulating film 81. Further, in the process of FIG. 11S, an $Al_2O_3$ film 82 of 20 nm to 100 nm in thickness is formed as a hydrogen barrier film on the interlayer insulating film 81 by sputtering or MOCVD. In the process of FIG. 11S, as a result of the planarization (flattening) process by CMP, the interlayer insulating film 81 has a thickness of, for example, 700 nm.

Next, in the process of FIG. 11T, an interlayer insulating film 83 of a silicon oxide film of 300 nm to 500 nm in thickness is formed on the $Al_2O_3$ hydrogen barrier film 82 by plasma CVD using TEOS as a material. Then, in the process of FIG. 11U, via holes 83A and 83C are formed in the interlayer insulating film 83 so as to expose the upper electrode pattern 76A of the ferroelectric capacitor $C_1$ and the upper electrode pattern 76C of the ferroelectric capacitor $C_2$, respectively.

Figure 11U:
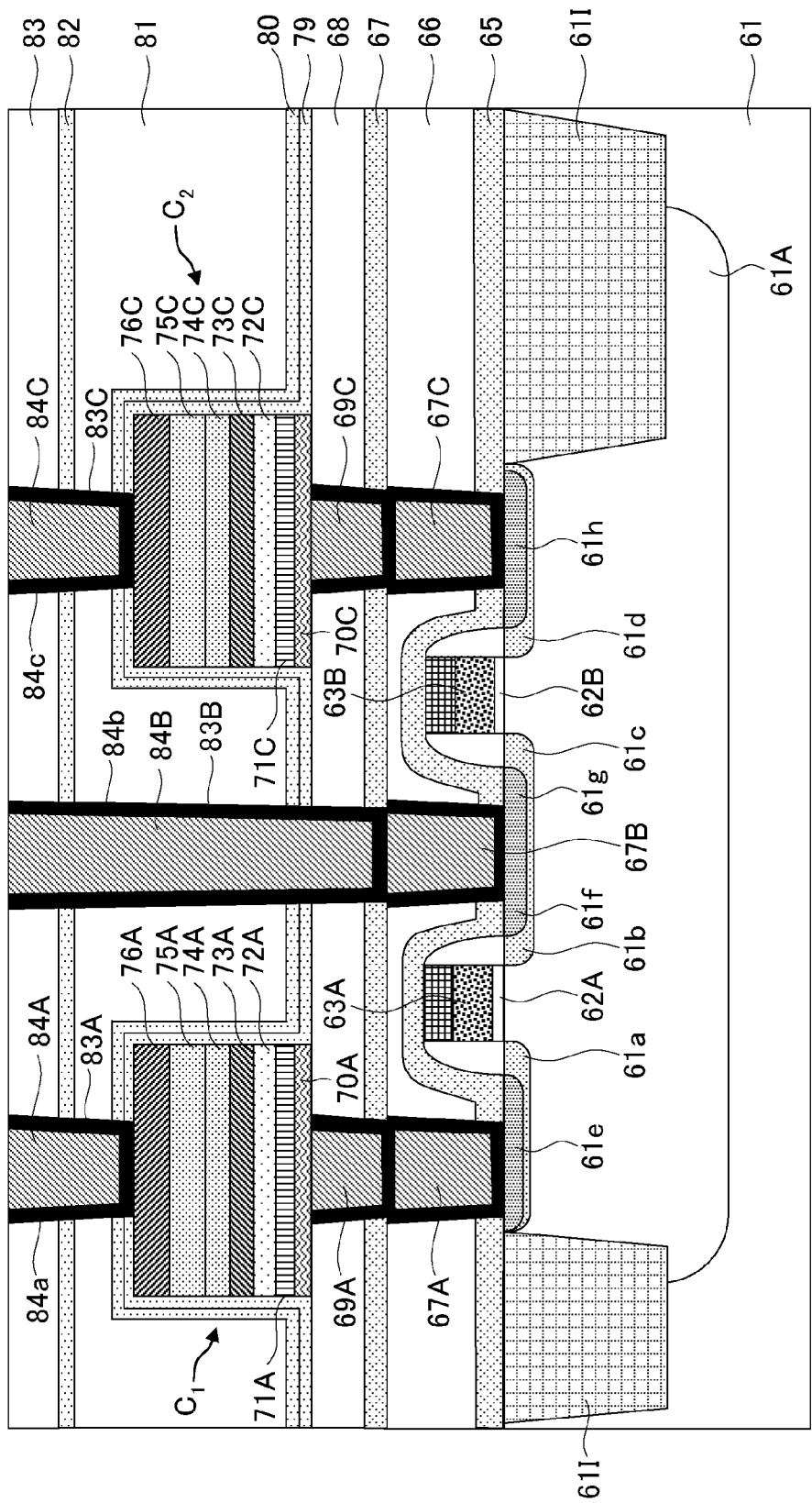

Further, in the process of FIG. 11U, heat treatment is performed through the via holes 83A and 83C thus formed in an oxidizing atmosphere so as to compensate for oxygen deficiencies caused in the PZT films 74A and 75A and the PZT films 74C and 75C by the via hole forming process.

Next, the bottom and inner wall surfaces of the via hole 83A and the bottom and inner wall surfaces of the via hole 83C are covered with barrier metal films 84a and 84c, respectively, each formed of a TiN single layer film. Further, the via holes 83A and 83C are filled with tungsten plugs 84A and 84C, respectively.

Further, after formation of the tungsten plugs 84A and 84C, a via hole 83B is formed through the interlayer insulating film 83, the $Al_2O_3$ hydrogen barrier film 82, the interlayer insulating film 81, the $Al_2O_3$ hydrogen barrier films 79 and 80, the interlayer insulating film 68, and the SiON film 67 so as to expose the via plug 67B, and is filled with a tungsten via plug 84B. As usual, the tungsten via plug 84B is formed on an adhesion layer 84b having a Ti/TiN multilayer structure.

Further, in the process of FIG. 11V, on the interlayer insulating film 83, an interconnection pattern 85A of an AlCu alloy held between adhesion films 85a and 85d each having a Ti/TiN multilayer structure is formed in correspondence to the via plug 84A, an interconnection pattern 85B of an AlCu alloy held between adhesion films 85b and 85e each having a Ti/TiN multilayer structure is formed in correspondence to the via plug 84B, and an interconnection pattern 85C of an AlCu alloy held between adhesion films 85c and 85f each having a Ti/TiN multilayer structure is formed in correspondence to the via plug 84C.

Another interconnection layer may be formed on the structure of FIG. 11V as required.

According to this embodiment, the PZT patterns 74A and 75A and the PZT patterns 74C and 75C are formed as ferroelectric films. As described above, in the case of forming the lower PZT patterns (lower ferroelectric films) 74A and 74C by sputtering, the PZT films forming the lower PZT patterns 74A and 74C may include elements such as Ca and Sr. Further, the PZT patterns (films) 74A, 75A, 74C, and 75C may be replaced with PLZT films including La.

Further, in the above-described processes of FIGS. 11G and 11H, the PZT films 74 and 75 may be formed as a single PZT film by sputtering as in the first embodiment.

Further, the PZT patterns (films) 74A, 75A, 74C, and 75C are not limited to PZT films, and may be formed of any ferroelectric films having an $ABO_3$-type perovskite structure including Pb. Examples of metal elements that may occupy the A site include Bi, Pb, Ba, Sr, Ca, Na, K, and rare earth elements, and examples of metal elements that may occupy the B site include Ti, Zr, Nb, Ta, W, Mn, Fe, Co, and Cr.

Further, the lower electrode patterns 73A and 73C are not limited to a Pt film, and may be formed of an alloy including Pt or a multilayer structure of platinum oxide (PtO) and Pt or an alloy including Pt.

Further, the conductive oxygen barrier films (71A and 71C) are not limited to TiAlN films, and may be Ir or Ru films.

Further, the orientation control films (70A and 70C) are not limited to a Ti or TiN film, and may be formed of any of Pt, Ir, Re, Ru, Pd, and Os films and alloys of two or more of the elements forming these films. Further, each of the orientation control films 70A and 70C may be formed of a single layer film or a multilayer film of Ti, Al, Ir, Pt, Ru, Pd, Os, Rh, PtOx, IrOx, RuOx, PdOx, etc.

[c] Third Embodiment

Figure 12:
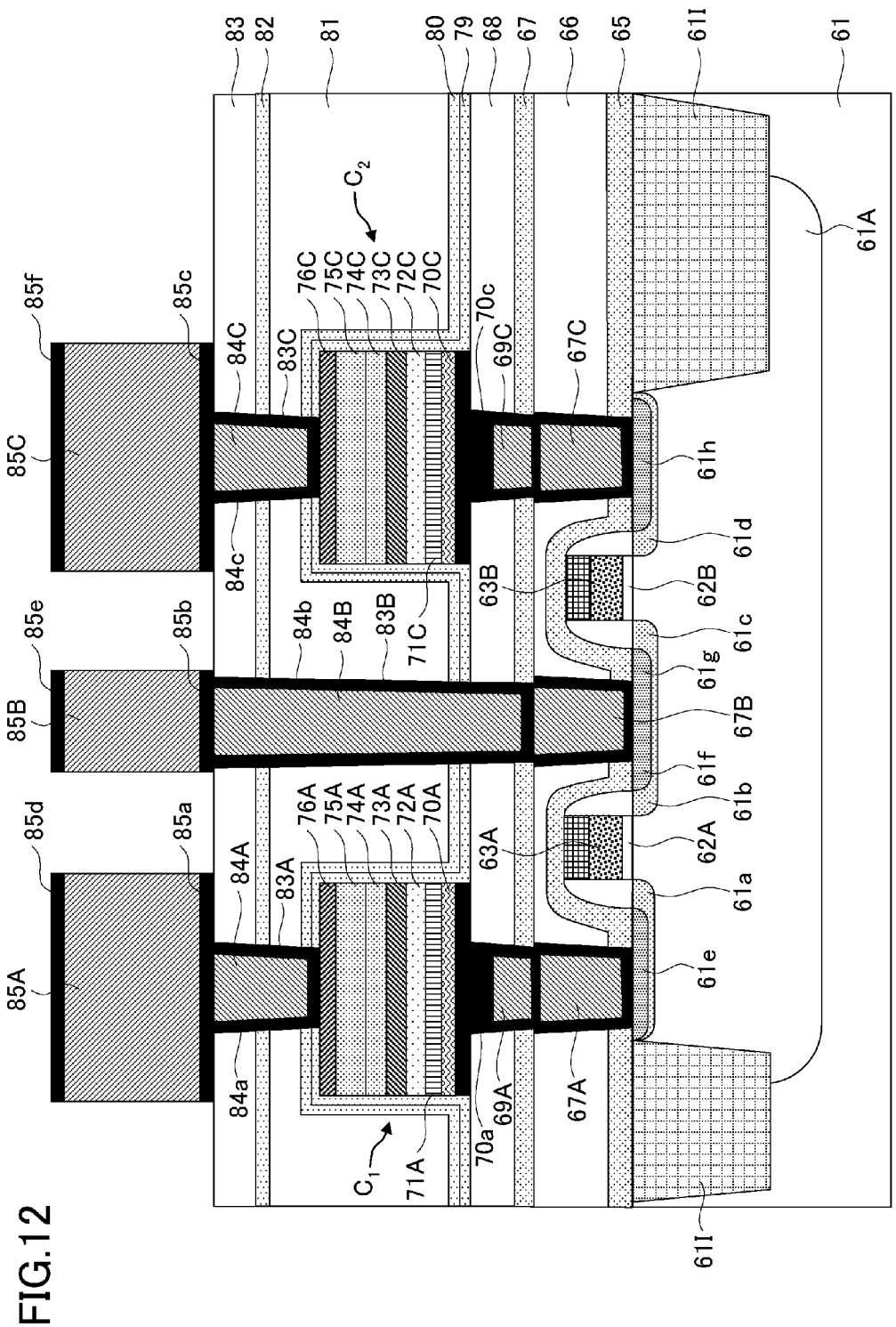
FIG. 12 is a diagram illustrating a method of manufacturing a ferroelectric memory according to a third embodiment.

FIG. 12 is a diagram illustrating a ferroelectric memory according to a third embodiment of the present invention. In FIG. 12, the same elements as those described above are referred to by the same reference numerals, and a description thereof is omitted.

In the second embodiment described above with reference to FIGS. 11A through 11V, in the process of FIG. 11B, the via plugs 69A and 69C are formed by removing an excessive tungsten film on the interlayer insulating film 68 by CMP after filling the via holes 68A and 68C with a tungsten film. According to CMP, the surfaces of the via plugs 69A and 69C may not be flattened completely, so that recesses having a depth of 20 nm to 50 nm may be formed at the top of the via plugs 69A and 69C.

According to this embodiment, in order to prevent such recesses from affecting the crystal orientation of a ferroelectric capacitor to be formed thereon, after the process of FIG. 11B and before the process of FIG. 11C, a Ti film of a (002) orientation is deposited on the interlayer insulating film 68 so as to fill in the recesses, and after conversion into a TiN film of a (111) orientation by nitriding, the surface of the TiN film is flattened by CMP. The TiN film thus formed is subjected to dry etching along with the TiN film 70 and the TiAlN film 71 in the process of FIG. 11O.

As a result, in the ferroelectric memory of FIG. 12, a TiN film 70a of a (111) orientation is interposed between the interlayer insulating film 68 and the TiN pattern (film) 70A so as to fill in the possible recesses at the top of the via plug 69A, and a TiN film 70c of a (111) orientation is interposed between the interlayer insulating film 68 and the TiN pattern (film) 70C so as to fill in the possible recesses at the top of the via plug 69C.

According to this embodiment, even if recesses are formed at the top of the via plugs 69A and 69C in the CMP process, the above-described configuration makes it possible to ensure that the orientation of the ferroelectric films (PZT patterns 74A, 75A, 74C, and 75C) is restricted to a (111) direction.

Figure 13:
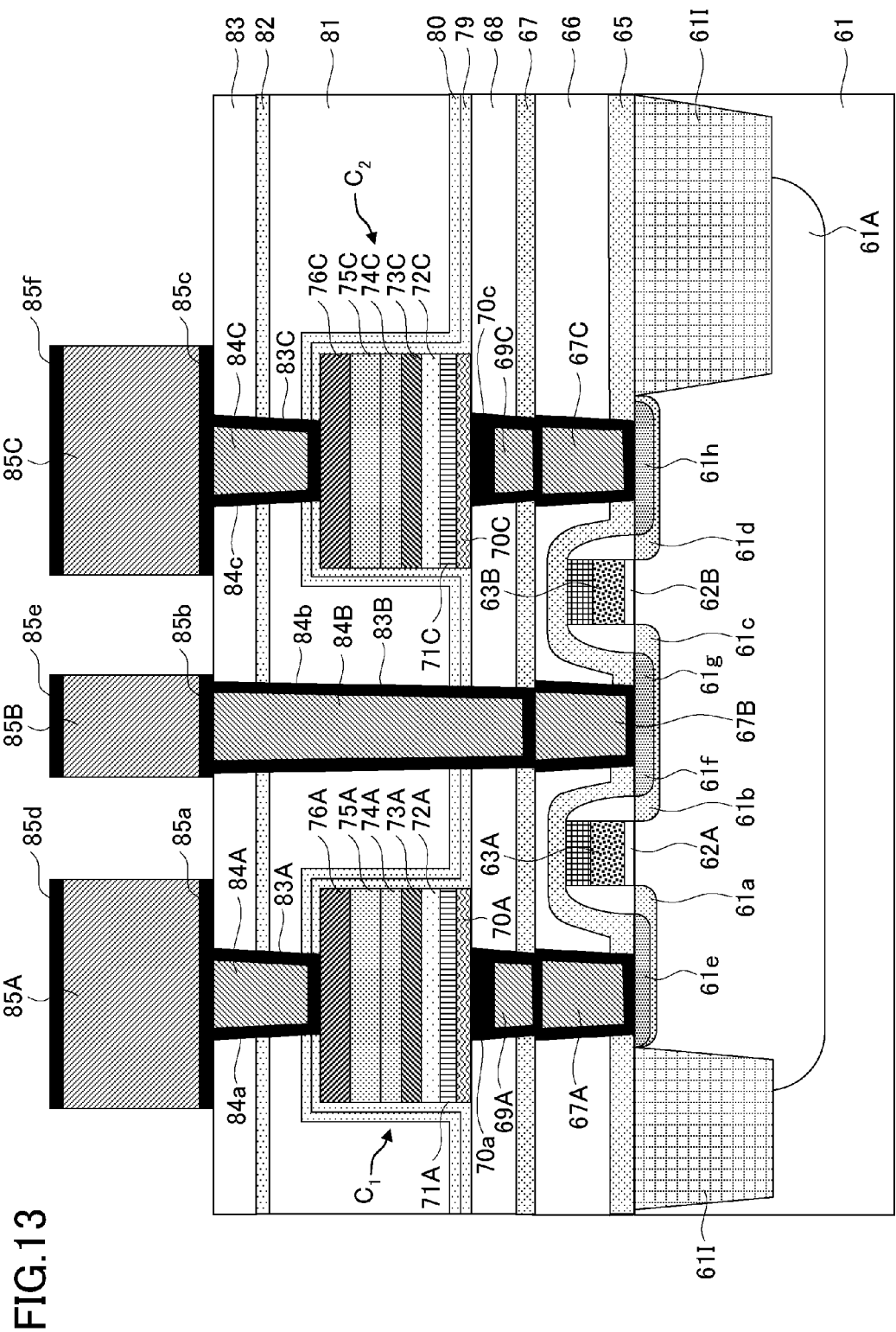
FIG. 13 is a diagram illustrating a method of manufacturing a ferroelectric memory according to a variation of the third embodiment.

FIG. 13 is a diagram illustrating a ferroelectric memory according to a variation of this embodiment. In FIG. 13, the same elements as those described above are referred to by the same reference numerals, and a description thereof is omitted.

Referring to FIG. 13, according to this variation, the TiN films 70a and 70c have their respective portions above the level of the interlayer insulating film 68 removed at the time of flattening the TiN films 70a and 70c by CMP, so that the TiN films 70a and 70c remain only in the via holes 68A and 68C, respectively.

Otherwise, the configuration of FIG. 13 is the same as that of FIG. 12, so that a description thereof is omitted.

[d] Fourth Embodiment

FIG. 14 is a diagram illustrating a ferroelectric memory according to a fourth embodiment of the present invention.

Referring to FIG. 14, according to this embodiment, immediately after forming the interlayer insulating film 81 in the process of FIG. 11S after the process of FIG. 11R, a via hole is formed through the interlayer insulating film 81, the $Al_2O_3$ hydrogen barrier films 79 and 80, the interlayer insulating film 68, and the SiON film 67 so as to expose the via plug 67B, and the via hole is filled with a tungsten film, so that the above-described via plug 84B is formed.

After formation of the via plug 84B, an oxygen barrier film such as a SiON film is formed on the interlayer insulating film 81. Then, in this condition, contact holes are formed in the interlayer insulating film 81 so as to expose the upper electrode pattern 76A of the ferroelectric capacitor $C_1$ and the upper electrode pattern 76C of the ferroelectric capacitor $C_2$.

Further, the PZT patterns (films) 74A and 75A in the ferroelectric capacitor $C_1$ and the PZT patterns (films) 74C and 75C in the ferroelectric capacitor $C_2$ are subjected to heat treatment through the corresponding contact holes in an oxygen atmosphere so as to compensate for oxygen deficiencies. Thereafter, the oxygen barrier film is removed, and the electrode patterns 85A, 85B, and 85C are formed on the interlayer insulating film 81 in correspondence to the upper electrode pattern 76A of the ferroelectric capacitor $C_1$, the via plug 84B, and the upper electrode pattern 76C of the ferroelectric capacitor $C_2$, respectively.

According to an aspect of the present invention, a first conductive oxide film having a nonstoichiometric composition is used as an upper electrode lower layer in contact with a ferroelectric film forming the capacitor insulating film of a ferroelectric capacitor. As a result, Pb is diffused into the upper electrode lower layer from the ferroelectric film, which is accompanied by the flattening of the interface between the ferroelectric film and the upper electrode lower layer. Consequently, in the case of applying voltage to the ferroelectric capacitor, a greater effective voltage is applied to the ferroelectric film to improve the characteristics of the capacitor. On the other hand, when exposed to an atmosphere including hydrogen, such a conductive film having a nonstoichiometric composition has its metal component inside the film activate the hydrogen, so that the activated hydrogen degrades the characteristics of the ferroelectric film. Therefore, according to an aspect of the present invention, an upper electrode upper layer of a second conductive oxide film having a stoichiometric composition or a composition closer thereto is formed on the upper electrode lower layer so as to prevent a reduction atmosphere from entering the upper electrode lower layer.

At this point, according to an aspect of the present invention, the upper electrode upper layer formed on the upper electrode lower layer that has been crystallized by heat treatment is in a microcrystalline state, and the upper electrode upper layer is subjected to rapid heat treatment in an oxidizing atmosphere to be crystallized before a metal electrode film is formed on the upper electrode upper layer. As a result, even when the ferroelectric capacitor is subjected to heat treatment in the subsequent semiconductor device manufacturing process, generation of voids in the upper electrode upper layer is controlled, and, for example, even when a multilayer interconnection structure is formed on the ferroelectric capacitor, the problem of degradation of the electrical characteristics of the ferroelectric capacitor due to entry of hydrogen in a reduction atmosphere to be used into the ferroelectric capacitor through such voids is eliminated. Further, it is possible to control abnormal growth on the surfaces of the upper electrode lower layer and the upper electrode upper layer by optimizing the ratio of oxygen gas in a process atmosphere and temperature at the time of performing crystallization heat treatment on the upper electrode lower layer and the upper electrode upper layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention. For example, in the above-described embodiments, the present invention is applied to a stack structure. However, the present invention may also be applied to a planar structure.

What is claimed is:

1. A semiconductor device, comprising:
   a substrate; and
   a ferroelectric capacitor formed on the substrate, the ferroelectric capacitor including
   a lower electrode;
   a ferroelectric film formed on the lower electrode;
   a first conductive oxide film formed on the ferroelectric film;
   a second conductive oxide film formed on the first conductive oxide film; and
   a metal layer formed on the second conductive oxide film,
   wherein the second conductive oxide film is crystallized, and
   the second conductive oxide film includes a first region at an interface with the metal layer, and
   a second region between the first region and the first conductive oxide film, and
   the second region is higher in ratio of oxidation than the first conductive oxide film, and
   an oxygen concentration of the second conductive oxide film is higher in the first region than in the second region.

2. The semiconductor device as claimed in claim 1, wherein a metal element of the first conductive oxide film is equal to a metal element of the second conductive oxide film.

3. The semiconductor device as claimed in claim 1, wherein the first and second conductive oxide films are formed of an iridium oxide.

4. The semiconductor device as claimed in claim 1, wherein a metal element of the first conductive oxide film is different from a metal element of the second conductive oxide film.

5. The semiconductor device as claimed in claim 1, wherein an interface between the ferroelectric film and the first conductive oxide film is flat.

6. The semiconductor device as claimed in claim 1, wherein the first conductive oxide film includes Pb and the second conductive oxide film is substantially free of Pb.

7. The semiconductor device as claimed in claim 1, further comprising:
   an insulating film covering the ferroelectric capacitor; and
   an interconnection structure formed on the insulating film,
   wherein the metal layer is connected to an interconnection pattern in the interconnection structure through a contact hole.

8. The semiconductor device as claimed in claim 6, wherein the interface between the second conductive oxide film and the metal layer is flat.

* * * * *